US011907621B2

(12) United States Patent
Siwek

(10) Patent No.: US 11,907,621 B2
(45) Date of Patent: Feb. 20, 2024

(54) ELECTRONIC PRODUCT TESTING SYSTEMS FOR PROVIDING AUTOMATED PRODUCT TESTING

(71) Applicant: Rainforest QA, Inc., San Francisco, CA (US)

(72) Inventor: Maciej Siwek, London (GB)

(73) Assignee: Rainforest QA, Inc., San Francisco, CA (US)

( * ) Notice: Subject to any disclaimer, the term of this patent is extended or adjusted under 35 U.S.C. 154(b) by 300 days.

(21) Appl. No.: 16/403,359

(22) Filed: May 3, 2019

(65) Prior Publication Data
US 2020/0349235 A1 Nov. 5, 2020

(51) Int. Cl.
G06F 30/20 (2020.01)
G06F 3/0484 (2022.01)
G06F 3/0482 (2013.01)

(52) U.S. Cl.
CPC ............ *G06F 30/20* (2020.01); *G06F 3/0482* (2013.01); *G06F 3/0484* (2013.01)

(58) Field of Classification Search
CPC ....... G06F 30/20; G06F 3/0482; G06F 3/0484
See application file for complete search history.

(56) References Cited

U.S. PATENT DOCUMENTS

| 9,135,714 | B1* | 9/2015 | Gauf | G06F 11/3688 |
| 9,195,829 | B1* | 11/2015 | Goradia | G06F 21/55 |
| 10,353,806 | B1* | 7/2019 | Dewitt | G06F 11/3457 |
| 10,649,634 | B2* | 5/2020 | De Paula | G06F 3/0484 |
| 10,678,666 | B1* | 6/2020 | Gauf | G06F 11/2635 |
| 2004/0268311 | A1* | 12/2004 | Pizzoli | G06F 9/451 717/124 |
| 2006/0085132 | A1* | 4/2006 | Sharma | G06F 11/3688 702/1 |
| 2011/0029956 | A1* | 2/2011 | Ledenev | G06F 11/3692 717/125 |
| 2011/0276944 | A1 | 11/2011 | Bergman et al. | |
| 2013/0198320 | A1* | 8/2013 | Ahmed | G06F 11/3664 709/217 |
| 2013/0215279 | A1* | 8/2013 | Rivas-Micoud | H04N 17/00 348/180 |
| 2013/0275946 | A1* | 10/2013 | Pustovit | G06F 11/3684 717/124 |
| 2013/0338995 | A1* | 12/2013 | Elkins | G06F 40/40 704/2 |

(Continued)

OTHER PUBLICATIONS

International Search Report and Written Opinion dated Jul. 23, 2020 for PCT Application. No. PCT/US20/31235.

(Continued)

*Primary Examiner* — Jeremy L Stanley
(74) *Attorney, Agent, or Firm* — Vista IP Law Group, LLP

(57) ABSTRACT

An electronic product testing system includes: a testing instruction generator configured to provide a user interface for generating an electronic file, the electronic file containing product testing instruction; and a testing device having a processing unit configured to execute the electronic file to perform testing of a product based on the product testing instruction in the electronic file; wherein the processing unit is configured to perform testing of the product by simulating human actions based on the product testing instruction in the electronic file.

45 Claims, 48 Drawing Sheets

(56) References Cited

U.S. PATENT DOCUMENTS

| | | | |
|---|---|---|---|
| 2014/0046954 A1* | 2/2014 | MacLean | G06F 21/645 |
| | | | 707/736 |
| 2014/0068410 A1* | 3/2014 | Dolinina | G06F 11/3684 |
| | | | 715/234 |
| 2014/0129173 A1* | 5/2014 | Kit | G06F 11/263 |
| | | | 702/123 |
| 2014/0218385 A1* | 8/2014 | Carmi | G06T 7/136 |
| | | | 345/590 |
| 2015/0082280 A1* | 3/2015 | Betak | G06F 11/3692 |
| | | | 717/124 |
| 2015/0161031 A1* | 6/2015 | Chea | G06F 11/3672 |
| | | | 717/125 |
| 2015/0212927 A1* | 7/2015 | N'Gum | G06F 11/3664 |
| | | | 717/125 |
| 2015/0278075 A1* | 10/2015 | Loganathan | G06F 11/3684 |
| | | | 714/38.1 |
| 2015/0286556 A1* | 10/2015 | Ellis | G06F 11/3692 |
| | | | 717/125 |
| 2015/0339213 A1* | 11/2015 | Lee | G06F 3/0484 |
| | | | 717/125 |
| 2015/0356062 A1* | 12/2015 | De Paula | G06F 3/0484 |
| | | | 715/719 |
| 2015/0363300 A1* | 12/2015 | Luan | G06F 11/3684 |
| | | | 714/38.1 |
| 2017/0031799 A1* | 2/2017 | Gillaspie | G06V 20/35 |
| 2017/0031808 A1* | 2/2017 | Gillaspie | G06F 11/3692 |
| 2017/0052766 A1* | 2/2017 | Garipov | G06F 16/2291 |
| 2017/0078159 A1 | 3/2017 | Bae et al. | |
| 2018/0165258 A1* | 6/2018 | Scoda | G06F 11/3688 |
| 2018/0173606 A1* | 6/2018 | Malla | G06F 11/3688 |
| 2018/0174288 A1* | 6/2018 | Kogan | G06K 9/00604 |
| 2018/0197103 A1* | 7/2018 | Petursson | G06N 20/00 |
| 2018/0210814 A1* | 7/2018 | Mevorach | G06F 11/3644 |
| 2019/0079855 A1 | 3/2019 | Dewitt et al. | |
| 2019/0303274 A1* | 10/2019 | Funnell | G06F 11/3696 |
| 2019/0370162 A1* | 12/2019 | Mandal | G06F 11/3688 |
| 2020/0142808 A1* | 5/2020 | Damen | G06N 3/08 |

OTHER PUBLICATIONS

Foreign OA for IN Patent Appln. No. 202147056052 dated Jul. 26, 2023.
Supplemental EP search report for EP 20801875 dated Mar. 22, 2023.
Written Opinion for EP 20801875 dated Mar. 22, 2023.

* cited by examiner

FIG. 3

| | Product testing tasks | Questions | Answers | Tracker identifier |
|---|---|---|---|---|
| 1 | Click on tab "New test" | Do you see new test page? | Y | Image file 342 |
| 2 | Select the second tab | Do you see a new image at lower right? | Y | Image file 482 |
| 3 | Type in "XYZ" in the parameter field, and click submit | Do you see a table of values in a pop up screen? | N | Image file 429 |

| ID: 23 | X | Y | Time | Select |
|---|---|---|---|---|
| 1 | 23 | 36 | 0.0 | |
| 2 | 37 | 38 | 0.5 | |
| 3 | 39 | 40 | 1.0 | |
| 4 | 41 | 44 | 1.5 | |
| 5 | 46 | 45 | 2.0 | |
| 6 | 44 | 48 | 2.5 | Y |
| 7 | 36 | 55 | 3.0 | |
| 8 | 30 | 53 | 3.5 | |

2904779 : complete / passed

Client Rainforest QA

Run test 1041492 - Create
a run - complete.
passed

Run 119214

Test 36577 - Create a run ⎫
                              ⎬ 1002
Brower Chrome ⎭

Created 2016/12/09
At 05:49:20 about 11
hours ago

Reviewer SimpleVoteMultiFail Features reroute ----, ---------- visualization v1, ---- all called tests, integrations toggle,
Ago                                                net prameter_score ----- tabular Var V2,exploratory v1, and step redirect validation, review test v1, tester teaccking v1,
                                                override_result v1,----- widget, mixed results v1, report v2, wait for logs, result_details v1,preview_ allocations,audit log_v1,
                                                device_farm v1, integrations_v2, subjective_testing_v1, ------ usage_warning, import_tabular_ui,read_only_tests_variables_ v1,
                                                browser_stack_dry_run, requires_screenshot, browser_stack,mechanical ---, crowd_flower Verified Mark Reviewed    1004a          1004b            1004c
by                        Answer         Answer           Answer
       Create  Copy job
       new job            35031370       34800628         36554021

Action

| Verb | How it's interpreted by RF Automation | Notes |
|---|---|---|
| Click | Clicks on the UI element. | Have to provide a UI element |
| Fill | Fills the text field with specified content. | Combination of CLICK and TYPE verbs in a single step.<br><br>Select Target UI Element<br>Provide Text to input |
| Type | Types in specified text. | Multiple keystrokes.<br><br>Type is equivalent to pressing a series of keys on the keyboard. You can use it when a field to type in is already selected or if you want to trigger another keyboard-controlled action. |
| Press Key | Sends key combination | Single keystroke<br><br>MODIFIER, allows a two key combination such using: SHIFT, CONTROL, OPTION, COMAND.<br>To copy something<br>Press Key = c<br>Modifier = control<br><br>Return key use 'enter'<br><br>Cannot (yet) do three key combos such as CONTROL + ALT + DELETE |
| Hover | Hovers over specified element. | Have to provide a UI element |
| Dropdown Select | Selects specific item from the dropdown. | Combination of HOVER and CLICK verbs in a single step.<br><br>Requires two UI elements:<br>• First UI element to click and expand the dropdown.<br>• Second UI element to select the actual option<br>If the desired option is not easily visible (long list), Dropdown Select will not work. |
| Checkbox Check | Checks specified checkbox. | Have to provide a UI element<br><br>When creating UI element, area to check/uncheck needs to be centered in screen capture left to right. There needs to be some UNIQUE element captured as well.<br><br>The checkbox screen shot should be unchecked if you want the automation to go check it |
| Checkbox Uncheck | Unchecks specified checkbox. | Have to provide a UI element<br><br>When creating UI element, area to check/uncheck needs to be centered in screen capture left to right. There needs to be some UNIQUE element captured as well. |

FIG. 26A

| Verb | How it's interpreted by RF Automation | Notes |
| --- | --- | --- |
|  |  | The checkbox screenshot should be checked if you want the automation to go uncheck it |
| Refresh | Refreshes the webpage. | No additional information needed |
| Navigate | Navigates to specified URL. | Need to provide URL |
| Navigate - New Tab | Navigates to specified URL in a new tab. | Need to provide URL<br>Opens the URL in a new tab |
| Navigate - Incognito Tab | Navigates to specified URL in a new incognito tab. | Need to provide URL<br>Opens the URL in an incognito tab |
| Close Tab | Closes current browser tab. | No additional information needed |
| Scroll | Scrolls the page into a specified direction until the target is reached. | Use when known that the requested UI element is elsewhere on the page.<br><br>Provide direction: Up, Down, Left, Right<br>Provide UI Element to search for |
| Drag and Drop | Drags and drop | Object:<br>Provide UI element you want to drag and drop<br><br>Target:<br>Provide UI element where to DROP Object. The screenshot should be of Target PRIOR to the Object being moved to it |
| Click and Hold | Clicks and holds the mouse button over the object. | Provide UI element<br>Seconds: provide the number of seconds to click for in whole number. Is there a min/max: |
| Plain Language (action) - aka (Other) | Allows to fallback to English. | Write test in plain English. If there are multiple steps, write each step in a new box<br><br>Any other action that is not available from list. Something that requires human judgement AKA "SELECT the cutest dog from available pictures" |

FIG. 26B

| Noun | How it's interpreted by RF Automation | Templates (what testers see) | Notes |
|---|---|---|---|
| Button | Button | {label} button | Used for button UI elements that need to be acted on |
| Field | Text field | {label} field | Any open field like a text field, email, password |
| Dropdown | Dropdown | {label} dropdown | Dropdown selects the dropdown and opens up the options, while... |
| Dropdown Option | Option in open dropdown | {label} dropdown option | The dropdown option to select once the dropdown is open |
| Link | Link | {text} link | Any link/hyperlink on the page |
| Icon | Icon | {description} icon | Any icon on the page like a profile avatar or logo |
| Checkbox | Checkbox | {label} checkbox | Any checkbox that needs to be checked or unchecked.<br><br>When taking screenshots. If you want the action to CHECK the checkbox, screenshot should be of UNCKECKED state. If you want to UNCKECK the checkbox, screenshot should be of the CHECKED state |
| Header | Page header | {text} header | The header/nav bar at the top of a page |
| Window | Any pop-up window | {description} window | Any open window in the page, or the browser window itself |
| Modal | In page modal | {description} modal | An open modal on the page |
| Text | Exactly matched text | "{text}" | NOT case sensitive<br>CAN be text in a graphic such as a road sign |
| UI Element | Any other UI Element | {element} | Any open ended UI element on the page that can be specified by the user |

FIG. 26C

ELECTRONIC PRODUCT TESTING SYSTEMS FOR PROVIDING AUTOMATED PRODUCT TESTING

FIELD

This application relates generally to product testing, and more specifically, to systems and methods for providing product testing.

BACKGROUND

Many products require product testing. Supplier of products generally require products be tested before they can be made available to customers. Sometimes, after a product has been made available, it may still be desirable to test the product. Testing of products can be a lengthy and complicated process. There may be many different technical features in the product that need to be tested under different testing parameters. Many product suppliers may not have in-house product testers. These product suppliers will need to outsource product testing to outside product testers. However, finding the right product testers who can adequately perform the product testing project can itself be a time consuming process, and can be challenging. If the product supplier needs fast turn-around time for the product testing for its product, such out-sourcing technique may not be suitable.

SUMMARY

An electronic product testing system includes: a testing instruction generator configured to provide a user interface for generating an electronic file, the electronic file containing product testing instruction; and a product testing device having a processing unit configured to execute the electronic file to perform testing of a product based on the product testing instruction in the electronic file; wherein the processing unit is configured to perform testing of the product by simulating human actions based on the product testing instruction in the electronic file.

Optionally, the processing unit is configured to move a cursor without input from a cursor control.

Optionally, the processing unit is configured to make a selection of an object without input from a cursor control.

Optionally, the processing unit is configured to type a text in a field without input from a keyboard.

Optionally, the processing unit comprises an interpreter configured to interpret the product testing instruction in the electronic file.

Optionally, the system further includes a script generator configured to generate a script based on the product testing instruction in the electronic file.

Optionally, the processing unit is configured to run the script for testing the product.

Optionally, the user interface comprises a graphical user interface providing a first set of items and a second set of items for user-selection, wherein the first set of items comprises a plurality of action identifiers, and the second set of items comprises a plurality of objects.

Optionally, one of the action identifiers identifies an action to be performed by the product testing device, and one of the object identifiers identifies an object on which the action is to be performed by the product testing device.

Optionally, one of the action identifiers identifies a click action, a fill action, a type action, a press key action, a hover action, a dropdown select action, a checkbox check action, a checkbox uncheck action, a refresh action, a navigate action, a new tab action, a close tab action, a scroll cation, a drag and drop action, or a click and hold action.

Optionally, one of the object identifiers identifies a button, a field, a dropdown menu, a dropdown option, a link, an icon, a checkbox, a header, a window, a text, a modal, or an user interface element.

Optionally, the product testing instruction in the electronic file has a data structure that associates an action identifier with a corresponding object identifier:

Optionally, the action identifier identifies an action to be performed by the product testing device, and the object identifier identifies an object on which the action is to be performed by the product testing device.

Optionally, the action identifier identifies a click action, a fill action, a type action, a press key action, a hover action, a dropdown select action, a checkbox check action, a checkbox uncheck action, a refresh action, a navigate action, a new tab action, a close tab action, a scroll cation, a drag and drop action, or a click and hold action.

Optionally, the object identifier identifies a button, a field, a dropdown menu, a dropdown option, a link, an icon, a checkbox, a header, a window, a text, a modal, or an user interface element.

Optionally, the system further includes a non-transitory medium storing the electronic file in association with an identity of the product.

Optionally, the product testing device is configured to check if an element is visible after the processing unit performs a testing action.

Optionally, the product testing device is configured to check if an element is not visible after the processing unit performs a testing action.

Optionally, the product testing device is configured to check if a specified page has loaded after the processing unit performs a testing action.

Optionally, the processing unit is configured to test multiple features of the product based on the product testing instruction in the electronic file.

Optionally, the processing unit is configured to test a first feature of the product based on the product testing instruction in the electronic file.

Optionally, the processing unit is also configured to test a second feature of the product based on product testing instruction in another electronic file.

Optionally, the testing instruction generator comprises a control for allowing a user to select between viewing the product testing instruction in plain language or viewing the product testing instruction in a programming format.

Optionally, the processing unit is configured to: obtain a first image that is associated with the testing of the product, and obtain a second image.

Optionally, the first image is based on a completion of a first task performed during the testing of the product.

Optionally, the first image comprises a first content of the product, the first content indicating a first result of a first task for testing the product.

Optionally, the processing unit is further configured to: apply a mask to the first image to create a first masked image, apply the mask to the second image to create a second masked image, and compare the first masked image with the second masked image.

Optionally, the mask is configured to block out one or more portions of the first image.

Optionally, the processing unit is configured to determine whether the testing fails or not based on the comparison of the first masked image and the second masked image.

Optionally, the processing unit comprises an image capturer configured to determine the second image by comparing a sequence of image frames with the first image, and selecting one of the image frames that matches the first image as the second image.

Optionally, the system further includes a tracker configured to track an interaction of the product testing device with the product.

Optionally, the tracker is configured to track a movement of a cursor operated by the product testing device.

Optionally, the tracker is configured to track a selection of a tab, a selection of a button, a selection of an icon, a selection of a text, or any combination of the foregoing, by the product testing device.

Optionally, the tracker is configured to track a text input by the product testing device.

Optionally, the product comprises a web page, a web site, a computer application, a mobile device application, or a processor application.

Optionally, the processing unit is configured to perform machine-based testing of the product.

A method performed by an electronic product testing system includes: providing, by a testing instruction generator, a user interface for generating an electronic file, the electronic file containing product testing instruction; and executing, by a processing unit of a product testing device, the electronic file to perform testing of a product based on the product testing instruction in the electronic file; wherein the testing of the product is performed by simulating human actions based on the product testing instruction in the electronic file.

Optionally, the testing of the product comprises moving a cursor by the processing unit without input from a cursor control.

Optionally, the testing of the product comprises making a selection of an object by the processing unit without input from a cursor control.

Optionally, the testing of the product comprises typing a text in a field by the processing unit without input from a keyboard.

Optionally, the method further includes interpreting the product testing instruction in the electronic file.

Optionally, the method further includes generating a script by a script generator based on the product testing instruction in the electronic file.

Optionally, the testing of the product comprises running the script, by the processing unit, to test the product.

Optionally, the user interface comprises a graphical user interface, and the method also includes providing a first set of items and a second set of items for user-selection, wherein the first set of items comprises a plurality of action identifiers, and the second set of items comprises a plurality of objects.

Optionally, one of the action identifiers identifies an action to be performed by the product testing device, and one of the object identifiers identifies an object on which the action is to be performed by the product testing device.

Optionally, one of the action identifiers identifies a click action, a fill action, a type action, a press key action, a hover action, a dropdown select action, a checkbox check action, a checkbox uncheck action, a refresh action, a navigate action, a new tab action, a close tab action, a scroll cation, a drag and drop action, or a click and hold action.

Optionally, one of the object identifiers identifies a button, a field, a dropdown menu, a dropdown option, a link, an icon, a checkbox, a header, a window, a text, a modal, or an user interface element.

Optionally, the product testing instruction in the electronic file has a data structure that associates an action identifier with a corresponding object identifier.

Optionally, the action identifier identifies an action to be performed by the product testing device, and the object identifier identifies an object on which the action is to be performed by the product testing device.

Optionally, the action identifier identifies a click action, a fill action, a type action, a press key action, a hover action, a dropdown select action, a checkbox check action, a checkbox uncheck action, a refresh action, a navigate action, a new tab action, a close tab action, a scroll cation, a drag and drop action, or a click and hold action.

Optionally, the object identifier identifies a button, a field, a dropdown menu, a dropdown option, a link, an icon, a checkbox, a header, a window, a text, a modal, or an user interface element.

Optionally, the method further includes storing the electronic file in a non-transitory medium in association with an identity of the product.

Optionally, the method further includes checking, by the product testing device, if an element is visible after the processing unit performs a testing action.

Optionally, the method further includes checking, by the product testing device, if an element is not visible after the processing unit performs a testing action.

Optionally, the method further includes checking, by the product testing device, if a specified page has loaded after the processing unit performs a testing action.

Optionally, the testing of the product comprises testing multiple features of the product based on the product testing instruction in the electronic file.

Optionally, the testing of the product comprises testing a first feature of the product based on the product testing instruction in the electronic file.

Optionally, the method further includes testing a second feature of the product based on product testing instruction in another electronic file.

Optionally, the testing instruction generator comprises a control for allowing a user to select between viewing the product testing instruction in plain language or viewing the product testing instruction in a programming format.

Optionally, the method further comprises: obtaining a first image that is associated with the testing of the product, and obtaining a second image.

Optionally, the first image is based on a completion of a first task performed during the testing of the product.

Optionally, the first image comprises a first content of the product, the first content indicating a first result of a first task for testing the product.

Optionally, the method further comprises: applying a mask to the first image to create a first masked image; applying the mask to the second image to create a second masked image; and comparing the first masked image with the second masked image.

Optionally, the mask is configured to block out one or more portions of the first image.

Optionally, the method further includes determining, by an evaluator, whether the testing fails or not based on the comparison of the first masked image and the second masked image.

Optionally, the method further includes determining the second image, by an image capturer, by comparing a sequence of image frames with the first image, and selecting one of the image frames that matches the first image as the second image.

Optionally, the method further includes tracking, by a tracker, an interaction of the product testing device with the product.

Optionally, the method further includes tracking, by a tracker, a movement of a cursor operated by the product testing device.

Optionally, the method further includes tracking, by a tracker, a selection of a tab, a selection of a button, a selection of an icon, a selection of a text, or any combination of the foregoing, by the product testing device.

Optionally, the method further includes tracking, by a tracker, a text input by the product testing device.

Optionally, the product comprises a web page, a web site, a computer application, a mobile device application, or a processor application.

Optionally, the testing of the product comprises a machine-based testing of the product.

A processor-readable medium includes a set of instructions, wherein an execution of the instructions by a processing unit will cause a method for product testing to be performed, the method comprising: providing, by a testing instruction generator, a user interface for generating an electronic file, the electronic file containing product testing instruction; and executing, by a processing unit of a product testing device, the electronic file to perform testing of a product based on the product testing instruction in the electronic file; wherein the testing of the product is performed by simulating human actions based on the product testing instruction in the electronic file.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting of its scope.

FIG. 3 illustrates an example of a user interface for providing a notification to a product tester.

FIG. 5 illustrates an example of a data structure for linking assigned product testing tasks with product testing questions, answers, and tracker identifiers.

FIG. 7 illustrates an example of a data structure for creating a graphic associated with an image of a web page being tested.

FIG. 8A-8C illustrates an example of a report summarizing a result of a product testing.

FIG. 10A-10E illustrate an example of a report that is provided to an administrator of the system of FIG. 1A.

FIGS. 26A-26B illustrates examples of action identifiers that may be inputted or selected by user via a user interface.

FIG. 26C illustrates examples of object identifiers that may be inputted or selected by user via a user interface.

DESCRIPTION OF THE EMBODIMENTS

Figure 1A:
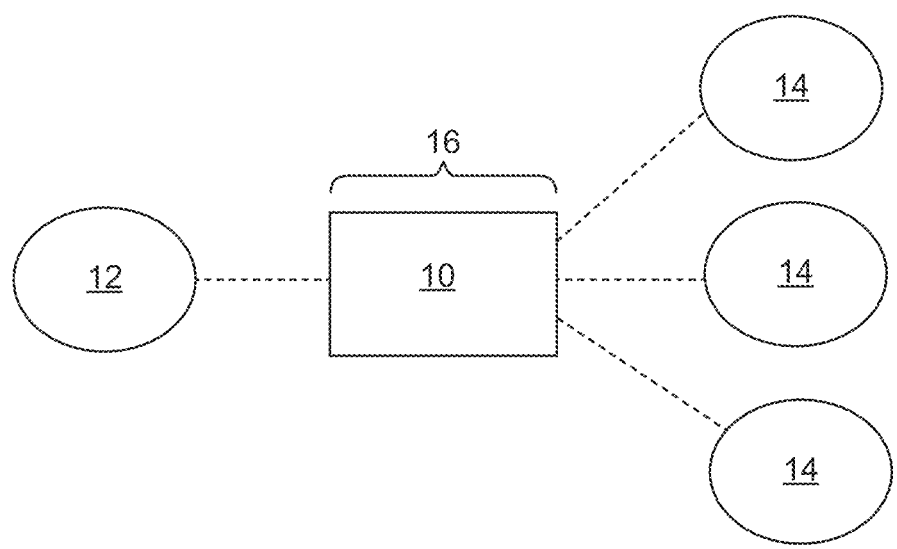
FIG. 1A illustrates a system for providing product testing.

Various embodiments are described hereinafter with reference to the figures. It should be noted that the figures are not drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated.

FIG. 1A illustrates a system 10 for providing product testing. The system 10 is configured to connect a party 12 that has developed a product with one or more product testers 14. By means of non-limiting examples, the product may be a web page, a web site, a computer application (e.g., an enterprise application), a mobile (e.g., handheld) device application, an application for a specialized processor (e.g., an image processor, a signal processor, a sound processor, a speech processor, a processor in a vehicle (such as a car, a plane, etc.), or any of other types of processor). The product testers 14 may be individuals residing in different parts of the world. For example, the testers 14 may reside in different parts of a city, different cities, different states, and/or different countries. In the illustrated embodiments, the system 10 is associated with a party 16 that is different from the party 12. For example, the party 12 (first party) providing the product may be a first company, and the party 16 (second party) interfacing with the party 12 and the product testers 14 may be a second company that is not the same as the first company. Also, in some embodiments, the product testers 14 are not employees of the first party 12, and are not employees of the second party 16. For example, the product testers 14 may be individual contractors. In other embodiments, one or more of the product testers 14 may be employees of the party 16.

Figure 1B:
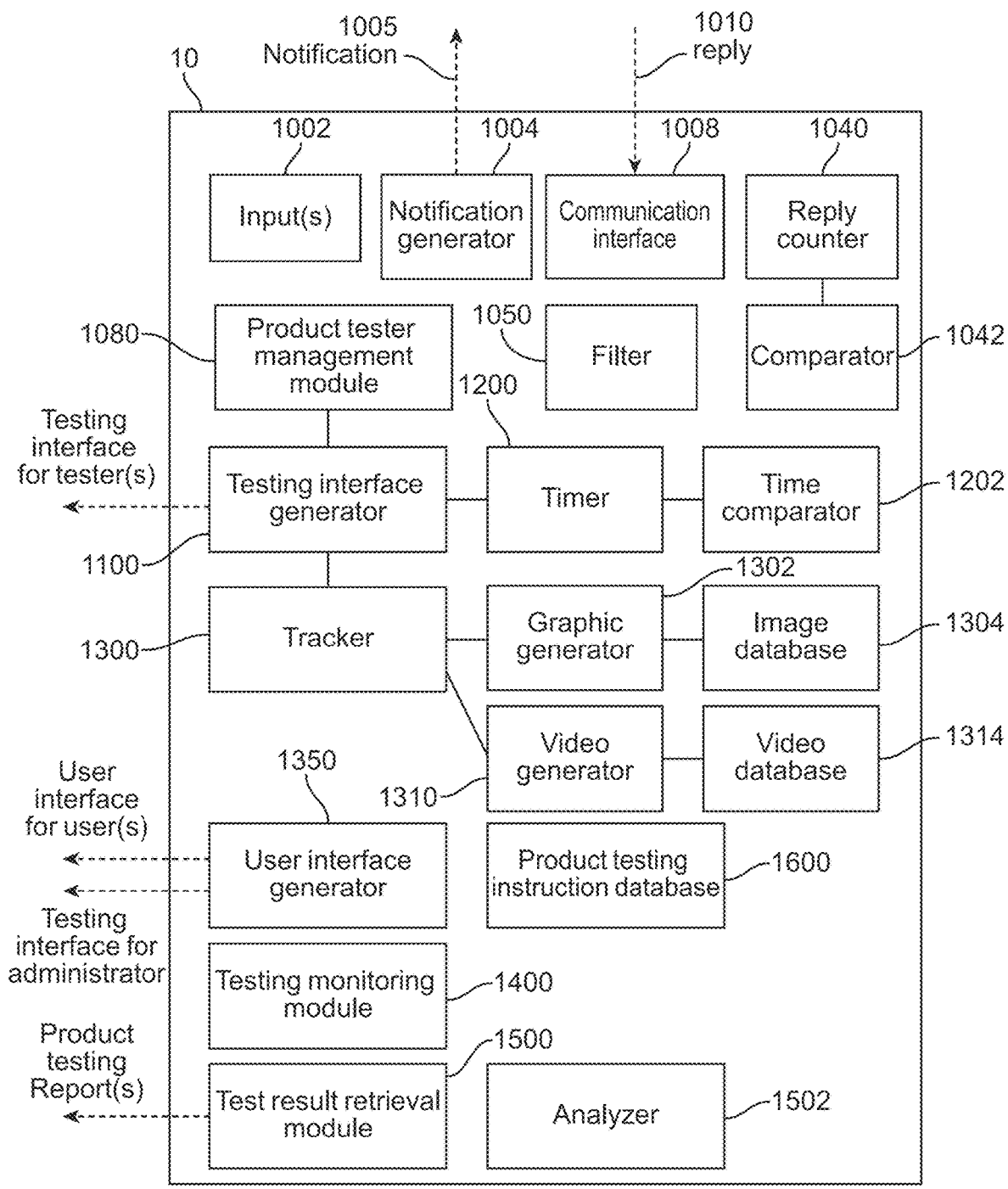
FIG. 1B illustrates an example of the system of FIG. 1A.

FIG. 1B illustrates an example of the system 10 of FIG. 1A. The system 10 includes one or more input(s) 1002, a notification generator 1004, a communication interface 1008, a reply counter 1040, a comparator 1042, a filter 1050, a product tester management module 1080, a testing interface generator 1100, a timer 1200, a time-comparator 1202, a tracker 1300, a graphic generator 1302, an image database 1304, a video generator 1310, a video database 1314, a user interface generator 1350, a testing monitoring module 1400, a test result retrieval module 1500, and an analyzer 1502. Details of these components will be described in further detail below. It should be noted that the system 10 is not limited to the example shown, and that the system 10 may have other configurations in other embodiments. For example, in other embodiments, the system 10 may not include one or more of the components shown in FIG. 1B. In further embodiments, the system 10 may be implemented using multiple devices, having different respect sets of one or more of the components shown in FIG. 1B.

In the illustrated embodiments, the product testers 14 have respective memberships and accounts with the party 16. For example, in order for a person to qualify as a product tester for the party 16, the person may need to go through a registration process with the system 10 to become a product tester 14. The product tester management module 1080 in the system 10 is configured to manage the various product testers 14. The product tester management module 1080 may be configured to provide a registration interface to receive information regarding a person who desires to be a product tester 14, so that the person is registered as a product tester 14 in the system 10. Each registered product tester 14 will have his/her login ID and password, which allow the product tester 14 to log into the system 10. The product tester management module 1080 may also be configured to provide training on product testing to train the person so that the person can be qualified as a product tester 14. In some embodiments, the product tester management module 1080 also manages the accounts of the various product testers 14. For example, after a product tester 14 completes a product testing project, the product tester management module 1080 may calculate a fee owed to the product tester 14 based on one or more features of the product testing project.

In some embodiments, the product tester management module 1080 also manages the accounts of the various product testers 14. For example, after a product tester 14 completes a product testing project, the product tester management module 1080 may calculate a fee owed to the product tester 14 based on one or more features of the product testing project. In one implementation, the fee owed to a product tester 14 may be calculated based on a number of tasks (steps) involved in the product testing. For example, if the product testing project involves 39 tasks, and the agreed rate between the product tester 14 and the second party 16 is $2 per task, then the fee for the product tester 14 for this project would be 39×2=$78. In some embodiments, all of the product testers 14 registered with the system 10 have the same pay rate. In other embodiments, different product testers 14 may have different scores indicating their level of experiences, reliabilities, etc. In such cases, the product testers 14 may have different respective pay rates based on these metrics.

During use of the system 10, when the first party 12 has developed a product, the first party 12 informs the second party 16 that its product needs to be tested. For example, the first party 12 may send a request to the system 10, and may transmit information regarding the product to be tested to the system 10. The request and/or the information regarding the product may be received by the input(s) 1002 of the system 10. For example, if the product is a web page, the first party 12 may provide a link for the web page, product testing parameters, and product testing tasks. In some embodiments, the user interface generator 1350 in the system 10 may provide an user interface for allowing the first party 12 to define product testing parameters and product testing tasks. These information may also be received via the input(s) 1002 of the system 10. For example, the first party 12 may access an user interface provided by the user interface generator 1350 of the system 10 to generate a list of tasks for a product tester 14 to perform, and to create a list of questions corresponding to the respective tasks for the product tester to answer. In one implementation, the user interface generator 1350 is configured to generate an image of the user interface for display on a device being used by the first party 12 when the first party 12 is on-line, and has logged into an account with the second party 16.

Figure 2A:
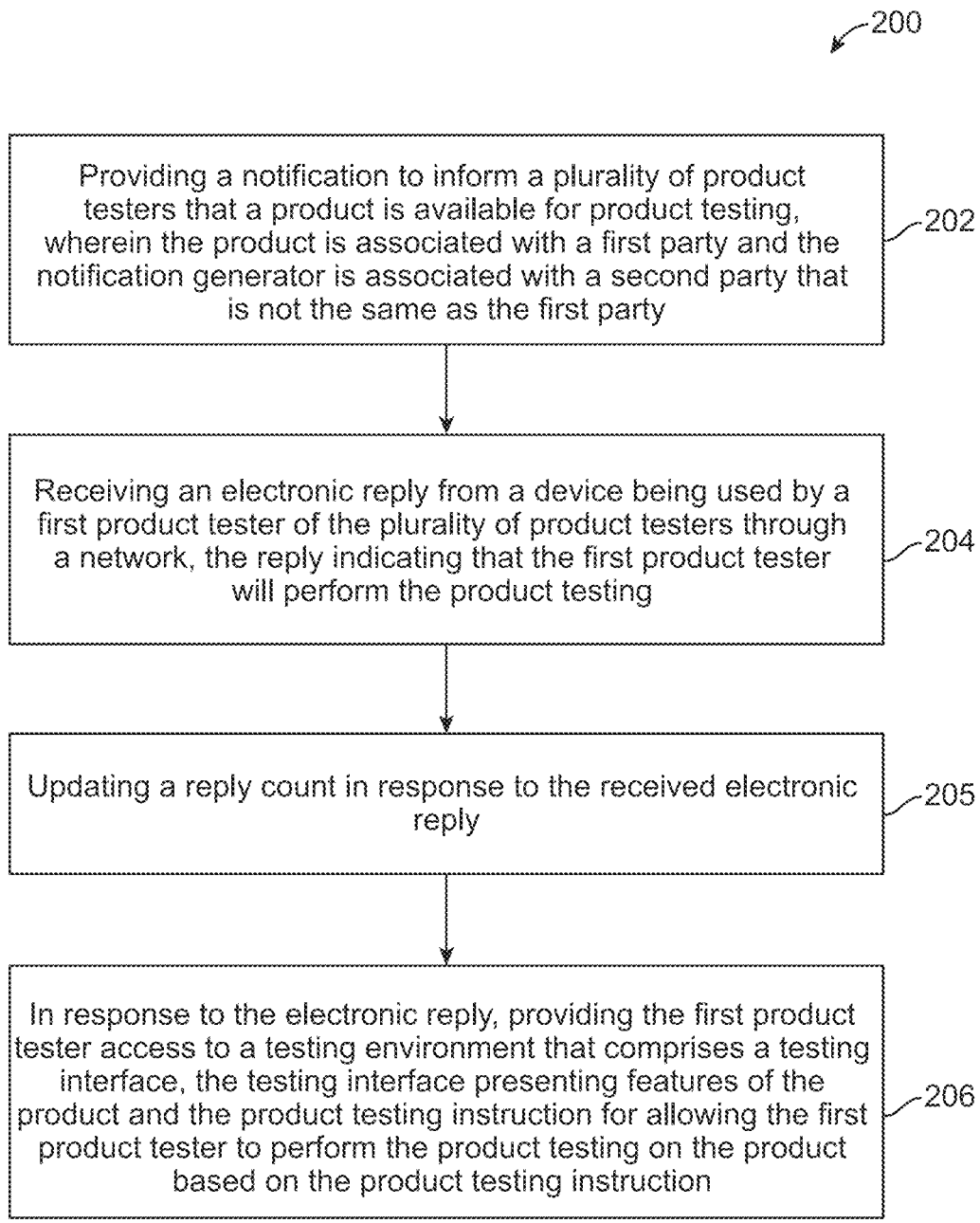
FIG. 2A illustrates a method for providing product testing.

FIG. 2A illustrates a processor-implemented method 200 performed by the system 10 of FIG. 1 for providing product testing. The method 200 may be described with reference to the system 10 of FIGS. 1A and 1B. In response to the request from the first party 12, the system 10 provides a notification 1005 to inform a plurality of product testers 14 that a product is available for product testing (item 202). In the illustrated embodiments, the product is associated with the first party 12 and the notification generator 1004 is associated with a second party 16 that is not the same as the first party 14.

In some embodiments, the notification 1005 provided by the system 10 is for display in a web browser. For example, the product tester 14 may open a web browser on his/her device. The web browser may include an add-on feature, which allows the product tester 14 to receive the notification 1005 from the system 10. In such cases, if the product tester 14 is on-line, the product tester 14 will receive the notification 1005. On the other hand, if the product tester 14 is off-line, then the product tester 14 will not receive the notification 1005. In the illustrated embodiments, the notification 1005 is "broadcasted" by the system 10 in the sense that multiple product testers 14 will receive the notification 1005 or will have access to such notification 1005.

In other embodiments, the notification 1005 may be for display in a field created by a product testing notification application. For example, the product tester 14 may install a product testing notification application onto his/her device, which allows the product tester 14 to receive the notification 1005 from the system 10. The product testing notification application may be provided by the second party 16 for installation or downloading onto a device of a product tester 14. The device being used by the product tester 14 may be a laptop, a desktop computer, or a handheld device (e.g., an iPhone, iPad, iPad mini, tablet, etc.).

In further embodiments, the notification 1005 may be sent to a job listing agent, or a crowd-testers provider, such as crowdflower or a mechanical turk, etc.

Accordingly, as used in this specification, the term "notification" may refer to any information for informing a product tester 14, wherein such information may be sent directly to a user interface on a device being used by the product tester 14, or to a job listing agent for allowing a product tester 14 to view. The notification may actively inform the product tester 14, or may passively inform the product tester 14 (in that the notification may be posted at a location at which the product tester 14 may search or discover such notification).

Figure 3:
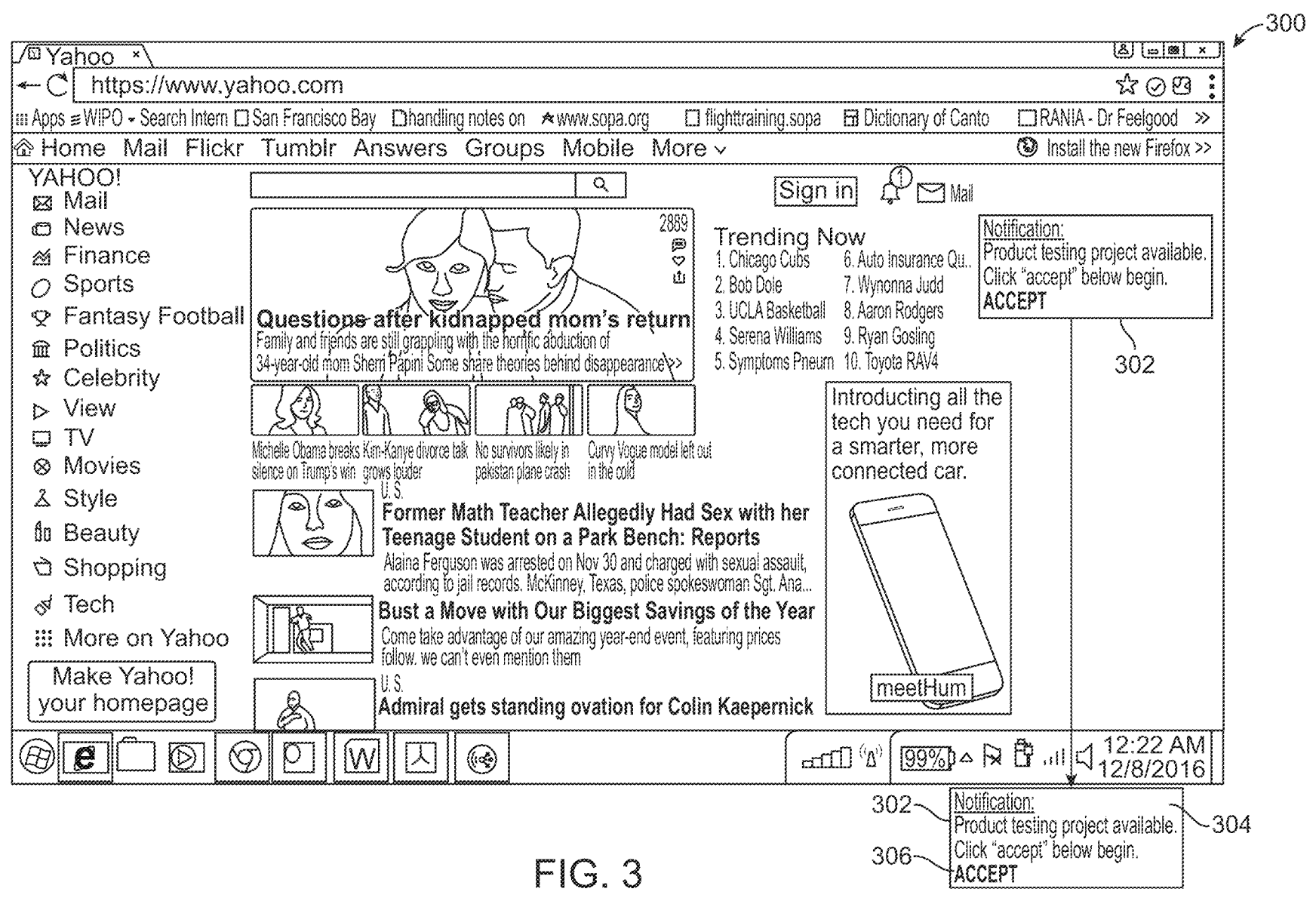

FIG. 3 illustrates an example of a user interface 300 for providing a notification to a product tester 14. The user interface 300 includes a field 302 for displaying a notification 304 provided by the system 10, indicating that a product testing project is available. The user interface 300 also includes a feature 306 for allowing a product tester 14 to accept the product testing project.

It should be noted that the user interface 300 for providing the notification to the product tester 14 is not limited to the example described previously, and that the user interface 300 may have other configurations in other embodiments.

Returning to the method 200 of FIG. 2, and the system 10 of FIGS. 1A and 1B, next, an electronic reply 1010 is received from a device being used by a product tester 14 of the plurality of product testers through a network (item 204). In the illustrated embodiments, item 204 may be performed by the communication interface 1008 at the system 10. The reply 1010 indicates that the product tester 14 will perform the product testing. The network transmitting the electronic reply may be any network, such as the Internet, a telecommunication network, etc. In some cases, the electronic reply 1010 may be generated using a web browser utilized by the product tester 14. For example, the web browser on a device utilized by the product tester 14 may include an add-on feature, which allows the product tester 14 to receive the notification 1005 (e.g., a ping, a message, a posting, etc.) from the system 10, like the example shown in FIG. 3. The same add-on feature may also allow the product tester 14 to provide his/her reply (for reception by the system 10) to accept or to sign up for a product testing project.

In other cases, the electronic reply 1010 may be generated using a product testing notification application utilized by the product tester 14. For example, the product tester 14 may install a product testing notification application onto his/her device, which allows the product tester 14 to receive the notification 1005 from the system 10. As discussed, the product testing notification application may be provided by the second party 16. The same product testing notification application may also allow the product tester 14 to provide his/her reply (for reception by the system 10) to accept or to sign up for a product testing project.

In further embodiments, as discussed, a product tester 14 may use crowdflower or a mechanical turk to obtain the notification 1005 regarding the product testing project. In such cases, the reply 1010 accepting the product testing project will be generated by a device using the crowdflower or mechanical turk.

As shown in the figure, the method 200 further includes updating a reply count in response to the received electronic reply (item 205). In the illustrated embodiments, item 205 is performed by the reply counter 1040 of the system 10.

In some embodiments, the method 200 may also include receiving additional electronic reply/replies 1010, keeping track with a number of replies 1010, and comparing the number of replies 1010 with a prescribed number. In some embodiments, the communication interface 1008 of the system 10 is configured to receive one or more additional electronic replies 1010 from one or more additional product testers 14 from the plurality of product testers 14 until a prescribed number of electronic replies 1010 has been reached. In response to each reply received by the communication interface 1008, the reply counter 1040 in the system 10 will increment the reply count by one. In such cases, after the communication interface 1008 received the first electronic reply 1010 from the product tester 14, the product testing project is then assigned only to the product tester 14, and not to any other product testers 14. The communication interface 1008 continues to receive additional reply until the total number of replies 1010 is equal to the prescribed number of electronic replies 1010, as determined by the comparator 1042 in the system 10. In the illustrated embodiment, the prescribed number of reply 1010 is one reply. In other embodiments, the prescribed number of replies 1010 may be more than one. For example, in some embodiments, the prescribed number of electronic replies 1010 may be three, four, five, six, or seven. In other embodiments, the prescribed number of electronic replies 1010 may two. In further embodiments, the prescribed number of electronic replies 1010 may be more than seven.

Referring to FIG. 2, next, in response to the electronic reply, the system 10 then provides a testing environment that comprises a testing interface for use by the product tester 14 (item 206). In some embodiments, the testing interface may be generated by the testing interface generator 1100 in the system 10. Also, in one implementation, item 206 may be performed by the system 10 providing the testing interface for display on a device being used by the product tester 14 after the product tester 14 has accepted the product testing project. For example, the generated testing interface may be output to a network (e.g., the Internet) for transmission to the device of the product tester 14. Also, in one implementation, item 206 may be performed by the testing interface generator 1100, which opens up a virtual machine environment for presenting the testing interface for the product tester 14 in response to the product tester 14 accepting to take the product testing project.

The testing interface is configured to present features of the product and the product testing instruction for allowing the first product tester 14 to perform the product testing on the product based on the product testing instruction. In some embodiments, the product testing instruction provides a plurality of tasks for the product tester 14 to perform for testing the product. For example, in some cases, the product being tested comprises a web page, and the product testing instruction is configured to prescribe one or more actions be performed on the web page being tested.

Figure 4:
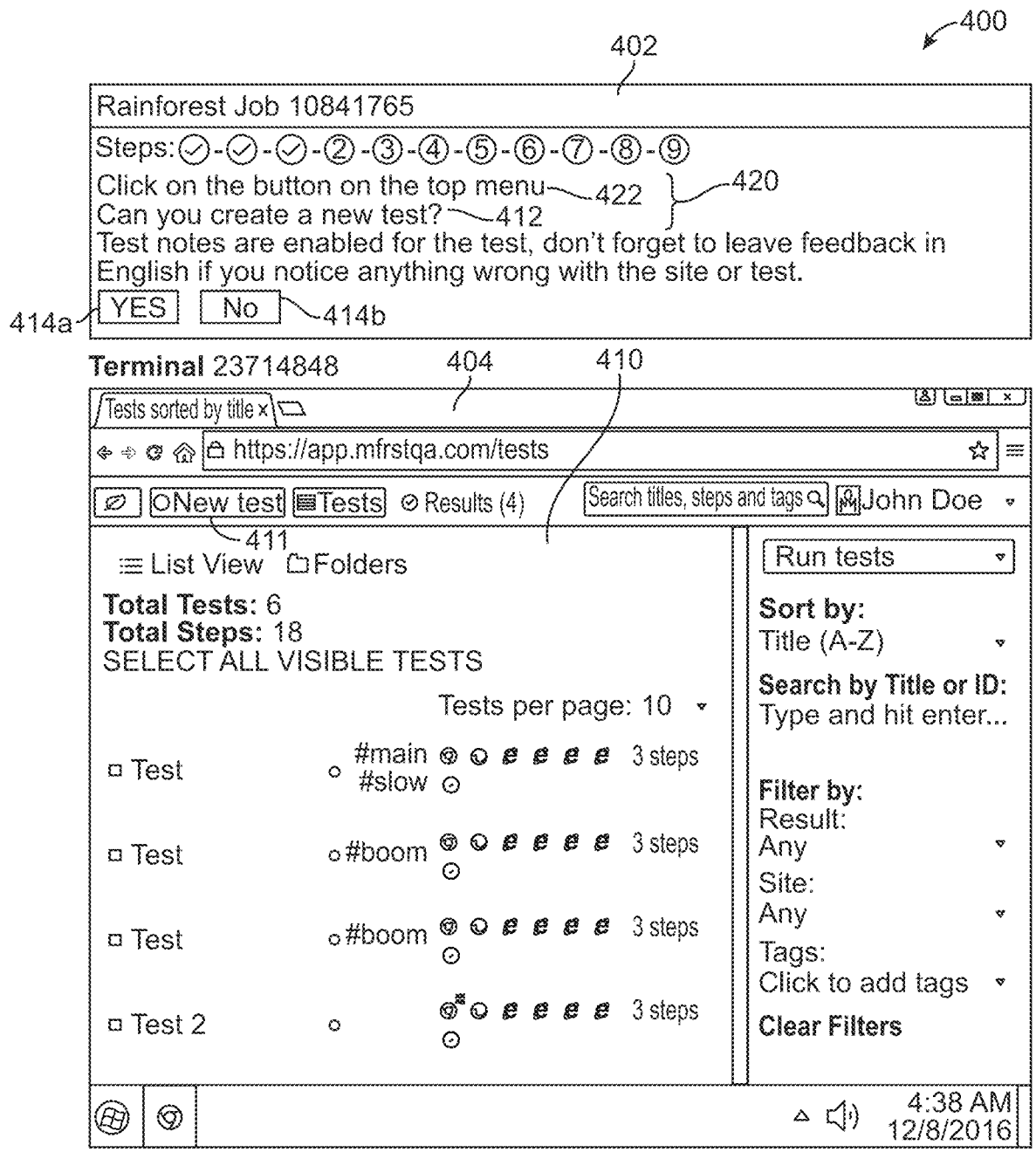
FIG. 4 illustrates an example of a testing environment having a user interface for allowing a product tester to perform product testing.

FIG. 4 illustrates an example of a testing environment 400 having a testing interface 402 for allowing a product tester 14 to perform product testing. The testing interface 402 includes a window 404 for presenting features of the product being tested. In the illustrated example, the product comprises a web page. The window 404 may allow the product tester 14 to access the web page via a link. In response to the product tester 14 entering or clicking the link, the window 404 then presents an image of a web page 410 for allowing the product tester 14 to perform product testing thereon. Also, in the illustrated example, the web page 410 displayed in the window 404 includes one or more selectable features 411. The testing interface 402 includes a field 420 providing one or more tasks 422 for the product tester 14 to perform on the web page 410.

In some embodiments, the tasks 422 are parts of a product testing instruction. A task 422 may require the product tester 14 to perform an action on the image of the web page 410. For example, a task 422 may be to click on a tab on the web page 410, to click on a link on the web page 410, to enter a value in a field in the web page 410, to click on a box in the web page 410, etc.

As shown in FIG. 4, the testing interface 402 may be configured to present a question 412 for the product tester 14 to answer after the action has been performed based on the product testing instruction. For example, the question 412 may ask the product tester 14 whether the product tester 14 sees a pop-up after selecting an object in the web page 410 being tested, whether the product tester 14 sees a new image after selecting a certain option in the web page 410, etc. In the illustrated example, the testing interface 402 also provides only two possible answers 414*a*, 414*b* ("Yes" and "No") for allowing the product tester 14 to select. Such technique reduces ambiguity in the answer provided by the product tester 14. In other embodiments, the testing interface 402 may provide more than two possible answers 414 for allowing the product tester 14 to select to answer a question baser the product tester 14 performs a task specified in the product testing instruction.

In some embodiments, if the product tester 14 selects the "No" answer to any of the product testing question, the system 10 then terminates the product testing session, and the product testing is considered completed by the product tester 14. In such cases, no further product testing tasks and no further product testing questions will be presented to the product tester 14. This is because if the product being tested has a certain feature that fails, then the product provider may want to know this right away. Also, the failed feature may impact other features of the product. Accordingly, if a feature in the product has failed the product testing, then one or more other features may fail as well. In other embodiments, instead of terminating the product testing session, the system 10 may allow the product tester 14 to continue testing the product. For example, the system 10 may allow the product tester 14 to continue with the remaining tasks in the product testing prescribed by the product testing instruction. Also, the system 10 may allow the product tester 14 to test other features of the product that are not associated with the failed feature.

In some embodiments, the method 200 further includes storing an answer of the question in a test result file for the product being tested. As described, the answer may be a "Yes" answer or a "No" answer in response to a question provided to the product tester 14 after the product tester 14 has performed a task to test the product. Thus, in some embodiments, the answer, the question, and the associated task for testing the product may be stored in a unique data structure that associate these items together. FIG. 5 illustrates an example of a data structure 500 for linking product testing tasks 502, respective product testing questions 504, and the corresponding answers 506 to the product testing questions 504. The data structure 500 also includes tracker identifiers 508 that identify files tracking interaction of the product tester 14 while testing the product. Each tracker identifier 508 may identify an image, a video file, or any of other interaction information that captures the interaction of the product tester 14 on the product being tested. These information are advantageous because they allow a user (from party 12 or party 16) to retroactively determine how a product tester 14 came to a conclusion based on the product tester's 14 interaction with the product being tested. The tracker identifier 508 will be described in further detail below.

In some embodiments, the testing interface 402 is configured for display on a computer screen or a laptop screen. In other embodiments, the testing interface 402 is configured for display on a hand-held device (e.g., an iPhone, iPad, iPad mini, tablet, etc.).

It should be noted that the testing interface 402 is not limited to the example discussed previously, and that the testing interface 402 may have other configurations in other embodiments.

Figure 2B:
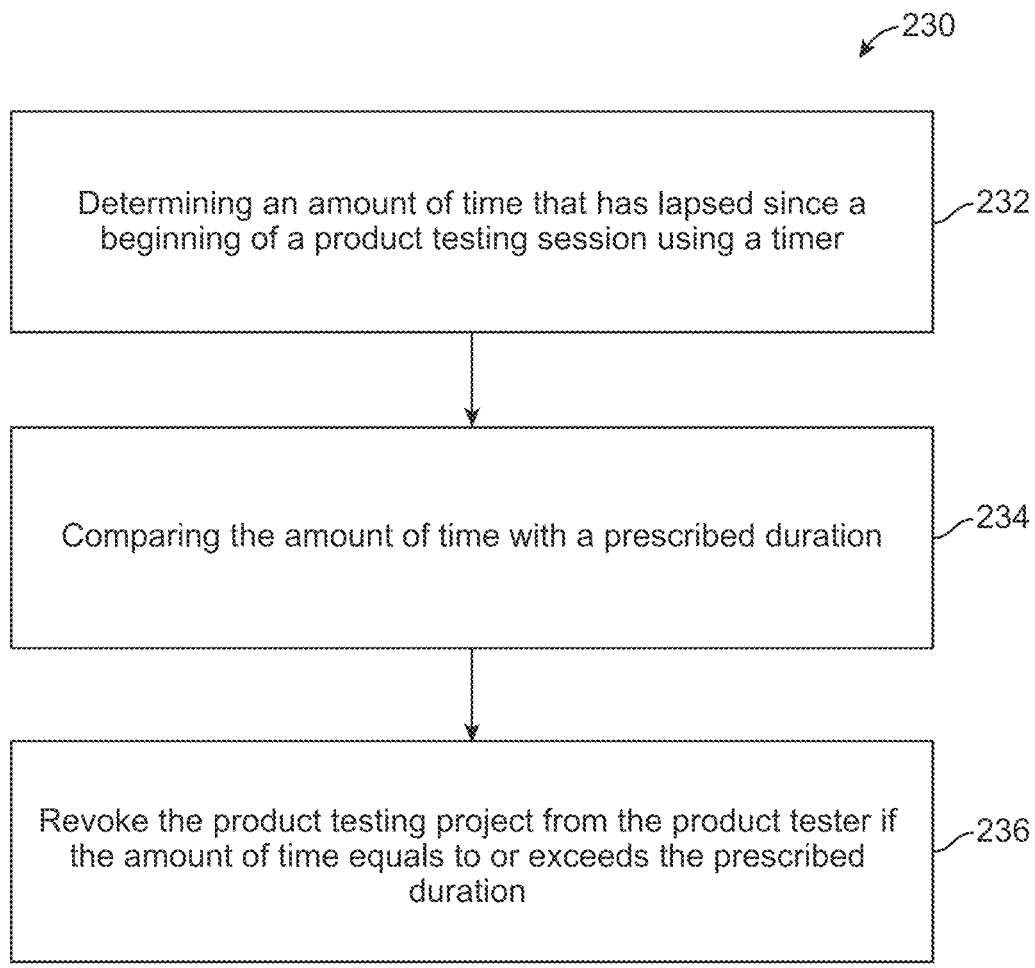
FIG. 2B illustrates a method of tracking a progress of a product testing session.

In some embodiments, after the testing interface 402 is provided to the product tester 14, the timer 1200 in the system 10 keeps track of the duration that has lapsed since the providing of the testing interface 402. In such cases, the method 200 may further include determining (by the timer 1200) an amount of time that has lapsed since the testing interface has been provided to the product tester 14. The method 200 may also include comparing the amount of time with a prescribed duration using the time-comparator 1202. If the lapsed time has exceed a the prescribed duration (e.g., a starting deadline), and the product tester 14 has not begun performing a product testing task, then the system 10 will revoke the product testing project from the product tester 14. For example, the system 10 may terminate the product testing session being used by the product tester 14. In some embodiments, the prescribed duration (starting deadline) may be set by the system 10 to be five minutes after a product testing session has begun. In other embodiments, the prescribed duration may be set by an administrator of the system 10 to have other values, such as a duration that is more than five minutes, or less than five minutes. Accordingly in some embodiments, a method 230 of tracking a progress of a product testing session may be provided (FIG. 2B). The method 230 may be a part of the method 200 in some embodiments. The method 230 includes determining an amount of time that has lapsed since a beginning of a product testing session using a timer (item 232), comparing the amount of time with a prescribed duration (item 234), and revoking the product testing project from the product tester if the determined time equals to or exceeds the prescribed duration (item 236). In some embodiments, the method 200 may also include terminating the product testing session. Also, in one implementation, item 236 may be performed by the testing interface generator 1100, which closes a virtual machine environment presenting the testing interface for the product tester 14 in response to the lapsed time meeting the prescribed duration.

In some embodiments, after the testing interface 402 is provided to the product tester 14, the method 200 further includes tracking an interaction of the product tester 14 with the web page. For example, the product tester 14 may be using his/her device (e.g., laptop, desktop, handheld device, such as a cell phone, etc.) to perform the product testing. In such cases, the tracker 1300 of the system 10 is configured to track a position of the cursor in the product tester's device as operated by the product tester 14. In some cases, if the product tester 14 is using a cell phone with a touchscreen to perform the product testing, the tracker 1300 may be configured to track a position of the finger position as applied on the touchscreen. Thus, as used in this specification, the term "cursor" is not limited to a displayed item operated using a touchpad, a mouse, or a knob, and the term "cursor" may also include non-displayed item that is associated with a movement of a finger as applied on a touchscreen.

In one implementation, the testing interface 402 may instruct the product tester 14 to click on a certain item on an image of a web page being tested. While the product tester 14 is manipulating the cursor in the web page, the tracker 1300 of the system 10 records the positions of the cursor as it appears in the web page. The system 10 may also use the graphic generator 1302 configured to generate a graphic representing the tracked movement. In some embodiments, the graphic comprises a line traversing a plurality of cursor positions. Also, the graphic may further comprise a selection identifier identifying a position in the image of the web page at which the product tester 14 performed a selection (e.g., a clicking of a button). For example, the selection may be a selection of a tab, a selection of a button, a selection of an icon, a selection of a text, or any combination of the foregoing, performed by the product tester 14.

Figure 6:
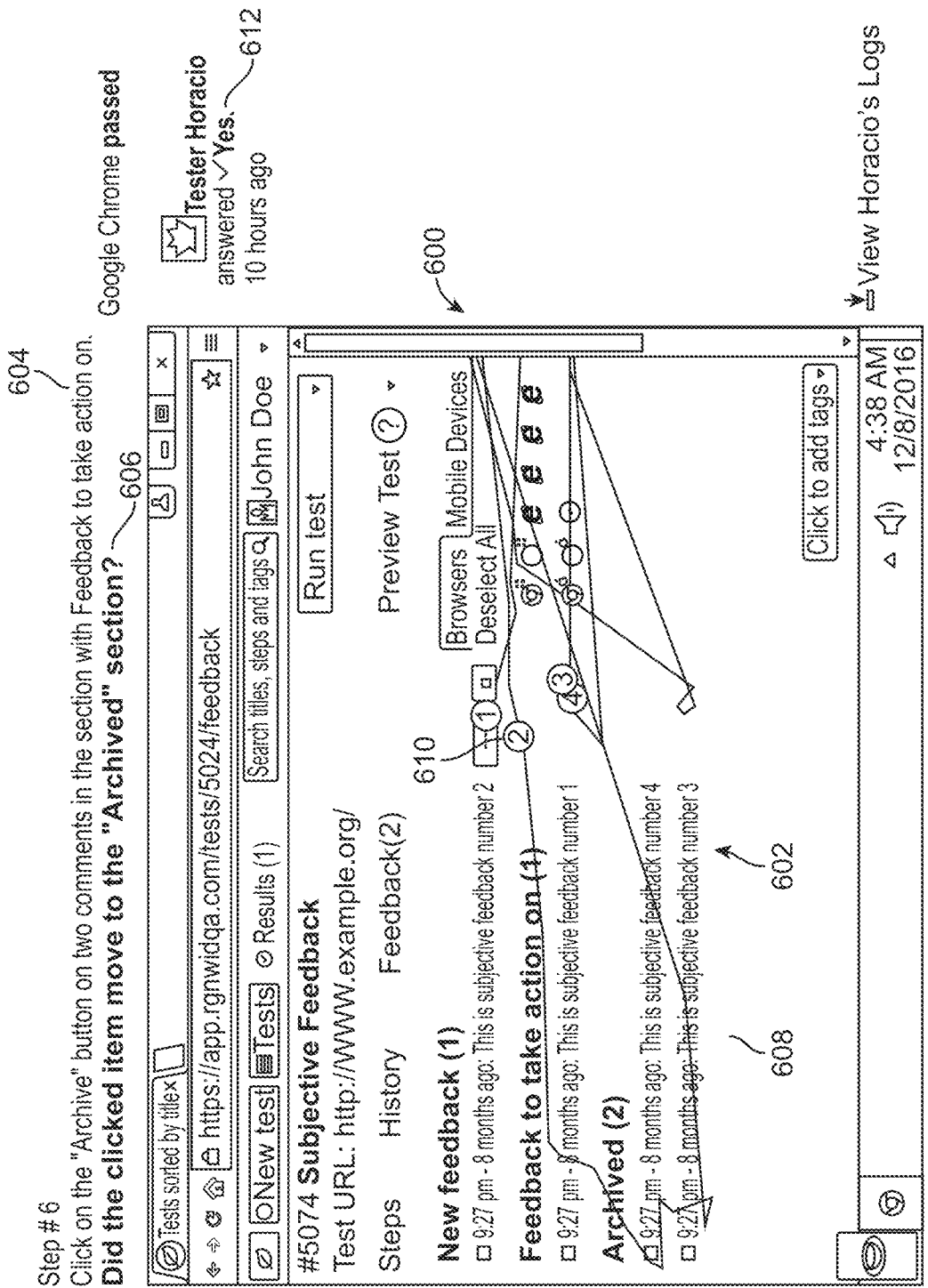
FIG. 6 illustrates an example of an image capturing an interaction of a product tester with a product being tested.

FIG. 6 illustrates an example of an image 600 capturing an interaction of a product tester with a product being tested. As shown in the figure, the image 600 includes an image of a web page 602 being tested, the task 604 prescribed by the product testing instruction, and the question 606 corresponding to the task 604. In the example, the task 604 instructs the product tester 14 to click on the "Archive" button, and the question 606 asks the product tester 14 whether the clicked item moved to the archived section. The image 600 also shows a graphic 608 generated by the graphic generator 1302. The graphic 608 is in a form of a line, which indicates where the product tester 14 has moved the cursor while performing the task 604. The graphic 608 also includes a plurality of circles 610 (example of selection identifiers) identifying a position in the image of the web page at which the product tester 14 has clicked on a button.

In some embodiments, the method 200 may further include storing the electronic image 600 in a non-transitory medium 1304 (FIG. 1B). The non-transitory medium 1304 is illustrated as an image database, but in other embodiments, the non-transitory medium 1304 may be any memory or storage device. The image 200 includes the image of the web page 602 and the graphic 608 superimposed with the image of the web page 602. In one implementation, for a given product testing task, the system 10 is configured to generate positional data regarding the position of the cursor as the product tester 14 interacts with the web page 602 to perform the assigned task. The positional data may include a position (e.g., X and Y coordinates) of the cursor. The positional data may be later used by the graphic generator to generate the graphic 608. For example, all of the positional data may be plotted to create the line shown in the example of the graphic 608 in FIG. 6. Also, in some embodiments, the system 10 may also generate timing data that are associated with the respective positions of the cursor. For example, cursor position (X1, Y1) may occur at t1, and cursor position (X2, Y2) may occur at t2. Thus, the system 10 may generate the timing data t1, t2, etc., and store such timing data in association with the respective cursor positions in the non-transitory medium.

FIG. 7 illustrates an example of a data structure 700 for storing cursor position data in association with timing data. The data structure 700 includes two columns for positional values in the x-coordinate and y-coordinate, respectively. The data structure 700 also includes a column for indicating whether the product tester 14 made a selection (e.g., by clicking a button) at a certain cursor position.

In some embodiments, the data structure 700 may be used by the graphic generator 1302 to create the graphic 608 that is associated with an image of a web page being tested. In particular, the positional values in the data structure 700 may be used to create the lines in the graphic 608, and the select indicator(s) in the data structure 700 may be used to create the circle(s) 610 representing the position(s) at which the product tester 14 has made a selection. In some embodiments, the data structure 700 may be stored in the non-transitory medium 1304.

Also, in some embodiments, the data structure 700 may be linked with a certain tracker identifier in the data structure 500 of FIG. 5. For example, the data structure 700 with the identifier "23" may contain data for creating the graphic 608 in the image file 342 in the data structure 500. The image file 342 may contain an image of the web page being tested. In such cases, the data structure [Image file 342; ID=23] may be used to link the data structure 700 with the image file 342. Accordingly, when the system 10 presents an image for indicating a tracked action of a product tester 14 for the task No. 1 listed in the data structure 500, the system 10 will use the above data structure to look up the data structure 700 with the ID "23". The data in the data structure 700 are then used to generate the graphic 608 for presentation with an image of the web page.

As shown in FIG. 7, the data structure 700 may also include timing data indicating the respective times at which the positions of the cursor occurred.

The timing data is advantageous because it may allow the graphic 608 to be presented in a form of a video. For example, the video generator 1310 may utilize the data structure 700 to create a video showing a changing of the position of the cursor over time. Thus, the video will indicate a tracked interaction of the product tester 14 with the web page being tested. In some embodiments, the video provided by the video generator 1310 may include a moving cursor. In other embodiments, the video provided by the video generator 1310 may include a growing line representing a collection of positional points by the cursor as the cursor is moved across the web page. In some embodiments, the video may be stored in a non-transitory medium 1314 (FIG. 1B). The non-transitory medium 1314 is illustrated as a video database, but in other embodiments, the non-transitory medium 1314 may be any memory or storage device. Also, in other embodiments, instead of having separate non-transitory media 1304, 1314 as image database and video database, the non-transitory media 1304, 1314 may be integrated as a single database.

The graphic 608 and the image of the web page being tested may be provided by the system 10 to a user associated with the first party 12. For example, in some embodiments, the user interface provided by the user interface generator 1350 may be configured to output an image and/or a video having the graphic 608 and the image of the web page for viewing by the user of the system 10. Such image and/or video may be provided as a part of a test result file so the user can see how the product tester 14 came to a certain product testing conclusion based on the interaction with the web page tested.

In some embodiments, the image and/or the video may be stored in association with the corresponding product testing task defined in the product testing instruction. In particular, the image and/or the video is for tracking the interaction of the product tester 14 while the product tester 14 is performing a certain task prescribed in the product testing instruction. Accordingly, each of the task prescribed to be performed by the product tester 14 will have a corresponding image and/or video tracking the interaction of the product tester 14 with the web page being tested. For example, if a product testing project has 28 tasks (steps), after the product tester 14 has finished the product testing project, the system 10 will have generated 28 images and/or 28 videos for the respective 28 tasks.

In some embodiments, all of the 28 images and/or the 28 videos in the example may be provided, or made available, to the user who is associated with the first party 12 (the provider of the product). In other embodiments, only one image and/or one video may be provided, or made available, to the user who is associated with the first party 12. For example, if a certain task in the product testing results in a "failed" result for the product testing, then the system 10 may provide only the image and/or only the video associated with the failed task. This may be advantageous because the user may not be concerned with tasks that have "pass" status, but may be more interested in viewing results for the task that results in a "failed" status. Furthermore, in some embodiments, the system 10 may store only the image and/or only the video that is associated with a failed task, and may delete other images and videos for other tasks that have "pass" status after the product testing project is completed or after the product testing project is completed for a certain pre-determined duration.

Figure 8A:
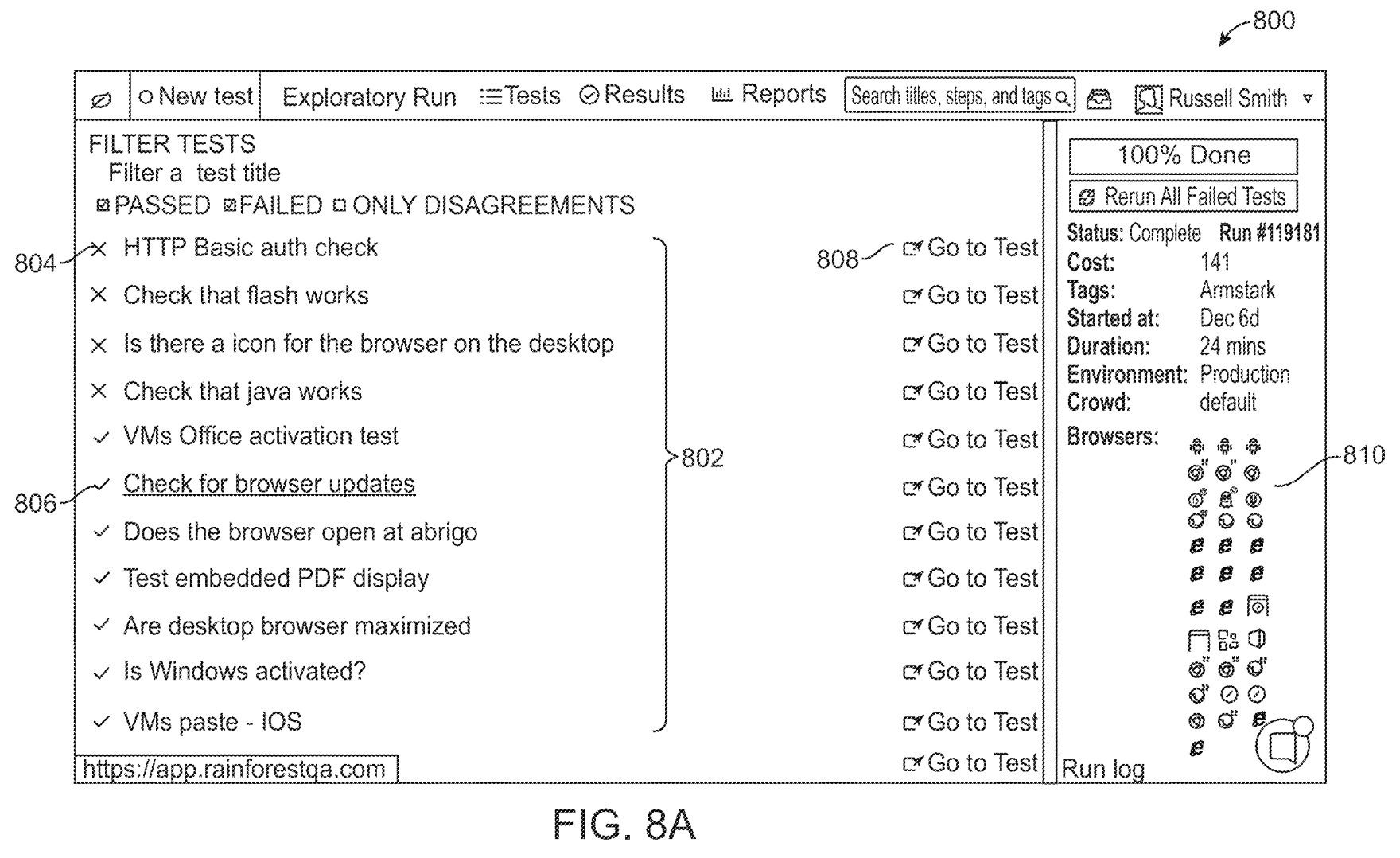
Figure 8B:
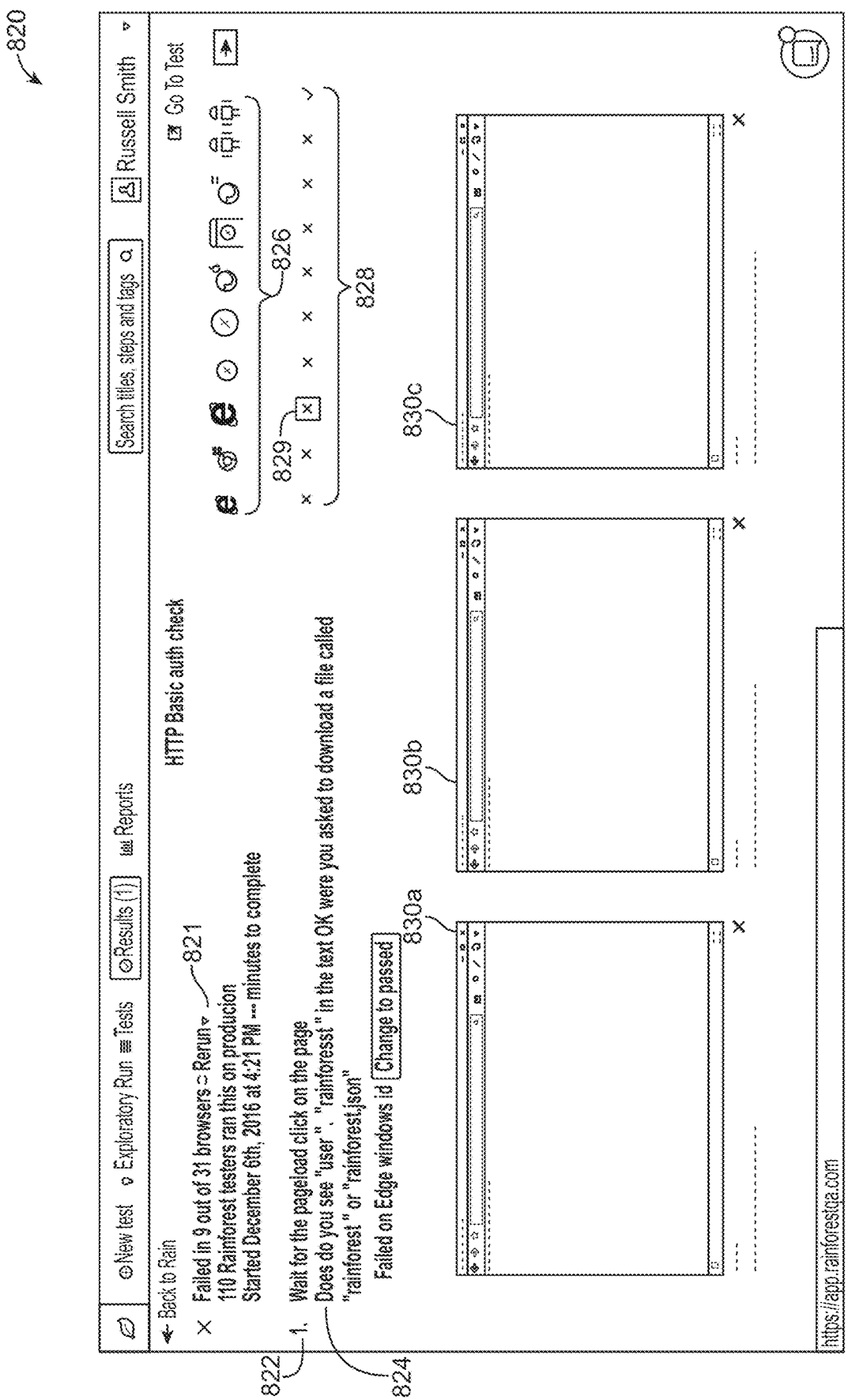
Figure 8C:
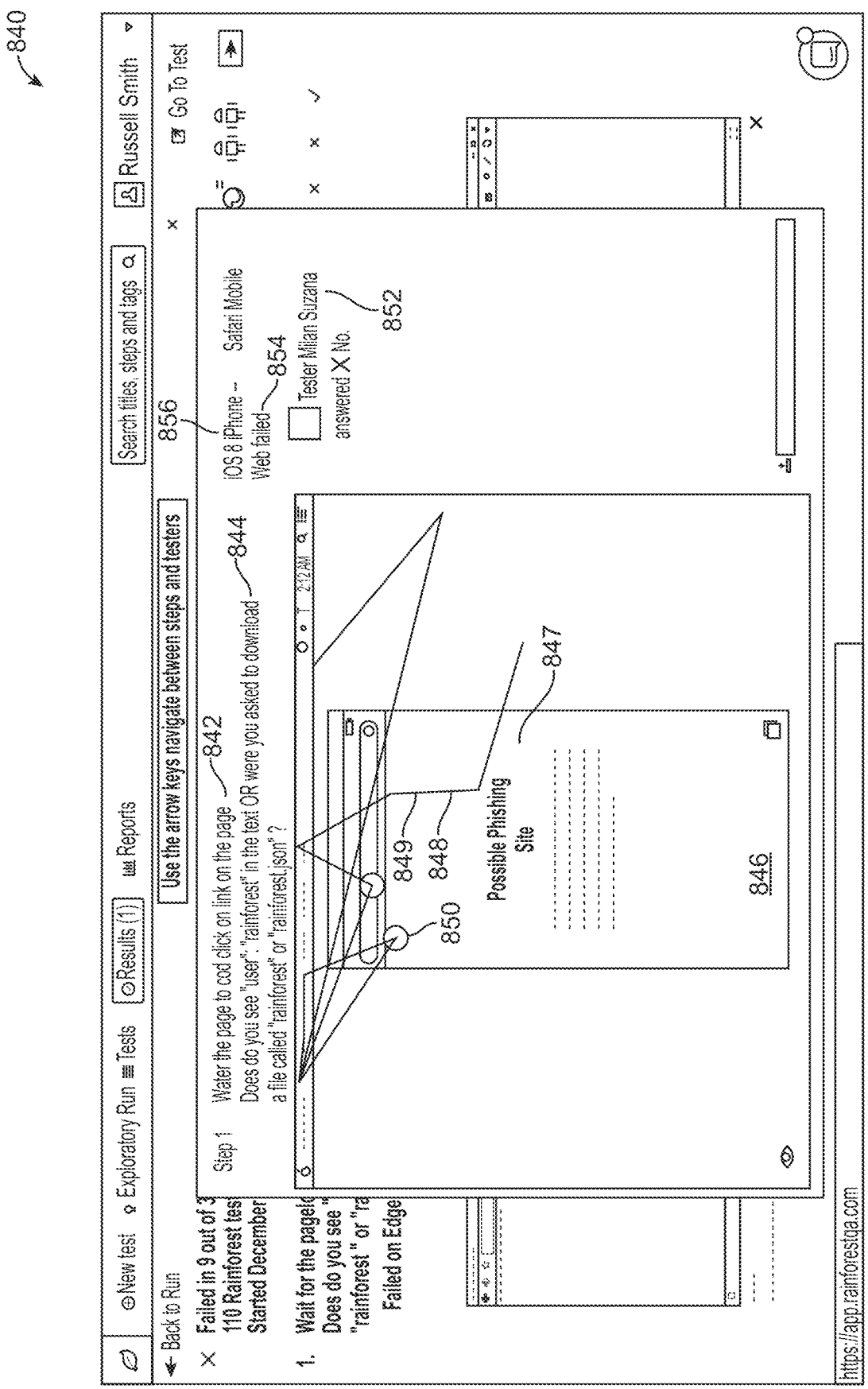

FIG. 8A-8C illustrates an example of a report 800 summarizing a result of a product testing. In some embodiments, the system 10 is configured to gather information from the finished product testing by one or more product testers 14, and generate the report 800 based on the gathered information. In the illustrated example, the report 800 is for a certain product that has been tested by the product testers 14. The report 800 includes a list of product testing tasks 802 performed by the product testers 14. The tasks 802 in the report 800 are the same tasks created (using the user interface provided by the user interface generator 1350) by the user associated with the first party 12 that provides the product for product testing. The report 800 also includes failed test identifier(s) 804 and passed test identifier(s) 806 next to different respective tasks. A task with a failed test identifier 804 indicates that the product testing failed when the product tester(s) performed that task. A task with a passed test identifier 806 indicates that the product testing passed when the product tester(s) 14 performed that task.

As shown in FIG. 8A, the report 800 also includes an object 808 next to each of the tasks, which when selected by the user, will provide further details about the product testing on that specific task. The report 800 also includes a list of browsers 810 in which the product testing of the product has been performed.

In some cases, the user viewing the report 800 may be interested in viewing details of the product testing for a certain task. In such cases, the user may select the corresponding object 808 next to the task 802. In response, the system 10 may present the report 820 shown in FIG. 8B for the user. The report 820 is for a certain task performed during the product testing. As shown in the figure, the report 820 includes a summary 821 of the product testing for that task. In the illustrated example, the summary 821 indicates that the specific task in question failed when the product testers 14 perform the product testing in 9 out of 31 browsers. The report 820 also shows the corresponding task 822 performed by the product testers 14 when the product testing failed, and the corresponding question 824. The 9 browsers in which the performance of the task failed are shown by the browser icons 826. The report 820 also includes pass/fail indicator 828 next to the different respective browser icons 826. In the example, a failed indicator 828 next to a browser icon 826 indicates that the performance of the task failed when the product testers 14 performed the task in the type of browser represented by the browser icon 826.

Also, in the illustrated example, the user viewing the report 820 has selected one of the pass/fail indicators 828 for a certain browser, as represented by the selector graphic 829. Accordingly, the report 820 displays three images 830a-830c that were captured when three respective different product testers 14 performed the task 822 in the browser type selected. From the images 830, the user viewing the report 820 can see what were on the product testers' 14 screen when they performed that specific task that result in a "failed" status.

The user viewing the report 820 can select one of the images 830a-830c to see more detail. For example, when the user selects one of the images 830a-830c, the system 10 may provide a report 840 shown in FIG. 8C to the user. The report 840 includes a description of the task 842, and the corresponding product testing question 844. The report 840 also includes an image 846 that includes an image 847 of the web page tested, and a graphic 848. The graphic 848 includes a line 849 that tracks the position of the cursor when the product tester 14 interacted with the web page, and selection identifiers 850 indicating the positions where the product tester 14 made selections (e.g., clicked a button). The features in the image 846 may be provided by the graphic generator 1302 of the system 10, as similarly discussed with reference to FIG. 6. Thus, image 846 allows the user to retroactively view the interaction of the product tester 14 with the web page while performing the task 842. In other embodiments, instead of a fixed image 846, the system 10 may provide a video showing a movement of the cursor and selection(s) (e.g., clicking of button) by the product tester 14.

As shown in the figure, the report 840 further includes an identifier of the product tester 14 who performed the product testing task. The identifier may be the actual name of the product tester 14 or other identifier that identifies the product tester 14. Also, in some embodiments, the identity of the product tester 14 may be kept confidential and may not be presented by the system 10 to the user.

The report 840 further includes a browser identifier 856 identifying the type of browser in which the task was conducted by the product tester 14, and a pass/fail indicator 854 indicating whether the task in question failed or passed during the product testing.

In some embodiments, the test result reports 800, 820, 840 may be generated using the test result retrieval module 1500 in the system 10. The test result retrieval module 1500 gather information regarding the product testing, and create the reports 800, 820, 840 for viewing by the user. The reports 800, 820, 840 may be presented through an user interface created by the user interface generator 1350 of the system 10. For example, in some embodiments, the user interface generator 1350 may generate and provide an user interface for use by an administrator of the system 10. In such cases, the reports 800, 820, 840 may be provided for viewing by the administrator through the user interface. Alternatively or additionally, the user interface generator 1350 may generate and provide an user interface for use by a user associated with the first party 12 providing the product for product testing. In such cases, the reports 800, 820, 840 may be provided for viewing by the user through the user interface.

It should be noted that the test result reports 800, 820, 840 are not limited by the examples described previously, and that the system 10 may provide test result report(s) having different configurations in different embodiments. For example, in other embodiments, the reports 800, 820, 840 may have fewer information than those described in the above example.

Also, in other embodiments, instead of providing reports associated with all of the product testers 14 for each task, the system 10 may consolidate the product testing results from the multiple product testers 14, and provide a consolidated product testing report to the user. For example, the analyzer 1502 in the system 10 may employ a logical algorithm to determine whether a certain product testing result from a product tester 14 is reliable or not. If the testing result is considered as non-reliable, the analyzer 1502 then disregards that particular product testing result.

As another example, the analyzer 1502 may compare two product testing results from two different product testers 14. If the two product testing results indicate the same conclusion (e.g., pass or fail), then the analyzer 1502 may determine the product testing results as reliable. In such cases, the system 10 may simply report to the user that the particular task in question has a pass or fail status without informing the user the number of product testers 14 performed the testing.

In some cases, if there are three product testers 14 for a particular task, the analyzer 1502 may pick a result (e.g., pass or fail) that has the majority vote. For example, if two product testers 14 performing the task provide a "Yes" answer to the corresponding question, and the third product tester 14 provides a "No" answer, then the analyzer 1502 will pick the "Yes" answer and may determine that the testing of the task has a "pass" status. On the other hand, if two product testers 14 performing the task provide a "No" answer to the corresponding question, and the third product tester 14 provides a "Yes" answer, then the analyzer 1502 will pick the "No" answer and may determine that the testing of the task has a "fail" status.

Accordingly, it is advantageous to have three product testers 14 assigned for a product testing project, and to have only two mutually exclusive answers (e.g., "Yes" and "No") as possibilities for answering the corresponding product testing question. This is because such arrangement allows the analyzer 1502 to be able to decide on a final product testing result even if a product testing result from one product tester 14 contradicts another product testing result from another product tester 14. Also, assigning the same product testing project to multiple product testers 14 allows different results to be compared for detection of non-reliable result. However, in other embodiments, more or fewer than three product testers 14 may be assigned for a product testing project, as discussed, and the number of answers may be more than two. For example, in other embodiments, the answers may be in multiple choice formats with three or more choices.

In some embodiments, the system 10 may be configured to provide a user interface for allowing a user to override a product testing result. For example, the user interface providing the report 800/820/840 may also provide a control for allowing a user to change a product testing result. If a product testing result indicates that a particular task has a "pass" status, the user may utilize the control to change the status from "pass" to "failed". Alternatively, if a product testing result indicates that a particular task has a "failed" status, the user may utilize the control to change the status from "failed" to "pass".

It should be noted that the analyzer 1502 of the system 10 is not limited to comparing product testing results. In other embodiments, the analyzer 1502 may also perform other analyses to determine different user metrics associated with the product testers 14 and/or different testing metrics relating to the reliability of the test results. For example, in some embodiments, the analyzer 1502 may compare the images (which tracked the actions of the product testers 14) stored in the image database 1304 to determine whether the three images are similar or not. If all three product testers 14 perform the same action prescribed by the task of the product testing instruction, the graphics representing the movements of the cursors in the three images may have some similar features. For example, if the product testing task requires the product testers 14 to move the cursor to a link and click on the link, the graphics representing the movement of the cursors should all include one or more selection identifiers at the link. If one of the graphics indicate that there is no selection of the link, the analyzer 1502 may then determine that the product testing result by the corresponding product tester 14 is not reliable. This may be the case even if this product tester 14 provided the same "Yes" or "No" answer to reach the same conclusion as that of the other two product testers 14.

As another example, during a product testing, the testing monitoring module 1400 of the system 10 may gather some intelligence regarding the performance of the product testers 14. After the product testing is finished, the analyzer 1502 may then retrieve the information from the testing monitoring module 1400 and perform further analysis based on the information. For example, the testing monitoring module 1400 may determine an amount of time for each product tester 14 to perform a certain task. Thus, after the product tester 14 finishes the product testing project, the testing monitoring module 1400 will have multiple time values for different respective tasks prescribed in the product testing instruction and performed by that product tester 14. The testing monitoring module 1400 also does the same for the other two product testers 14. After all three product testers 14 have finished the product testing, the analyzer 1502 may then compare the three time values associated with the respective three product testers 14 for a given task, and determine if any of the product testing results for that task from the three product testers 14 is unreliable. For example, if a certain task takes a first product tester 14 to complete in 30 seconds, takes a second product tester 14 to complete in 37 seconds, and a third product tester 14 to complete in 4 seconds, then then analyzer 1502 may determine that the product testing result from the third product tester 14 is unreliable because the other two time values are closer to each other, and the third time value is different from both of the first two time values.

As a further example, when the system 10 provides the task for the product testers 14 to perform based on the pre-determined product testing instruction, the system 10 may insert one or more questions specifically designed to test the reliability of the product testers 14. For example, the system 10 may ask the product tester 14 a simple mathematical question, such as, "what is 14+6?" that is completely unrelated to the nature of the product being tested. If the product tester 14 is actively paying attention while performing the product testing, the product tester 14 is most likely to answer this question correctly. On the other hand, if the product tester 14 is not paying attention while performing the product testing, the product tester 14 may answer this question incorrectly, thereby indicating that the product testing result from this product tester 14 may be unreliable. This technique also has the benefit of detecting certain product tester 14 who may be careless, reckless, or who pretends to be performing the product testing.

Accordingly, in some embodiments, the testing monitoring module 1400 may be configured to compare an answer provided by the product tester 14 with an expected answer. If the answer provided by the product tester 14 matches the expected answer, then the testing monitoring module 1400 may determine that the product testing result by that product tester 14 is reliable. On the other hand, if the answer provided by the product tester 14 does not match the expected answer, then the testing monitoring module 1400 may determine that the product testing result by that product tester 14 is not reliable.

The testing monitoring module 1400 may also perform other functions to monitor a progress of the product testing. For example, the testing monitoring module 1400 may be configured to determine a percentage of the product testing completed, a duration spent by the product tester 14 on the product testing, a number of steps taken by the product tester 14, time wasted by the product tester 14, time lapsed before a link is clicked by the product tester 14, etc.

Figure 9:
FIG. 9 illustrates an example of a user interface for allowing a user to create tasks for product testing and to define product testing parameters.

As discussed, the user interface generator 1350 is configured to provide an interface for a user to generate tasks for product testing and to define product testing parameters. FIG. 9 illustrates an example of a user interface 900 for allowing a user to generate tasks for product testing and to define product testing parameters. The user may be associated with the first party 12 providing the product for product testing, and/or a person associated with the second party 16 providing the system 10. The user interface 900 may be generated and provided by the user interface generator 1350 in the system 10 in some embodiments. In one implementation, after the product provider (first party 12) has registered with the system 10, a user at the first party 12 may then log into the system 10 (e.g., using user ID and password). After the user has logged into the system 10, the user interface generator 1350 of the system 10 may then provide the user interface 900 for the user. In some cases, there may be multiple different product providers (different first parties 12) providing different products for product testing. In such cases, each of the parties 12 will have its own unique set of user ID and password.

As shown in the figure, the user interface 900 includes a section 902 for allowing a user to create product testing tasks 904 and corresponding product testing questions 906. Each product testing task 904 prescribes a product tester 14 to perform an action on the product being tested. Each corresponding question 906 asks the product tester 14 to confirm whether a certain event occurs or not based on the action performed by the product tester 14 in accordance with the assigned task. Accordingly, each of the product testing tasks 904 and each of the product testing questions 906 are designed by the user to test specific features in the product. The user may use the user interface 900 to add, delete, edit, and move task(s) 904 and question(s) 906.

The user interface 900 also includes a section 907 having a plurality of platform/browser icons 908 for selection by the user creating the product testing tasks. Each of the platform/browser icons 908 represents a type of platform or browser in which the web page is desired to be tested. If the user wants the web page to be tested under 34 different types of platform/browser, for example, the user can select the 34 corresponding platform/browser icons 908 to prescribe such testing parameters. By means of non-limiting examples, the platform/browser icons 908 may identify Google Chrome, different versions of Chrome, different versions of Mozilla Firefox, different versions of Microsoft Internet Explorer, different iOS for different versions of iPhone, different versions of Safari, different versions of Android mobile browsers, different versions of iPhone 6 mobile browsers, different versions of Microsoft Office, etc.

Furthermore, in some embodiments, the user interface 900 may allow the user to prescribe how to test an application on a mobile device (e.g., iPhone, iPad, tablet, etc.). For example, the user may prescribe that a product testing be performed on a certain type of mobile device by using the mobile device to launch a browser to go to a website. Alternatively, the user may prescribe that the product testing be performed using mobile-native-device (through an actual mobile device) or mobile-simulator (simulated mobile environment).

In some embodiments, the system 10 is configured to package each product testing under each selected platform/browser as one product testing project (job). Following the above example in which the user has selected 34 different types of platform/browser for testing the product, and assuming that each product testing project is desired to be performed by three product testers 14, the system 10 will then generate 3×34=102 product testing projects. These 102 product testing projects will then be notified to the product testers 14 based on the notification 1005 provided by the notification generator 1004.

Also, in some embodiments, the user designing the product testing instruction may group multiple related web pages under one product testing project. In other embodiments, the product being tested may have multiple web pages, and the user may divide the product into different features for different product testing projects.

In some embodiments, after the user has created the product testing tasks and product testing parameters using the user interface 900, the user may save these information to generate a product testing instruction file. The product testing instruction file may be saved in a non-transitory medium (e.g., the product testing instruction database 1600) at the system 10. When the user determines that the product is ready for product testing, the system 10 is notified, and the notification generator 1004 of the system 10 then provides the notification 1005 to inform the product testers 14 that the product testing project is available, as discussed. When a product tester 14 has accepted the product testing project, the testing interface generator 1100 of the system 10 then provides a testing interface, along with the tasks and questions defined in the product testing instruction (stored in the database 1600) for the product tester 14 to conduct the product testing. Also, as discussed, in some embodiments, the system 10 may insert one or more questions into the product testing instruction specifically designed to test the reliability of the product testers 14. For example, the system 10 may ask the product tester 14 a simple mathematical question, such as, "what is 14+6?" that is completely unrelated to the nature of the product being tested, and that is designed to determine reliability of the product testing result.

Figure 10B:
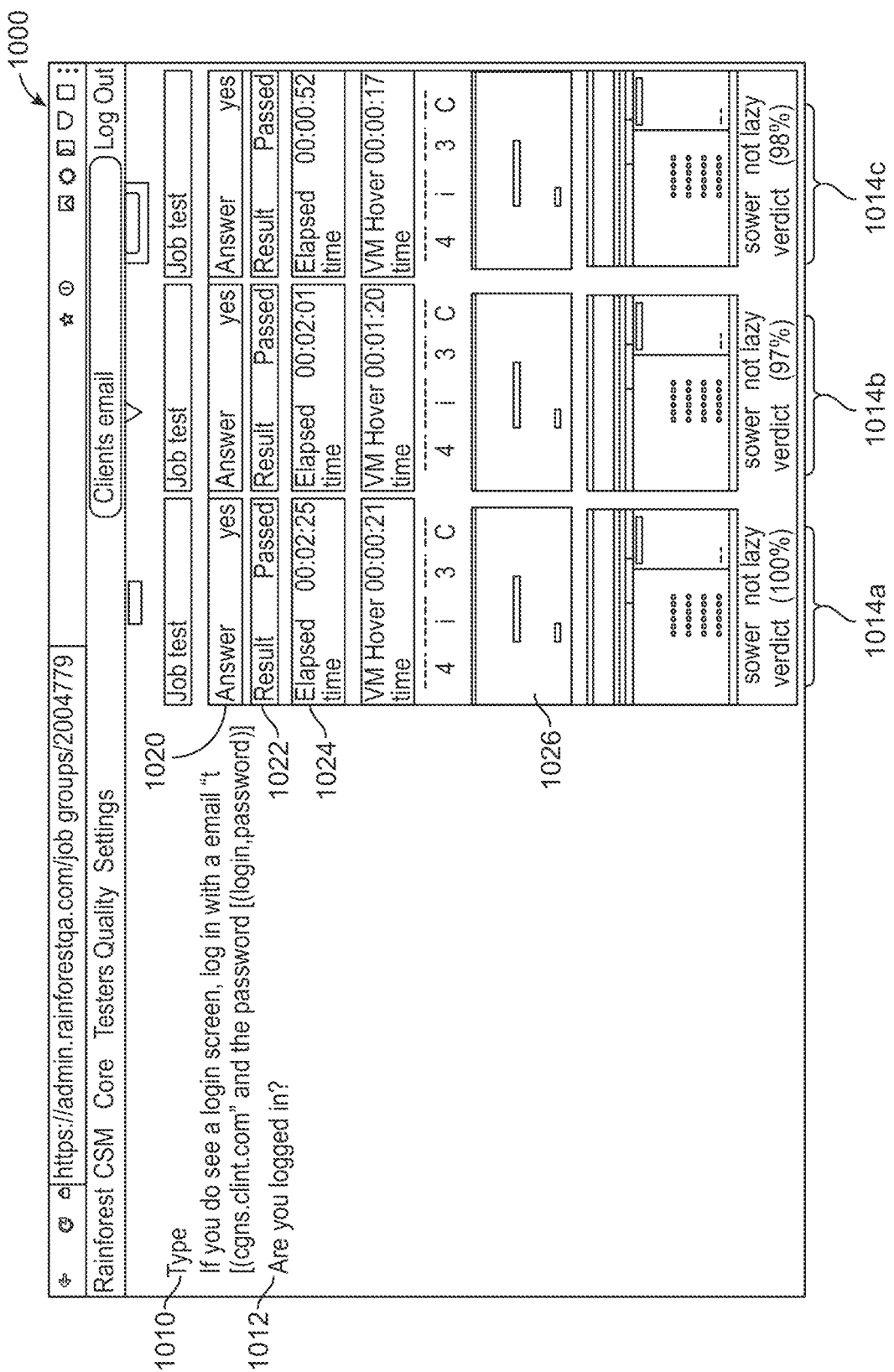
Figure 10C:
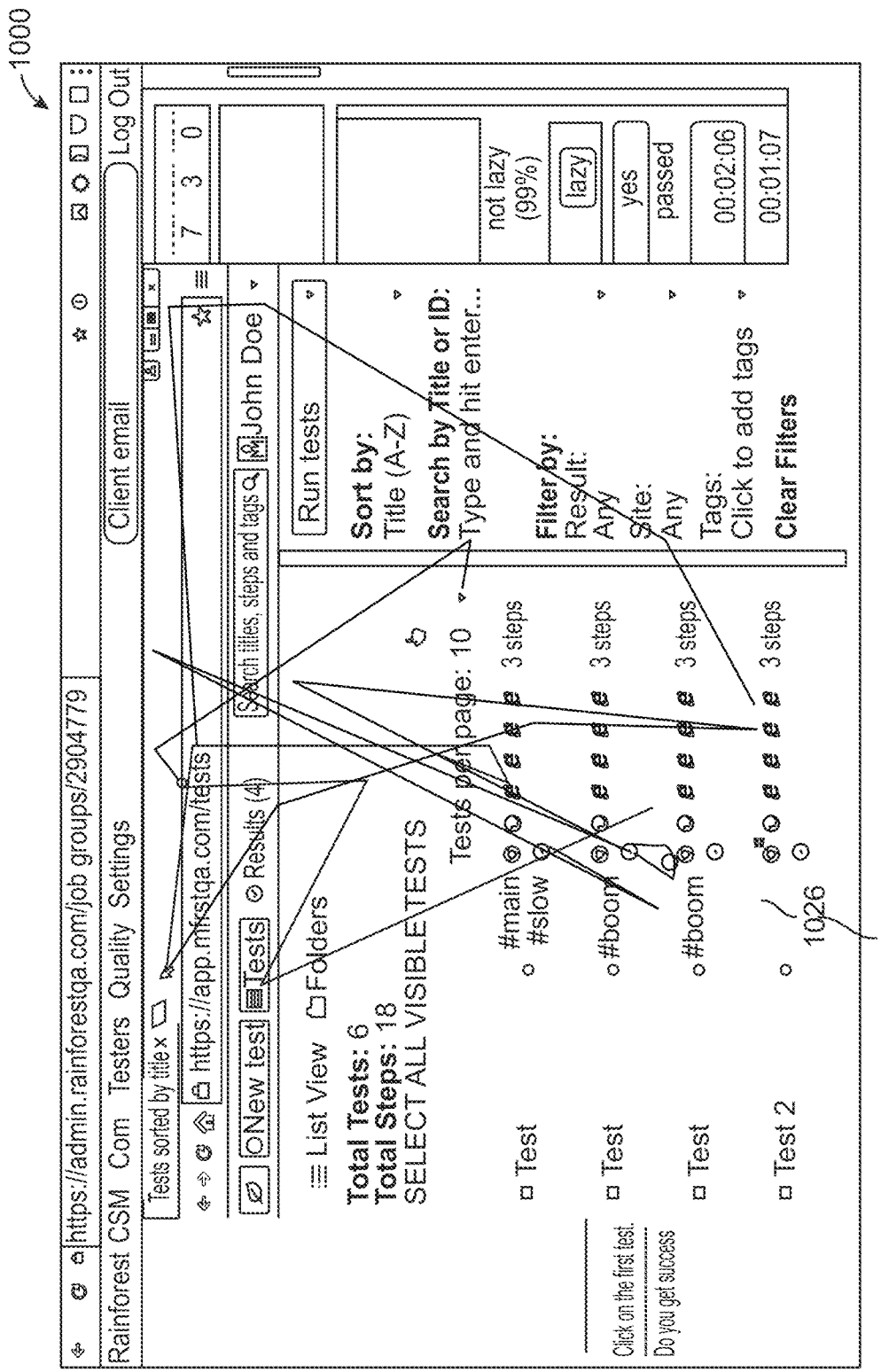
Figure 10D:
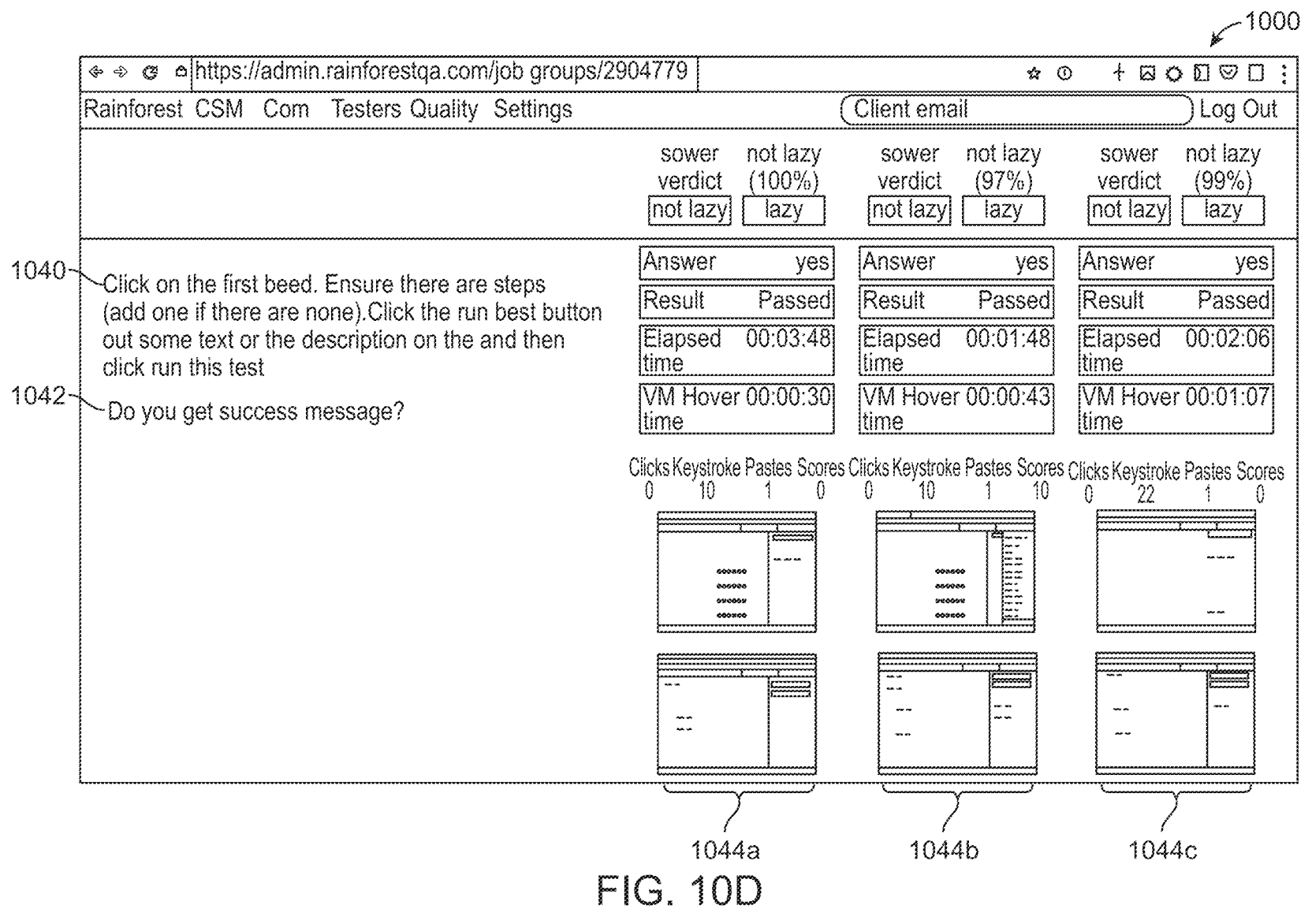
Figure 10E:
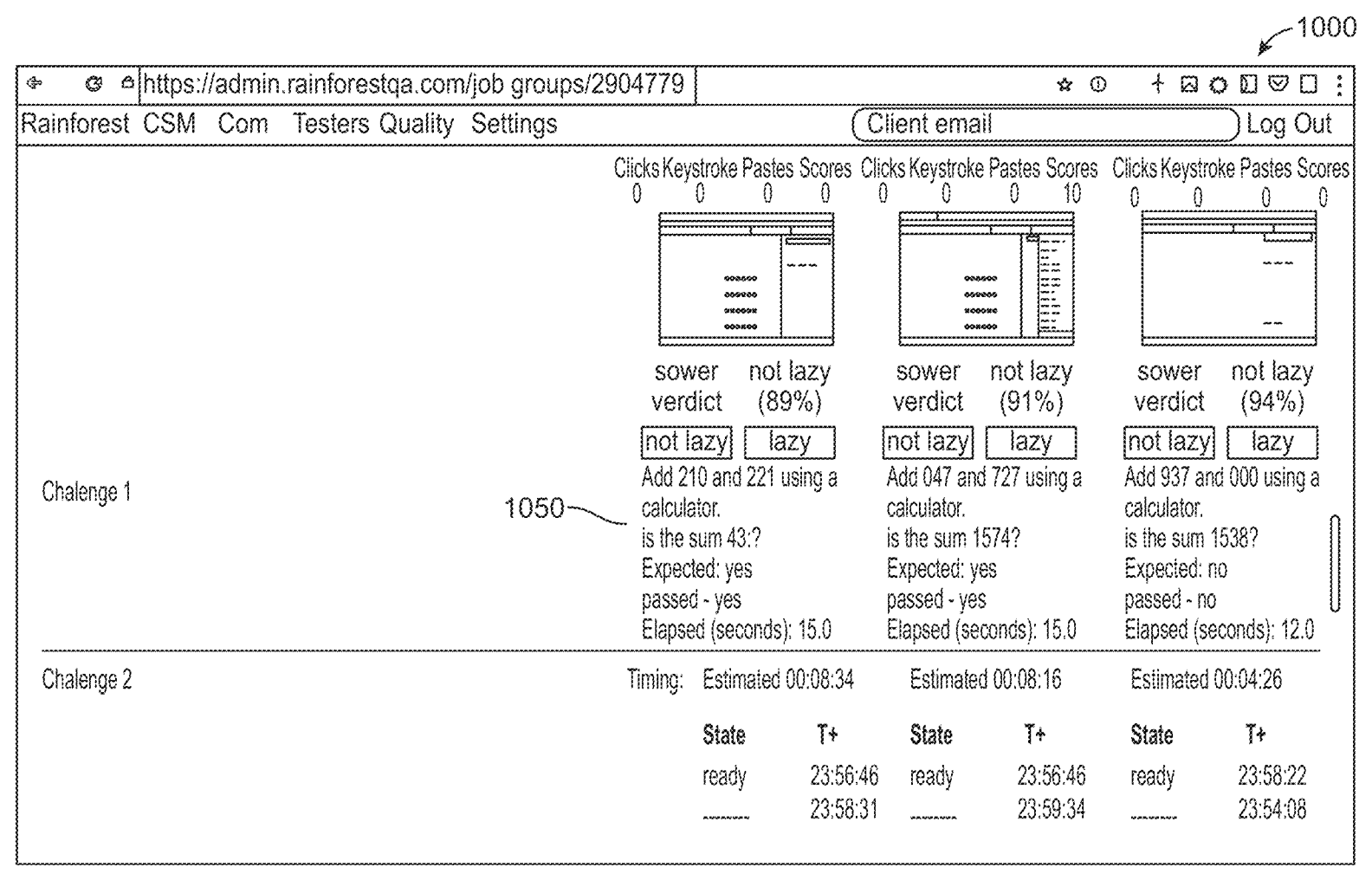

In some embodiments, the system 10 may be configured to provide an administrative product testing report for use by personnel at the second party 16. Such report provides a user at the second party 16 a detailed view of all of the tasks in a product testing. The report may be generated using the test result retrieval module 1500 (which gathers and compiled all of the relevant information), and provided to the user via an user interface generated by the user interface generator 1350. FIGS. 10A-10E illustrate an example of a report 1000 that is for viewing by a user at the second party 16. The report 1000 includes data 1002 regarding the product testing performed, including name of client (product provider), product testing identification, type of platform/browser in which the product testing was conducted, etc. The report 1000 also includes the identifications 1004a-1004c of three product testers 14 who performed the product testing. The report 1000 also includes a summary of the product testing organized by tasks. For example, as shown in FIG. 10B, the report 1000 includes a section that provides the product testing task 1010 and its corresponding product testing question 1012. The report 1000 also includes respective results 1014a-1014c associated with the respective product testers 14. Each result 1014 indicates the product tester's 14 answer 1020 to the product testing question, a pass/fail indicator 1022 indicating whether the performance of the task passes or not, a time value 1024 indicating an amount of time it took for the product tester 14 to complete the task 1010, and an image 1026 that tracked the action of the product tester 14 while performing the task 1010. The image 1026 may be generated by the graphic generator 1302 as similarly discussed previously. In some cases, the user may click on the image 1026, and the system 10 may then provide a more detailed view of the image 1026 (FIG. 10C). The image 1026 includes a graphic that indicates the action of the product tester 14 performed during the product testing, as similarly discussed. As shown in FIG. 10D, the report 1000 may also include respective results 1044a-1044c associated with the respective product testers for a different task 1040, which has a corresponding product testing question 1042. Furthermore, as shown in FIG. 10E, the report 1000 may also include the inserted questions 1050 for the respective product testers 14 that tested the reliability of the product testing results.

As discussed, in some embodiments, the system 10 may be configured to provide a user interface for allowing a user to override a product testing result. For example, the user interface providing the report 1000 may also provide a control for allowing a user (e.g., an administrator, or a personnel associated with the second party 16, etc.) to change a product testing result. If a product testing result indicates that a particular task has a "pass" status, the user may utilize the control to change the status from "pass" to "failed". Alternatively, if a product testing result indicates that a particular task has a "failed" status, the user may utilize the control to change the status from "failed" to "pass".

The system 10 of FIG. 1B will now be described in further detail. The system 10 includes one or more input(s) 1002 for receiving a product testing request, information about the product, and product testing instruction. The system 10 also includes a notification generator 1004 configured to generate a notification 1005 to inform a plurality of product testers 14 that a product is available for product testing. As discussed, in some embodiments, the product is associated with the first party 12 developing the product, and the notification generator 1004 is associated with the second party 16 that is not the same as the first party 12.

In some embodiments, the notification 1005 is for display in a web browser. For example, the product tester 14 may open a web browser on his/her device. The web browser may include an add-on feature, which allows the product tester 14 to receive the notification 1005 from the system 10. In other embodiments, the notification 1005 may be for display in a field created by a product testing notification application. For example, the product tester 14 may install a product testing notification application onto his/her device, which allows the product tester 14 to receive the notification 1005 from the system 10.

In further embodiments, the notification may be transmitted to crowdflower or a mechanical turk.

The system 10 also includes a communication interface 1008 configured to receive an electronic reply 1010 from a device 1020 being used by a first product tester 14 of the plurality of product testers, the reply 1010 indicating that the first product tester 14 will perform the product testing. In some embodiments, the communication interface 1008 and the one or more input(s) 1002 may be integrated.

In some cases, the electronic reply 1010 may be generated using a web browser utilized by the product tester 14. For example, as similarly discussed, the web browser on a device utilized by the product tester 14 may include an add-on feature, which allows the product tester 14 to receive the notification from the system 10. The same add-on feature may also allow the product tester 14 to provide his/her reply (for reception by the system 10) to accept or to sign up for a product testing project.

In other cases, the electronic reply 1010 may be generated using a product testing notification application utilized by the product tester 14. For example, as also similarly discussed, the product tester 14 may install a product testing notification application onto his/her device, which allows the product tester 14 to receive the notification from the system 10. The same product testing notification application may also allow the product tester 14 to provide his/her reply (for reception by the system 10) to accept or to sign up for a product testing project.

As similarly discussed, in other embodiments, the electronic reply may be generated by a device that is using crowdflower or a mechanical turk.

In some embodiments, the system 10 may also include a reply counter 1040 configured to keep track with a number of replies 1010, and a comparator 1042 configured to compare the number of replies 1010 with a prescribed number. In some embodiments, the communication interface 1008 is configured to receive one or more additional electronic replies from one or more additional product testers 14 from the plurality of product testers 14 until a prescribed number of electronic replies has been reached. In response to each reply received by the communication interface 1008, the reply counter 1040 will increment by one. The communication interface 1008 continues to receive additional reply until the total number of replies is equal to the prescribed number of electronic replies, as determined by the comparator 1042. In the illustrated embodiment, the prescribed number of replies is one reply. In other embodiments, the prescribed number of replies may be more than one. For example, in some embodiments, the prescribed number of electronic replies may be three, four, five, six, or seven. In other embodiments, the prescribed number of electronic replies may two. In further embodiments, the prescribed number of electronic replies may be more than seven.

In some embodiments, the system 10 may further include a filter 1050 configured to select the plurality of product testers 14 from a list of available product testers 14 for providing the notification. For example, by means of non-limiting examples, the filter 1050 may be configured to select the plurality of product testers based at least in part on respective scores of the plurality of product testers, respective ages of the plurality of product testers, respective language skills of the plurality of product testers, respective locations of the plurality of product testers, respective age groups of the plurality of product testers, respective industry expertise of the plurality of product testers, or any combination of the foregoing. Also, in one example, if a product is desired to be tested by individuals who can read Italian, the filter 1050 may then perform filtering to obtain a list of all product testers 14 who can read Italian. In such cases, the notification 1005 may be provided by the notification generator to only the product testers 14 who can read Italian.

The system 10 further includes a testing interface generator 1100 configured to generate a testing interface for use in a testing environment. The testing interface may be the testing interface described with reference to FIG. 4.

In other embodiments, the testing interface may have other configurations. As similarly discussed, the testing interface is configured to present features of the product and product testing instruction for allowing the first product tester 14 to perform the product testing on the product based on the product testing instruction. The product testing instruction in the testing interface is configured to provide a plurality of tasks for testing the product. For example, the product testing instruction may prescribe one or more actions be performed by the product tester 14 on a web page being tested. In some embodiments, the testing interface is configured for display on a hand-held device (e.g., an iPhone, iPad, iPad mini, tablet, etc.). In other embodiments, the testing interface is configured for display on a computer screen or a laptop screen.

In some embodiments, the product testing instruction may be created by a user through an user interface provided by the user interface generator 1350. The user creating the product testing instruction may be associated with the first party 12 providing the product for testing, or may be associated with the second party 16. The user interface allows the user to create multiple product testing tasks, and multiple corresponding product testing questions, to test a product. In some cases, the product includes a web page, and the user interface allows the user to select one or more platforms/browsers in which to test the web page. The product testing instruction may be stored in the product testing instruction database 1600.

In some embodiments, the user interface generator 1350 may be configured to provide a first product tester 14 access to a testing environment for allowing the first product tester 14 to perform product testing on a product based on the product testing instruction. The user interface generator 1350 may also be configured to provide a second product tester 14 access to another testing environment for allowing the second product tester 14 to perform another product testing on the same product based on the same product testing instruction. In one implementation, the user interface generator 1350 may provide different virtual environments for different respective product testers 14. Accordingly, different product testers 14 may perform the product testing on different respective virtual machines that provide the testing interfaces for testing the product.

Also, in some embodiments, the testing interface is configured to present an image of a web page (e.g., a web page being tested), and the product testing instruction is configured to instruct the first product tester 14 to perform an action on the image of the web page being tested. The testing interface may further be configured to present a question for the first product tester 14 to answer after the action has been performed based on the product testing instruction. The system 10 may further include a non-transitory medium for storing the product tester's answer to the question in a test result file.

In some embodiments, the system 10 also includes a timer 1200 that keeps track of the duration that has lapsed since the testing interface 402 was provided to the product tester 14. The system 10 also includes a time-comparator 1202, which compares the lapsed time with a prescribed threshold. If the lapsed time has exceeded the prescribed threshold and the product testing is not completed by the product tester 14, then the system 10 will revoke the product testing project from the product tester 14. For example, the system 10 may terminate the product testing session being used by the product tester 14. In some embodiments, in response to the revoked product testing project from the product tester 14, the system 10 will update the reply counter 1040 (e.g., by subtracting the total count by one) to indicate that a slot for the product testing project is available (due to the product testing project being released back to the pool of product testers 14 for acceptance). If another product tester 14 submits a reply to take the slot for the product testing project, the product testing project (which was not completed by the previous product tester 14) is then assigned to this other product tester 14.

As shown in FIG. 1B, the system 10 also includes a tracker 1300 configured to track an interaction of the first product tester 14 with the product. In some embodiments, the product may be a web page, and the tracker 1300 is configured to track an interaction of the first product tester 14 with an image of the web page.

Also, in some embodiments, the tracker 1300 is configured to track a movement of a cursor operated by the first product tester 14. For example, the first product tester 14 may be using his/her device (e.g., laptop, desktop, handheld device, such as a cell phone, etc.) to perform the product testing. In such cases, the tracker 1300 is configured to track a position of the cursor in the product tester's device as operated by the first product tester 14. In some cases, if the product tester 14 is using a cell phone with a touchscreen to perform the product testing, the tracker 1300 may be configured to track a position of the finger position as applied on the touchscreen. Thus, as used in this specification, the term "cursor" is not limited to a displayed item operated using a touchpad, a mouse, or a knob, and the term "cursor" may also include non-displayed item that is associated with a movement of a finger as applied on a touchscreen.

Also, in some embodiments, the tracker 1300 is configured to track a selection of a tab, recording a selection of a button, recording a selection of an icon, recording a typed text, or any combination of the foregoing, performed by the first product tester 14.

The system 10 further includes a graphic generator 1302 configured to generate a graphic representing the tracked movement by the tracker 1300. In some embodiments, the graphic comprises a line traversing a plurality of cursor positions. In some embodiments, the graphic may also comprises a selection identifier identifying a position in the image of the web page at which the first product tester 14 performed a selection.

The system 10 may also include an image database 1304 configured to store an electronic image in a non-transitory medium, the electronic image comprising the image of the web page and the graphic superimposed with the image of the web page. In some embodiments, the image database 1304 is configured to store the electronic image in association with an identity of the first product tester 14 and in association with the product being tested. The image database 1304 may be one or more non-transitory medium located at a same facility or at different facilities.

Alternatively or additionally, the system 10 may further include a video generator 1310 configured to generate a video of the tracked interaction. In some embodiments, the video may show a movement of a cursor as operated by the product tester 14 while testing a web page. The video may also show a selection of an object in the web page by the product tester 14. In one implementation, the video may be a recording of screenshots over time to show an interaction of the product tester 14 with the web page being tested. In other embodiments, the video may contain images of a processor-generated graphic (tracking an interaction of the product tester 14) superimposed with image(s) of the web page being tested. For example, the graphic may be a "growing" line that follows a position of a cursor, thereby representing cursor positions over time. In some embodiments, the video may also show a selection identifier identifying a position in the image of the web page at which the first product tester 14 performed a selection (e.g., a clicking operation). For example, the graphic may include an identifier (e.g., a circle) placed on the "growing line" wherever the product tester 14 performs a clicking operation.

In some embodiments, the system 10 may also include a video database 1314 configured to store the video in a non-transitory medium. In some embodiments, the video database 1314 is configured to store the video in association with an identity of the first product tester 14 and in association with the product being tested. The image database 1314 may be one or more non-transitory medium located at a same facility or at different facilities.

As shown in FIG. 1B, the system 10 also includes a testing monitoring module 1400 configured to monitor a progress of the product testing. By means of non-limiting examples, the testing monitoring module 1400 is configured to determine a percentage of the product testing completed, a duration spent by the first product tester, a number of steps taken by the first product tester, time wasted by the first product tester, time lapsed before a first link is clicked by the first product tester, etc.

The system 10 further includes a test result retrieval module 1500 configured to obtain a first testing result achieved by the first product tester 14 completing the product testing. The test result retrieval module 1500 is also configured to obtain additional testing result(s) from one or more additional product tester(s) 14. For example, the test result retrieval module 1500 may be configured to also obtain a second testing result achieved by the second product tester 14 completing the product testing. The system 10 further includes an analyzer 1502 configured to analyze the first testing result and the second testing result to determine whether the first testing result, the second testing result, or both of the first testing result and the second testing result, are reliable or not.

In some embodiments, the analyzer 1502 may also be configured to use other information obtained by the testing monitoring module 1400, to determine whether one or more of the product testing results are reliable or not.

The test result retrieval module 1500 may be configured to generate one or more product testing reports, such as those shown in FIGS. 8A-8C and FIGS. 10A-10E. The product testing reports may be provided to one or more users through one or more user interface(s) provided by the user interface generator 1350. For example, one or more reports may be provided to a user associated with the first party 12 providing the product being tested. As another example, one or more reports may be provided to an administrator or another user associated with the second party 16.

Although the system 10 has been described with reference to connecting a product tester 14 with a certain product testing project to test a certain product created by a party 12, in other embodiments, the system 10 may connect multiple product testers 14 to a certain product testing project. In one implementation, the testing interface module is configured to provide multiple instances of the testing interface to multiple product testers 14. For example, the testing interface (e.g., an instance of it) may provide the features of the product and the product testing instruction for allowing a second product tester 14 to perform the product testing on the product based on the product testing instruction. Also, in some embodiments, the system 10 may be configured to provide multiple instances of virtual testing environment for multiple product testers 14 to perform product testing.

In addition, in other embodiments, the system 10 may connect multiple product testers 14 to multiple product testing projects to test different products created by different parties 12.

It should be noted that the system 10 may be implemented using a single device, or using a plurality of devices. For example, the entire system 10 may be implemented on a server in some embodiments. In other embodiments, different components of the system 10 may be implemented on different machines, or on different sets of machines. For example, in some embodiments, the input(s) 1002, the notification generator 1004, the communication interface 1008, the reply counter 1040, the comparator 1042, and the filter 1050 may be implemented using a first set of one or more devices, the testing interface generator 1100 may be implemented using a second set of one or more devices, the tracker 1300, the graphic generator 1302, and the video generator 1310 may be implemented using a third set of one or more devices, the testing monitoring module 1400 may be implemented using a fourth set of one or more devices, and the test result retrieval module 1500 and the analyzer 1502 may be implemented using a fifth set of one or more devices. A device may be a processor, a computer, a server, a database, etc.

Although the above embodiments have been described with reference to testing a product that is a web page or a web site, in other embodiments, the system and method described herein may be applied to test other products. By means of non-limiting examples, the product may be any software, any hardware, any physical device, or any computer modeling.

Also, in some embodiments, a component in the system 10 may be partially or completely implemented at a product tester's 14 device or at a device used by the first party 12 (e.g., a computer at the provider of the product being tested). For example, in some embodiments, all or a part of the testing interface generator 1100 may be implemented at a product tester's 14 device. In one implementation, a product tester may install an application provided by the second party 16 onto a device (e.g., a laptop, a desktop computer, a handheld device, etc.) of the product tester 14, which allows the device to display a testing interface in response to the product tester 14 accepting a product testing project. The same application may also be installed by multiple product testers 14.

Similarly, all or a part of the tracker 1300, all or a part of the graphic generator 1302, and/or all or a part of the video generator 1310 may be implemented at a product tester's 14 device. In one implementation, a product tester may install an application provided by the second party 16 onto a device (e.g., a laptop, a desktop computer, a handheld device, etc.) of the product tester 14, which allows the device to track an action of the product tester 14 as the product tester 14 is using the device to perform the product testing, and to generate images and/or videos capturing the action of the product tester 14. The same application may also be installed by multiple product testers 14.

As another example, all or a part of the user interface generator 1350 may be implemented at a product provider's (first party's 12) device. In one implementation, a product provider may install an application provided by the second party 16 onto a device (e.g., a laptop, a desktop computer, a handheld device, etc.) of the product provider, which allows the product provider to use its device to create product testing instruction, select product testing parameters, and provide information regarding the product that is desired to be tested. The application also allows the device at the product provider to view product testing results transmitted by the system 10. The same application may also be installed by multiple product providers 12.

Accordingly, the system 10 described herein is not limited to one or more devices associated with the second party 16, and may include one or more devices being used by the product testers 14, and/or one or more devices being used by users at the product provider (the first party 12).

Furthermore, in some embodiments, any of the components of the system 10 may be implemented using hardware, software, or a combination of hardware and software. For example, each of the items below may be implemented using a hardware, software, or a combination of both: the one or more input(s) 1002, the notification generator 1004, the communication interface 1008, the reply counter 1040, the comparator 1042, the filter 1050, the product tester management module 1080, the testing interface generator 1100, the timer 1200, the time-comparator 1202, the tracker 1300, the graphic generator 1302, the video generator 1310, the user interface generator 1350, the testing monitoring module 1400, the test result retrieval module 1500, the analyzer 1502.

Also, in some embodiments, a processor-readable medium including a set of instructions for providing one or more features described herein is provided. The instructions in the processor-readable medium, when executed by a processing unit, will cause a method for providing a product testing to be performed. The instructions may include: instruction for providing a notification to inform a plurality of product testers that a product is available for product testing, wherein the product is associated with a first party and the notification generator is associated with a second party that is not the same as the first party; instruction for receiving an electronic reply from a device being used by a first product tester of the plurality of product testers through a network, the reply indicating that the first product tester will perform the product testing; instruction for updating a reply count in response to the received electronic reply; and instruction for, in response to the electronic reply, providing a testing environment that comprises a testing interface for the first product tester, the testing interface presenting features of the product and the product testing instruction for allowing the first product tester to perform the product testing on the product based on the product testing instruction, the product testing instruction providing a plurality of tasks for testing the product.

As illustrated in the above embodiments and examples, the system 10 and the method 200 described herein are advantageous because they allow a product to be tested efficiently under multiple different testing parameters. For example, a software application may be tested under 10 different platforms by multiple product testers 14. Because the product testing may be performed by multiple product testers 14 in parallel, the user at the product provider can obtain product testing results very quickly. Also, because multiple product testers 14 can be assigned to perform each product testing (e.g., testing an application under a certain platform), the product test result being provided to the product provider can be very accurate and reliable. More importantly, the above benefits are provided for the product provider without the need for the product provider searching for qualified product testers. Accordingly, embodiments and features of the system 10 and the method 200 described herein have practical and real world utility, and they create tangible and concrete results that significantly improve the way product testing is performed.

Machine-Based Product Testing Performed by Product Testing Device

Figure 11:
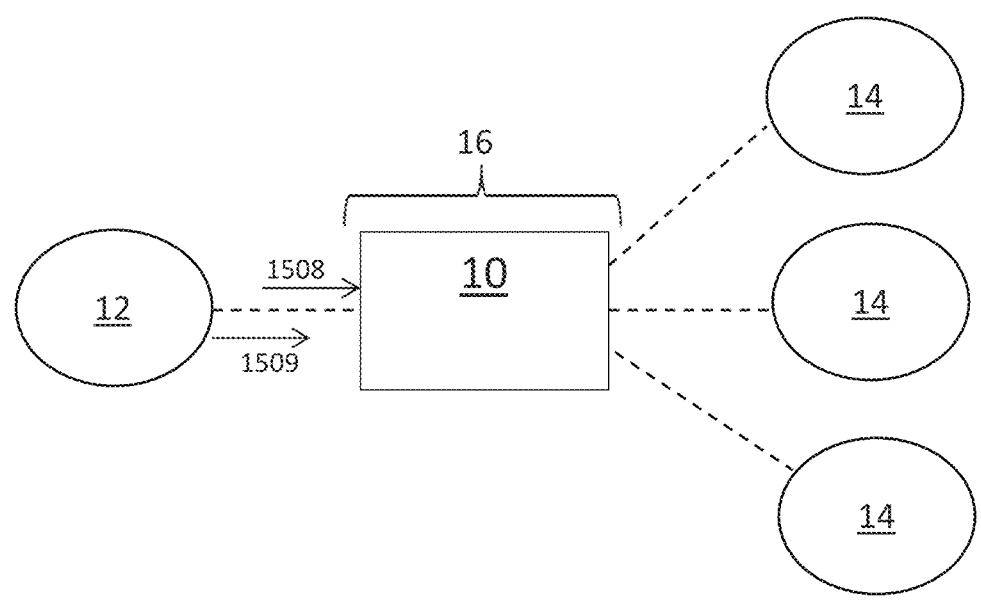
FIG. 11 illustrates a system for providing product testing.

As described in the above embodiments, the system 10 is configured to obtain a product from the party 12, and provide testing interface for allowing one or more tester(s) 14 to perform product testing on the product. In some embodiments, the system 10 may be configured to perform product testing on one or more additional product(s) without requiring any human tester 14. FIG. 11 illustrates an example of such scenario. As shown in the figure, the party 12 provides a product 1508 for product testing, and the system 10 provides testing interface for allowing one or more product testers 14 to perform product testing on the product 1508. In the illustrated example, the product being tested comprises software. Subsequent to the product testing performed by the tester(s) 14, the party 12 may update the product to create a new version of the product. The party 12 may then send the updated product (e.g., new product) 1509 to the system 10 for product testing. In some embodiments, in response to receiving a request for product testing from the party 12 to perform testing on the updated product 1509, the system may create notification 1005 to initiate another round of product testing by one or more tester(s) 14, as similarly discussed.

Alternatively, in other embodiments, instead of having one or more human tester(s) 14 performing product testing on the updated product 1509, the system 10 itself may perform product testing on behalf of a human tester 14.

In one implementation, the system 10 may utilize the tracked information obtained by the tracker 1300 to perform testing of the new product 1509. The system 10 may re-execute the tracked actions of previous human tester 14 to test the new product 1509. Accordingly, while the earlier product 1508 may be tested by human tester(s) 14, a later product 1509 may be tested by the system 10. In other words, an earlier product testing (e.g., first product testing) may be human-based, and a later product testing (e.g., a second product testing) may be machine-based.

Figure 12:
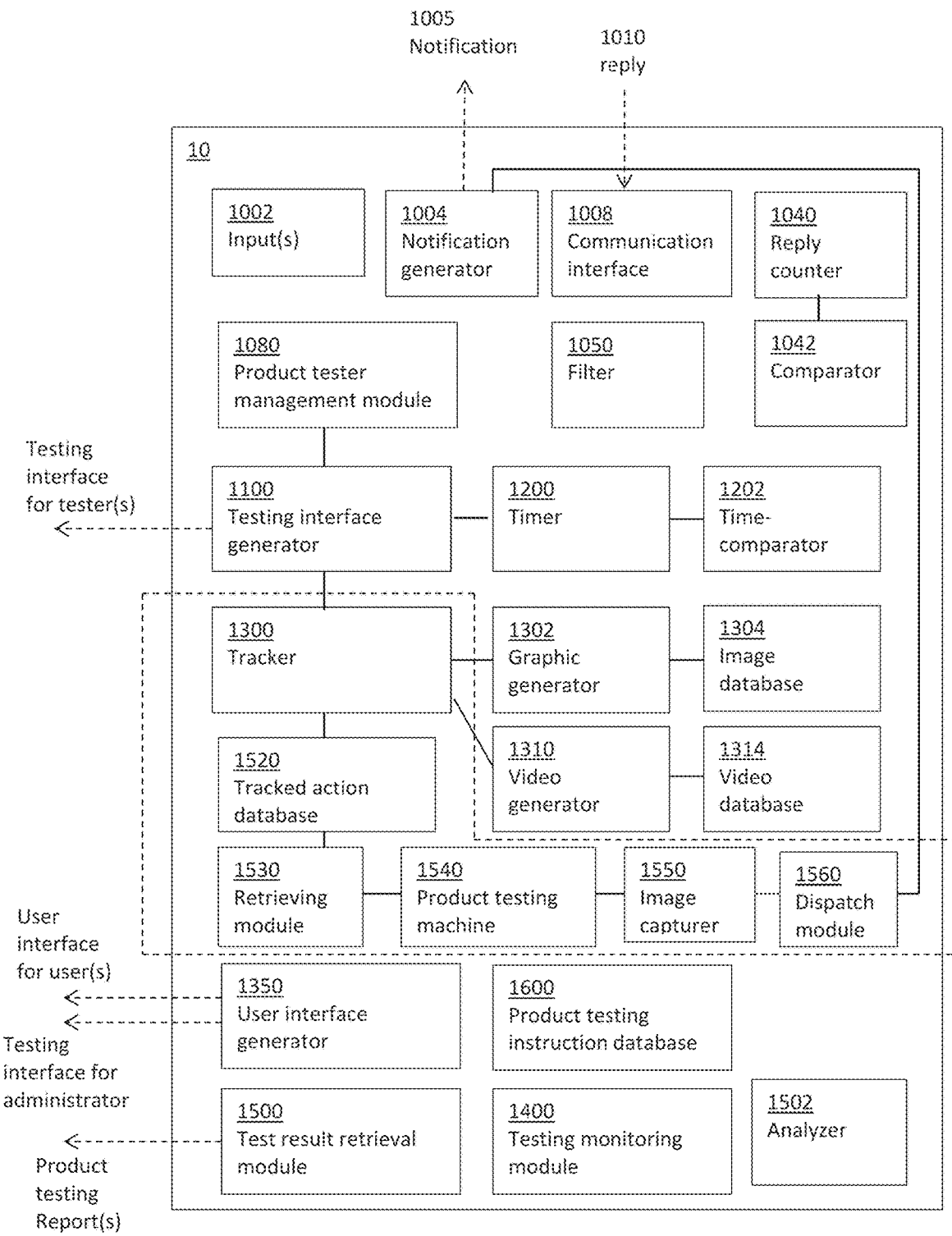
FIG. 12 illustrates an example of the system of FIG. 11.

FIG. 12 illustrates a system 10 for providing product testing, wherein the system 10 includes additional features for allowing machine-testing of products. The system 10 is the same as the system 10 of FIG. 1B, except that the system 10 also includes a non-transitory medium 1520 (e.g., a tracked action database) for storing data based on a testing of a first product, a retrieving module 130, and a product testing machine 1540. The data stored in the non-transitory medium 1520 may be data regarding one or more tracked actions of tester(s) 14 performed while testing the first product 1508. The retrieving module 1530 is configured to access an electronic file containing the data (generated based on the testing of the first product 1508) from the non-transitory medium 1520. The product testing machine 1540 is configured to perform machine-testing for the second product 1509 based on the data in the electronic file. The second product 1509 may include one or more features that are different from the first product 1508.

As shown in the figure, the non-transitory medium 1520 is coupled to the tracker 1300. As similarly discussed, the tracker 1300 is configured to track an interaction of a tester with a testing interface (e.g., testing interface 402) that presents features of a product being tested. The tracker 1300 is configured to provide data (representing tracked actions of testers 14) for storage in the non-transitory medium 1520 in a form of an electronic file, wherein the data is based on the tracked interaction of the testers 14. The tracker 1300 may be configured to track a movement of a cursor operated by the tester 14. Additionally, or alternatively, the tracker 1300 may be configured to track a selection of a tab, a selection of a button, a selection of an icon, a selection of a text, or any combination of the foregoing. The tracker 1300 may also track a movement of a finger swipe, or a simulated finger swipe.

The non-transitory medium 1520 is configured to store the electronic file in association with an identity of the first product 1508. For example, the electronic file may include information regarding tracked action(s) of a tester 14 that was performed to test a feature of the first product 1508, and such electronic file is stored in the non-transitory medium 1520 in association with the identity of the first product 1508. The non-transitory medium may also store one or more additional electronic files that are associated with the identity of the first product 1508. For example, the additional electronic file may include information regarding tracked action(s) of another tester 14 that was performed to test the same feature of the same first product 1508.

In some cases, if there are multiple electronic files in the non-transitory medium 1520 that are associated with the same tested product, the retrieving module 1530 may then be configured to select one of the electronic file for use by the product testing machine 1540. For example, there may be a first electronic file having data regarding tracked actions of a first tester 14 who performed product testing on a product, and a second electronic file having data regarding tracked actions of a second tester 14 who performed product testing on the same product. In such cases, the retrieving module 1530 may be configured to select one of the electronic files in the non-transitory medium 1520 having a latest time stamp for use by the product testing machine 1540.

In some embodiments, the data in the electronic file may include information regarding tracked actions of a tester 14, and respective time stamps of the tracked actions. The product testing machine 1540 is configured to re-execute the tracked actions for performing the testing of the second product based on the information in the electronic file regarding the tracked actions of the tester 14. The time stamps allow the product testing machine 1540 to know the order of the actions to re-execute. In some embodiments, the product testing machine 1540 may be configured to re-execute the tracked actions according to the same timing of the time stamps. In other embodiments, the product testing machine 1540 may re-execute one or more of the tracked actions at timing that is different from those represented by the time stamps.

In some embodiments, the data in the electronic file are based on tracked action(s) performed using a cursor and/or a keyboard. For example, the data in the electronic file may comprise: cursor positions; a text typed by a tester; a location of the text typed by the tester, a location of an object selection; or any combination of the foregoing. The data in the electronic file may also be based on action(s) performed using a touchpad or touch screen. The tracked action(s) in the electronic file may be actions performed by a tester 14 while performing a prescribed task to test a feature of the first product 1508. If the product testing of the first product 1508 involves multiple tasks, the electronic file may include multiple sets of tracked actions for the respective tasks. Alternatively, the non-transitory medium 1520 may store multiple electronic files for respective tasks to test the first product 1508. For example, a first electronic file may contain data regarding tracked action(s) of a tester who tested a first feature of the product, and a second electronic file may contain data regarding tracked action(s) of the tester who tested a second feature of the product. In such cases, the first electronic file may be considered a first sub-file, and the second electronic file may be considered a second sub-file, wherein the first sub-file and the second sub-file are parts of a super-file that is associated with the testing of the product.

Thus, as used in this specification, the term "file" may be a single file, a sub-file that is a part of a super-file, multiple sub-files, multiple files that are associated with each other, or a folder that contains multiple files or sub-files.

In some cases, the data in an electronic file stored in the non-transitory medium 1520 may have the following data structure, or may be based on data having the following data structure: (Action type; details of tracked action). The following are some examples of action type and details of tracked action:

| Action type | Details of tracked action |
| --- | --- |
| Cursor movement | (X1, Y1), (X2, Y2) |
| Object selection | (X1, Y1) |
| Text/key typing | (X1, Y1), Text/Key |
| Finger/simulated swipe | Swipe trajectory |

In the above examples, if a tracked action concerns cursor movement, then the associated detail of the tracked action may be a beginning position (X1, Y1) of the cursor, and an ending position (X2, Y2) of the cursor. If the tracked action concerns object selection, then the associated detail of the tracked action may be a location (X1, Y1) of the object that was selected. If the tracked action concerns text/key typing, then the associated detail of the tracked action may be a location (X1, Y1) of the text/key being typed, and the text/key being typed. If the tracked action concerns a finger/simulated swiping, then the associated detail of the tracked action may be a trajectory of the swiping. By means of non-limiting examples, the trajectory of the swiping may be a horizontal swipe, a vertical swipe, a diagonal swipe, a circular swipe, or any of other user-created swiping patterns.

In some embodiments, the electronic file retrieved by the retrieving module 1530 may comprise a script. The script may be generated by a script generator using data regarding tracked action(s) of a tester 14. For example, if the data regarding tracked action is "Text/key typing, (225, 850), Blue", the script generated based on such data may be a command or instruction prescribing that the text "Blue" be typed at the coordinate (225, 850) at a testing interface (e.g., testing interface 402) that is configured to test the product. The product testing machine 1540 is configured to run the script (which includes data based on tracked action(s) of a tester 14 while testing the first product 1508) for testing the second product 1509. The script generator may be a part of the system 10. In some cases, the script generator may be a part of the product testing machine 1540. In such cases, the product testing machine 1540 is configured to access an electronic file in the non-transitory medium 1520 that contains data representing tracked actions of a tester 14. The script generator in the product testing machine 1540 then generates a script based on the data representing the tracked actions, and the product testing machine 1540 then runs the script to perform machine-testing of the second product 1509. In other embodiments, the script generator may be implemented in the retrieving module 1530 and/or in the tracker 1300. The script generator will be described in further detail below with reference to FIG. 22, which illustrates an apparatus 2200 that may be used to implement the script generator.

In some embodiments, the script generator may be configured to consider the testing performed by multiple testers 14 (as opposed to just selecting data based on one tester 14). In particular, the script generator may be configured to examine the tracked actions from multiple testers 14, which were performed to test the same feature of the same product, and extract the commonalities to create the script. For example, when interacting with a product to test a feature of the product, a first tester 14 may perform action A, and then may wait 30 seconds before performing action B. On the other hand, a second tester 14 may perform action A, and may then 5 seconds before performing action B to accomplish the same task to test the same feature of the product. In such case, the script generator may combine or merge these two sets of data to create a script, which prescribes that action A be performed, and then action B be performed 5 seconds after action A. In this example, the script generator performs a "MIN" function to select the smallest time gap between two actions A, B. In other embodiments, the script generator may determine that the time gap between actions A, B does not affect a result of the testing. In such cases, the script generator may create a script that prescribes action A be performed, and then action B be performed immediately or 1 second after action A. In such cases, the script generator incorporate a time gap between actions A, B that is different from both the ones tracked in the first and second testers 14.

The script generator is advantageous because it converts the data representing previously tracked actions of a tester 14 into command(s) or instruction(s) executable by the product testing machine 1540 to perform machine-based product testing. In other embodiments, the system 10 may not include the script generator. Instead, the product testing machine 1540 is configured to receive data representing previously tracked actions of a tester 14, and use the data directly as input to perform a product testing on the product. In such cases, the product testing machine 1540 itself is configured to understand the data representing the tracked actions of the tester 14, and apply such data in a product testing algorithm to cause a product testing to be performed based on the data. In one implementation, the data is received by the product testing machine 1540 as input, and the product testing machine 1540 then runs an algorithm using the data to perform product testing on the second product 1509. Thus, the script generator may not be needed in some embodiments.

Returning to FIG. 12, in some embodiments, the product testing machine 1540 is configured to simulate actions of a tester 14 based on the data in the electronic file. For example, the product testing machine 1540 may be configured to virtually move a cursor with respect to a testing interface (e.g., the testing interface 402) without input from a cursor control. As another example, the product testing machine 1540 may be configured to virtually make a selection in a testing interface without input from a user control. As a further example, the product testing machine 1540 may be configured to virtually type a text in a field of a testing interface without input from a keyboard. As another example, the product testing machine 1540 may be configured to virtually create a finger/simulated swipe in a testing interface without input from a user control (e.g., touchpad, touch screen, etc.). The product testing machine 1540 may be configured to perform any combination of the foregoing to perform a product testing task.

Figure 13A:
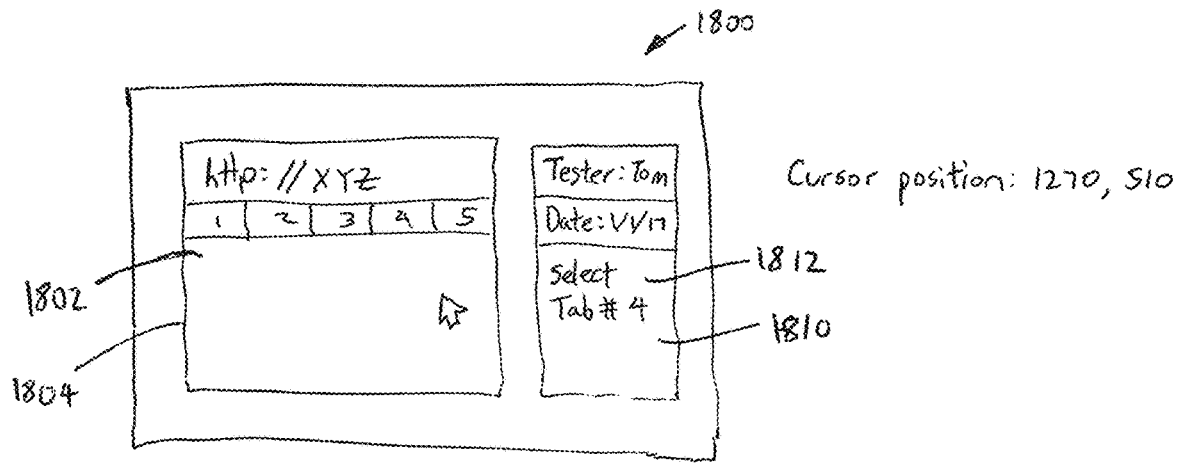
FIGS. 13A-13F illustrate an example of tracking actions of a tester performing product testing using a testing interface.
Figure 13B:
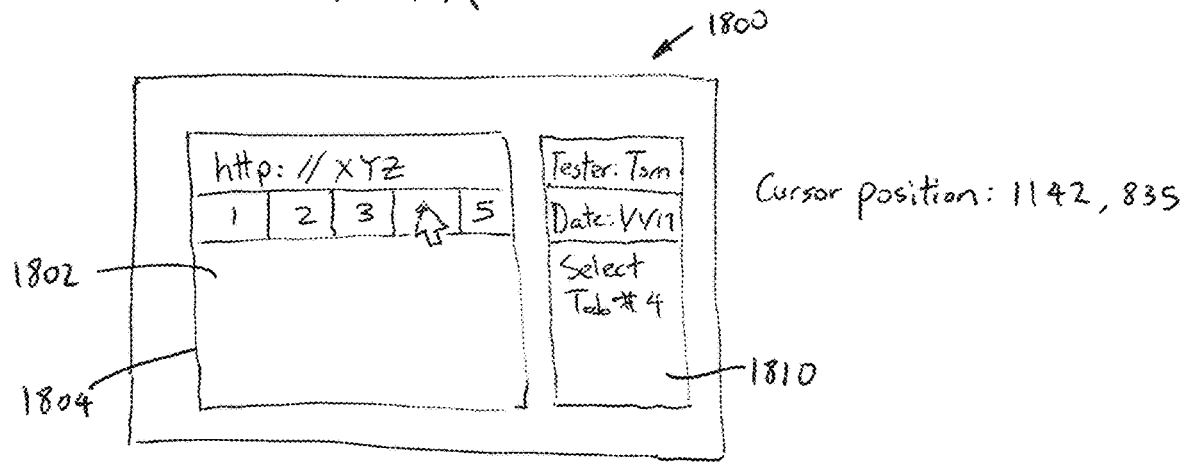
Figure 13C:
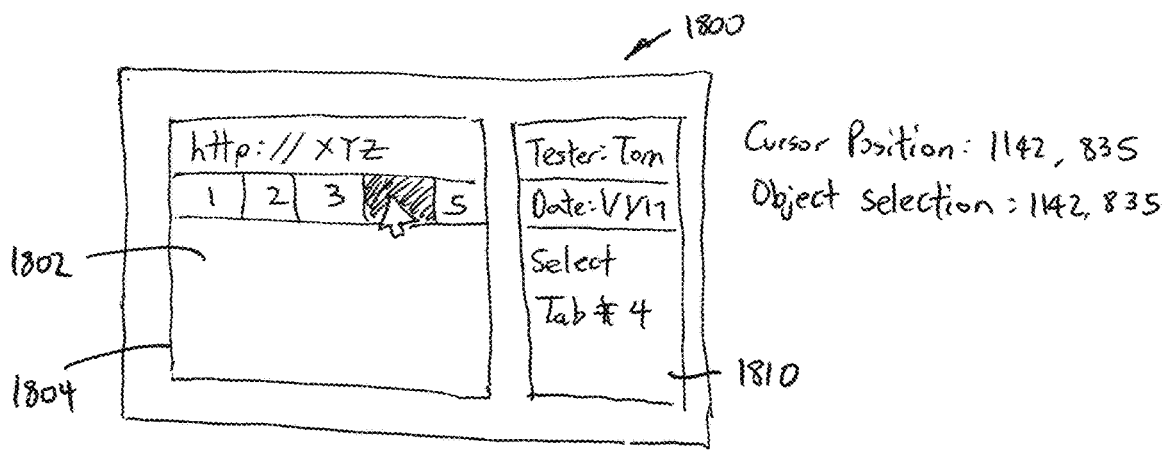
Figure 13D:
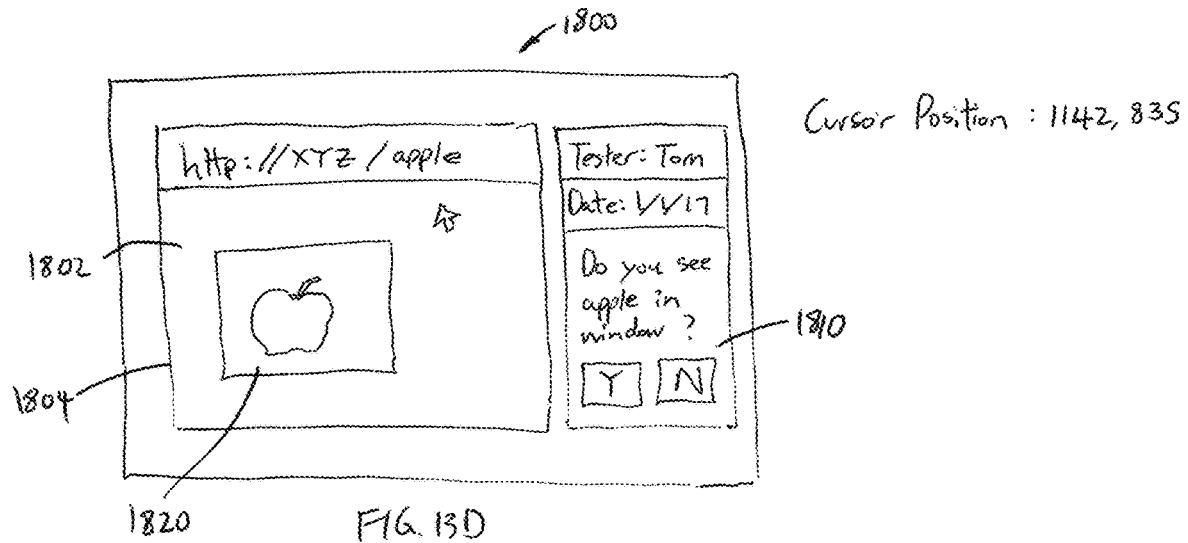
Figure 13E:
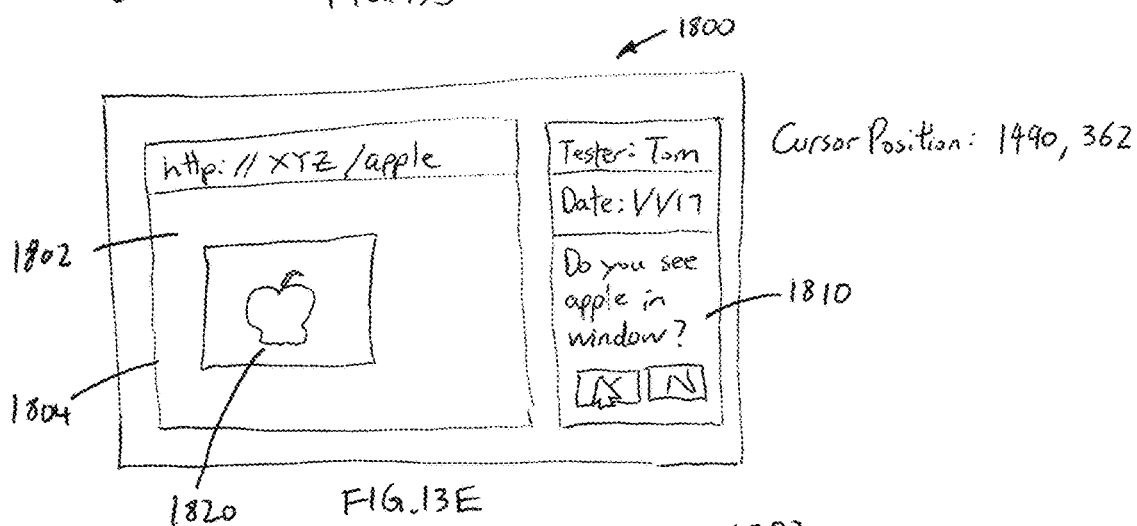
Figure 13F:
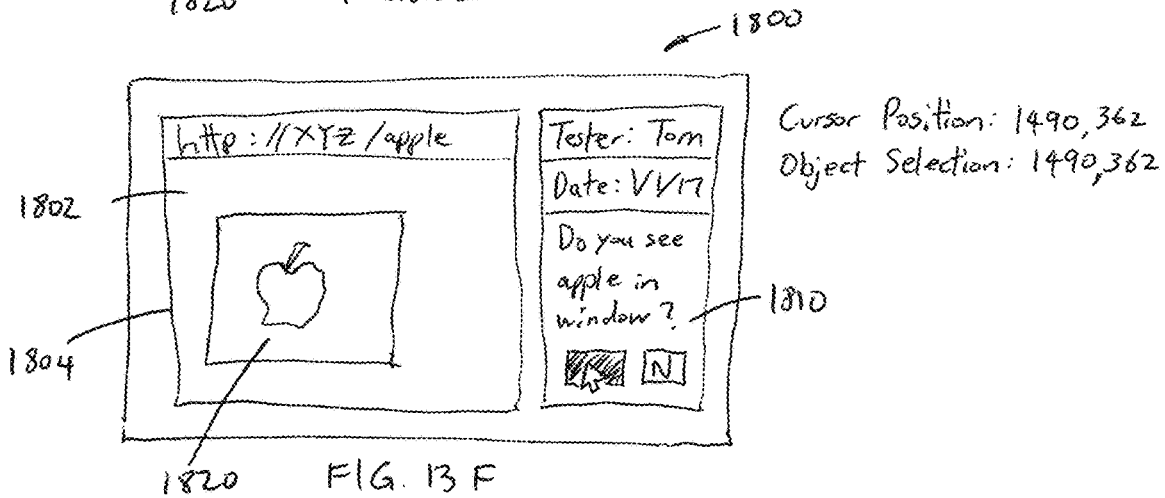

FIGS. 13A-13F illustrate an example of the above features regarding tracking actions of a tester 14 during testing of a first product, and using the tracked actions to perform machine-based product testing on a second product. As shown in FIG. 13A, the system 10 presents a testing interface 1800 for allowing a tester 14 to perform testing on a first product 1802. The first product 1802 may be the first product 108 shown in FIG. 11. The testing interface 1800 is similar to the testing interface 402 of FIG. 4. The testing interface 1800 includes a window 1804 for presenting features of the first product 1802 being tested. In the illustrated example, the first product 1802 comprises a web page.

In other examples, the first product 1802 may be a web site, a computer application (e.g., an enterprise application), a mobile (e.g., handheld) device application, an application for a specialized processor, etc.

As shown in FIG. 13A, the testing interface 1800 also includes a field 1810 providing one or more tasks 1812 for the product tester 14 to perform on the first product 1802. The field 1810 may also provide a question for the tester 14 to answer in some cases. As shown in FIG. 13A, the first product 1802 being tested by the tester 14 via the testing interface 1800 includes tabs 1-5. The testing interface 1800 is configured to test the feature of tab 4 in the example. Accordingly, the testing interface 1800 provides instruction in the field 1810 to instruct the tester 14 to select tab 4. In response to the testing instruction to perform the tab 4 selection task, the tester 14 moves the cursor from the position shown in FIG. 13A to a new position shown in FIG. 13B. While the tester 14 is performing this action, the tracker 1300 of the system 10 tracks the interaction of the tester 14 with respect to the first product 1802 presented in the testing interface 1800. For example, the tracker 1300 may determine that the cursor is at position (X=1270, Y=510) in FIG. 13A, and is then moved to new position (X=1142, Y=835) in FIG. 13B. When the tester 14 selects tab 4 (shown in FIG. 13C), the tracker 1300 also tracks the selection. In the illustrated example, after the tester 14 selects tab 4, the first product 1802 presents an image 1820 of an apple (FIG. 13D), and the field 1810 of the testing interface 1800 asks the tester 14 to confirm whether he/she sees an apple. The tester 14 then answers the question by moving the cursor from the position (X=1142, Y=835) shown in FIG. 13D to a new position (X=1490, Y=362) shown in FIG. 13E. The tester 14 then clicks on the "Y" button at the cursor position (X=1490, Y=362) to confirm that the tester 14 can see the apple. While the tester 14 is performing these actions, the tracker 1300 tracks the interaction of the tester 14 with respect to the testing interface 1800. As a result of testing the feature of tab 4 in the above example, the tracker 1300 may generate the following data representing the tracked actions of the tester 14:

| No. | Action type | Details of tracked action |
|-----|-------------|---------------------------|
| 1 | Cursor movement | (1270, 510), (1142, 835) |
| 2 | Object selection | (1142, 835) |
| 3 | Cursor movement | (1142, 835), (1490, 362) |
| 4 | Object selection | (1490, 362) |

The above data may be stored in the non-transitory medium (e.g., tracked action database) 1520 of the system 10 for later use. The data may be stored in association with the first product 1802 tested by the tester 14. The data may also be stored in association with an identity of the tester 14. Also, in some embodiments, the data may be stored in association with metadata indicating the nature of the tester interaction. For example, the above first two tracked actions (actions 1, 2) may be stored with metadata "product feature selection" indicating that the actions were performed to select a feature in the product being tested.

Similarly, the last two tracked actions (actions 3, 4) in the above example may be stored with metadata "confirm feature=Y" indicating that the actions were performed to confirm a presence of a feature in the product being tested, and that the testing of the tab 4 is successful because the tester 14 confirmed the presence of the feature. Furthermore, the non-transitory medium 1520 may store the image of FIG. 13F in association with the data representing the tracked actions. This image is useful because it includes a content (e.g., image of an apple in the example) indicating a successful result of the task for testing the tab 4 feature of the first product 1802.

In other embodiments, instead of tracking cursor operations anywhere in the testing interface 1800, the tracker 1300 may be configured to track cursor operation with respect to the product itself (i.e., features in the window 1804). In such cases, the tracker 1300 does not track cursor operations in the field 1810 of the testing interfaced 1800. However, the tracker 1300 may still track other forms of tester interaction with the testing interface 1800. For example, instead of asking the tester 14 to use the cursor to select "Y" or "N" to confirm whether he/she sees an apple, the testing interface 1800 may ask the tester 14 to press key "Y" or "N" in the keyboard, or may ask the tester 14 to say "Yes" or "No". Accordingly, the tracker 1300 may be configured to track key stroke, voice input, etc. Data representing such tracked actions will then be stored in the non-transitory medium 1520.

Figure 14:
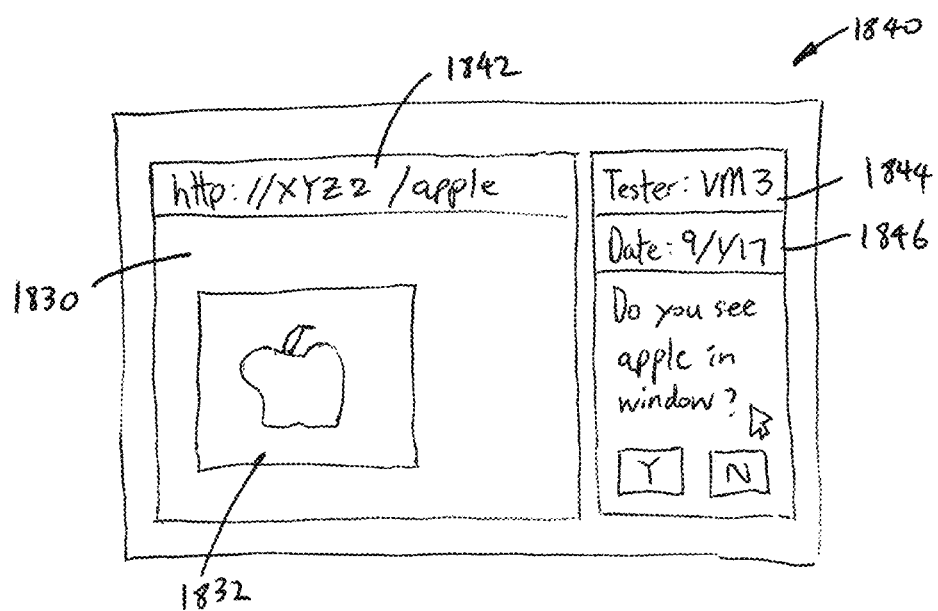
FIG. 14 illustrates an example of an interface being used by a product testing machine to perform product testing.

After the first product 1802 has been tested, the system 10 may later receive another request to test a new product (a second product) that is an updated version of the first product 1802. When this happens, instead of having a tester 14 performing testing on the second product, the system 10 itself performs testing of the new product based on the data stored in the non-transitory medium 1520. Following the above example, the retrieving module 1530 of the system 10 access the non-transitory medium 1520 to obtain the data representing the previously tracked actions of the tester 14 performed while testing the first product 1802. The product testing machine 1540 then performs testing of the second product based on the data. In some embodiments, the data may be used to create a script that prescribes actions to be performed by the product testing machine 1540. Accordingly, the product testing machine 1540 executes the script, which causes the product testing machine 1540 to electronically operate a testing interface to test feature(s) of the second product. In particular, when testing the tab 4 feature of the second product based on the previously tracked actions (actions 1, 2 in the example), the product testing machine 1540 moves the cursor to position (1142, 835), and selects the tab 4 at the position (1142, 835). As a result of these operations by the product testing machine 1540, the second product 1830 (which may be the second product 1509 of FIG. 11) in the testing interface 1840 displays an apple in a window 1832 (FIG. 14). Because the next two tracked actions (actions 3, 4 in the example) are for confirming a presence of an object in the product to determine if the testing of the feature in the product is successful or not, the product testing machine 1540 does not repeat the tracked actions 3, 4. Instead, the product testing machine 1540 may compare the image from the testing interface 1840 obtained while the product testing machine 1540 is testing the new product 1830, with the previously saved image (i.e., the image of FIG. 13F in the example) from the testing interface obtained while the tester 14 was testing the first product 1802.

Figure 15:
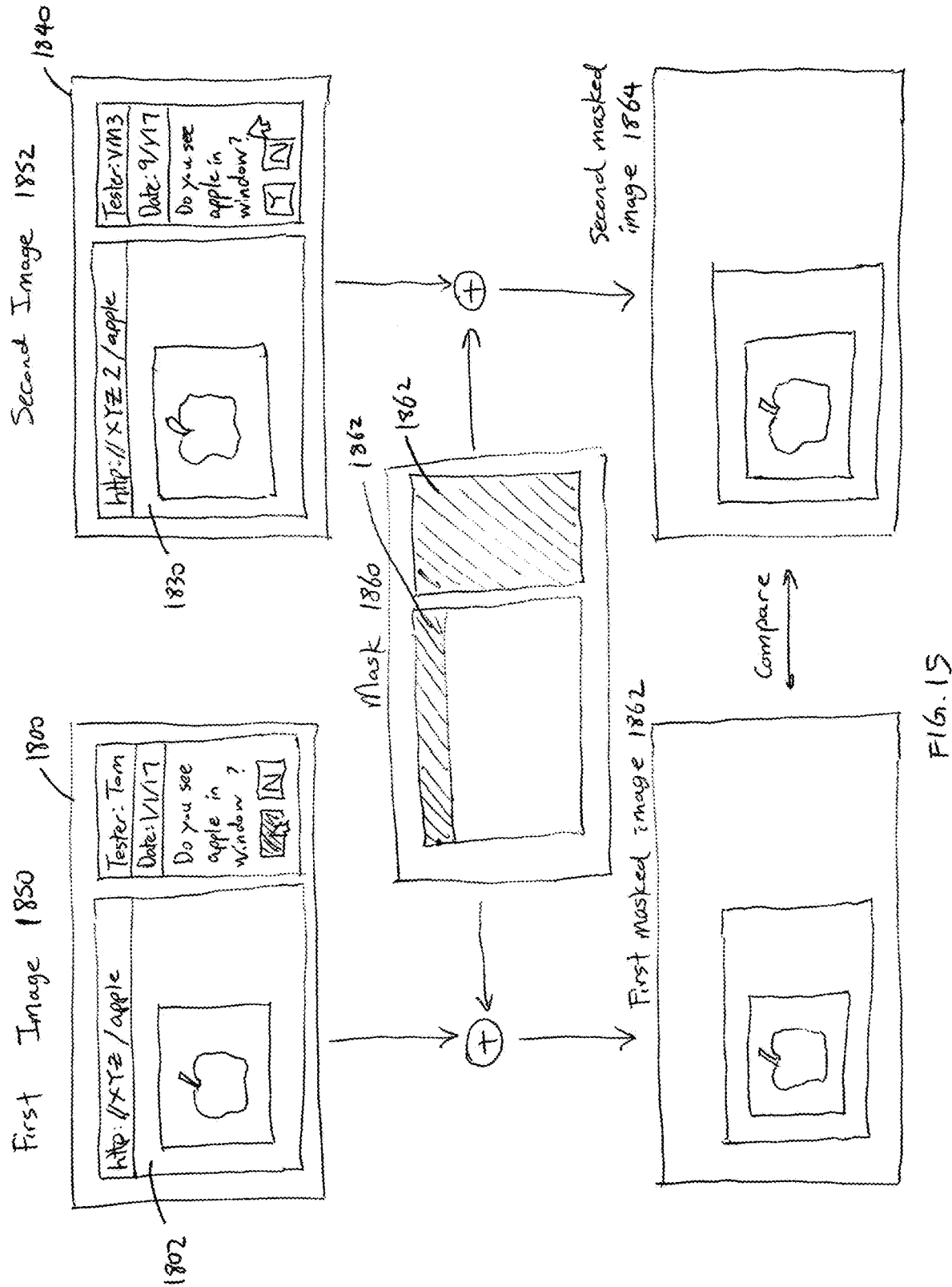
FIG. 15 illustrates an image processing technique.

FIG. 15 illustrates this concept.

As shown in FIG. 15, the product testing machine 1540 may obtain a first image 1850 that is associated with the testing of the first product 1802, and obtain a second image 1852 that is associated with the testing of the second product 1830. The first image 1850 is based on a completion of a first task (the task to test the tab 4 feature of the first product 1802 in the example) performed during the testing of the first product 1802 by the tester 14, and the second image 1852 may be based on a completion of a second task (the task to test the tab 4 feature of the second product 1830 in the example) performed during the testing of the second product 1830 by the product testing machine 1540. In the illustrated example, the first image 1850 is the same as that shown in FIG. 13F (which was previously stored after the tester 14 performs the task to test the tab 4 feature in the first product 1802), and the second image 1852 is the same as that shown in FIG. 14 (which is obtained after the product testing machine 1540 has tested the tab 4 feature in the second product 1830). Accordingly, the first image 1850 comprises a first content (e.g., the image of the apple in the above example) of a first content of the first testing interface 1800 configured for testing the first product 1802, the first content indicating a first result (e.g., a successful result) of a first task for testing the first product 1802. Also, the second image 1852 comprises a second content (e.g., the image of the apple in the above example) of a second content of the second testing interface 1840 configured for testing the second product 1830, the second content indicating a second result of a second task for testing the second product 1830.

In other embodiments, the first image 1850 may be an image of the first product 1802 without the first testing interface 1800, and the second image 1852 may be an image of the second product 1830 without the second testing interface 1840. Accordingly, the first image 1850 comprises a first content (e.g., the image of the apple in the above example) of the first product 1802, the first content indicating a first result (e.g., a successful result) of a first task for testing the first product 1802. Also, the second image 1852 comprises a second content (e.g., the image of the apple in the above example) of the second product 1830, the second content indicating a second result of a second task for testing the second product 1830.

As shown in FIG. 15, the product testing machine 1540 is also configured to apply a mask 1860 to the first image 1850 to create a first masked image 1862, apply the mask 1860 to the second image 1852 to create a second masked image 1864, and compare the first masked image 1862 with the second masked image 1864. The mask 1860 is configured to block out one or more portions of the first image 1850 and the second image 1852. The mask 1860 is advantageous because it blocks out information in the captured images 1850, 1852 that are different from each other, but are not relevant in deciding whether the testing of the product feature fails or not. For example, as shown in the testing interface 1840 of FIG. 14, the identity 1842 of the product being tested is different from that shown in FIG. 13F. Also, the tester identity 1844 in the testing interface 1840 of FIG. 14 is "VM3", indicating that the testing is being performed by virtual machine No. 3, which is also different from that shown in FIG. 13F (showing the tester being "Tom"). In other cases, the tester identity 1844 may be shown in the product itself, as opposed to being displayed in a field of the testing interface. The testing date 1846 in the testing interface 1840 of FIG. 14 is also different from that shown in FIG. 13F. The product identity 1842, the tester identity 1844, and testing date 1846 are different between the first image 1850 and the second image 1852. However, they are not relevant in deciding whether the testing of the product feature fails or not. Accordingly, the mask 1860 contains one or more regions 1862 configured to block out these items in the first image 1850 and the second image 1852. In some embodiments, if the first image 1850 includes an image of the first product 1802 (without the first testing interface 1800), and if the second image 1852 includes an image of the second product 1830 (without the second testing interface 1840), then the mask 1860 may have one or more regions 1862 configured to block out items in the image of the first product 1802, and corresponding items in the image of the second product 1830.

After the first masked image 1862 and the second masked image 1864 are obtained, the product testing machine 1540 then compares them to see if they are the same or sufficiently similar. If so, the product testing machine 1540 may then determine that the testing of the feature (e.g., the tab 4 feature in the above example) in the new product 1830 passes. On the other hand, if the comparison result indicates that the first masked image 1862 and the second masked image 1864 are not the same or not sufficiently similar, the product testing machine 1540 may then determine that the testing of the feature in the new product 1830 fails. Accordingly, the product testing machine 1540 is configured to determine whether the testing of a feature of a product fails or not based on the comparison of the first masked image 1862 and the second masked image 1864.

Various techniques may be employed in different embodiments to compare the first masked image 1862 and the second masked image 1864 with each other. In some embodiments, the product testing machine 1540 may be configured to perform cross correlation to determine a level of similarity between the first and second masked images 1862, 1864. If the level of similarity is above a certain prescribed threshold, then the product testing machine 1540 may consider the first and second masked images 1862, 1864 as being the same or sufficiently similar. The prescribed threshold may be 0.8, 0.9, 0.95, etc, or any of other user-defined number (with 1.0 representing the situation in which the masked images 1862, 1864 are identical).

In other embodiments, the product testing machine 1540 may be configured to perform an image subtraction between the first and second masked images 1862, 1864 to obtain a subtracted image. If the first and second masked images 1862, 1864 are identical, the subtracted image will have zero pixel values throughout. On the other hand, if the first and second masked images 1862, 1864 are substantially similar, the subtracted image will have some non-zero pixel values, but not a lot. In one implementation, the product testing machine 1540 may be configured to count the number of non-zero pixel values in the subtracted image. If the number is below a certain prescribed threshold, the product testing machine 1540 may consider the first and second masked images 1862, 1864 as being the same or sufficiently similar. The prescribed threshold may be 100 pixels, 80 pixels, 50 pixels, 10 pixels, etc, or any of other user-defined number. Alternatively, the prescribed threshold may be expressed as a percentage of the total number of pixels in the image. For example, the prescribed threshold may be 5% of the total pixel numbers, 3% of the total pixel numbers, 1% of the total pixel numbers, etc, or any of other user-defined percentage.

In some embodiments, in addition to, or in the alternative of, considering the number of non-zero pixel values in the subtracted image, the product testing machine 1540 may also analyze the distribution of the non-zero pixel values in the subtracted image to determine whether the first and second masked images 1862, 1864 are the same or substantially similar. If the non-zero pixel values in the subtracted image are spread out, then the product testing machine 1540 may determine that the non-zero pixel values are due to noise or due to inaccuracy in the alignment of the features in the two masked images 1862, 1864. In such cases, the two masked images 1862, 1864 may be considered as being sufficiently similar. On the other hand, if the non-zero pixel values in the subtracted image are clustered in group(s), then the product testing machine 1540 may determine that the two masked images 1862, 1864 are different or not substantially similar.

In the above example, the system 10 has been described with reference to testing a feature of the product 1830. In other embodiments, the system 10 may be configured to test multiple features of the product 1830, wherein the multiple features includes at least a first feature and a second feature. In such cases, the product testing machine 1540 may be configured to test the first feature, and the second feature. In one implementation, the product testing machine 1540 may be configured to test the first feature of the product 1830 by running a first script that is based on a first tracked action of a tester 14, and test the second feature of the product 1830 by running a second script that is based on a second tracked action of the tester 14.

Also, the above example is described with reference to testing a tab feature of a webpage. In other embodiments, the system 10 may be configured to test other features of other types of products. For example, the system 10 may test a selection of a link, a selection of a button, an input of a command, etc.

Figure 16:
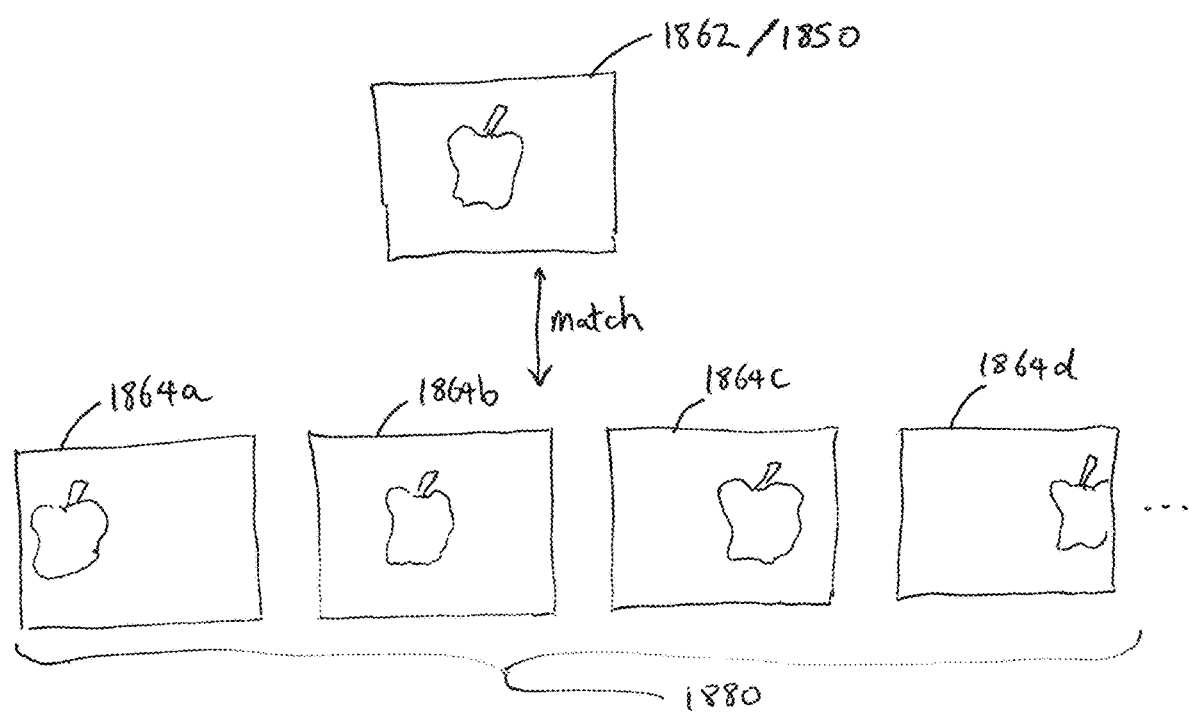
FIG. 16 illustrates a concept of image capture for image matching.

In some cases, the first image 1850 of the testing interface 1800 (that was captured during a previous testing of an earlier product 1802) may include a feature with varying configuration over time (e.g., a video, an animation, a moving object, etc.). In such cases, when the product testing machine 1540 performs machine-testing of the later product 1830, the testing interface 1840 may also include the same feature with the varying configuration—i.e., when the same stage of the testing is reached. For example, instead of being a still image, the image of the apple in the first image 1850 in the above example may be one of a plurality of image frames in a video of the first product 1802 that was captured during a testing session. In this example, the video shows a moving apple. Following this example, in order to determine whether the machine-based product testing being performed on the second product 1830 fails or not, the system 10 is configured to find an image (from a sequence of image frames in the video of the moving apple in the second product 1830) that matches the image of the apple in the first image 8150 (or in the first masked image 1862). FIG. 16 illustrates the above concept. As shown in the figure, the first image 1850/the first masked image 1862 includes the image of the apple, which is one of the image frames in the video of the moving apple. When the machine-based testing performed by the product testing machine 1540 reaches the same stage (e.g., at the page of the second product 1830 showing a video of a moving apple), the system 10 then compares the image frames in the video with the image of the apple from the first image 1850 or from the first masked image 1862. In the illustrated example, there are four image frames 1864*a*-1864*d* in the video of the moving apple in the second product 1830. Accordingly, the system 10 performs the image comparison to compare each of these four image frames 1864*a*-1864*d* with the image of the apple from the first image 1850 or first masked image 1862. As shown in the figure, image frame 1864*b* matches with the image of the apple associated with the first product 1802. Accordingly, the system 10 can determine that the testing of the tab 4 feature of the second product 1830 passes. In one implementation, the image capturing feature described above may be performed by an image capturer 1550 (shown in FIG. 12). The image capturer 1550 is configured to determine a second image (which may be the second image 1852 or the second masked image 1864) by comparing a sequence of image frames 1864 with the first image (which may be the first image 1850 or the first masked image 1862), and selecting one of the image frames 1864 that matches the first image as the second image. In some embodiments, the image capturer 1550 is configured to compare a region-of-interest in the first image with corresponding region-of-interest in the sequence of image frames. The image capturer 1550 is advantageous because it addresses the situation in which the stored first image 1802 (representing a success testing of a feature of the first product 1508/1802) is a part of a video or moving feature in the first product 1508/1802. As shown in the above example, the machine-based testing by the product testing machine 1540 is based on a comparison of captured images (one from human-based testing, and another one from machine-based testing). If the first captured image is from a video or a moving feature of the first product 1508/1802, then the product testing machine 1540 will need to search through image frames from the same corresponding video or moving feature in the second product 1509/1830 in order to verify whether there is an image that matches with the first image (e.g., the first image 1850/first masked image 1862).

Returning to FIG. 12, in some embodiments, the system 10 may comprise a dispatch module 1560 configured to automatically send out a request to test the second product 1830 if the testing of the feature of the second product 1830 based on the comparison of the first and second masked images 1862, 1864 fails. In some cases, the testing of the new product by the product testing machine 1540 based on previously tracked actions of a tester 14 may result in a failed testing. This is a possible scenario because an updated product may have a feature that renders a previously tracked product testing action inapplicable for testing the updated product. If the machine-based product testing fails, the dispatch module 1560 then generates a signal to cause the notification generator 1004 to send out one or more requests for product testing by one or more testers 14. The technique and features associated with product testing by testers 14 were previously described, and will not be repeated here. If the product testing by one or more testers 14 fails, the system 10 may then determine that the second product 1830 (e.g., the updated product) fails product testing (because it fails both the machine-based testing, and the human-based testing). On the other hand, if the product testing on the new product 1830 by one or more testers 14 passes, the system 10 may then determine that the new product 1830 passes product testing. In such cases, the system 10 then saves the tracked actions (the ones that results in the passing of the product testing on the new product 1830) of the tester 14 in the non-transitory medium 1520 for later use. For example, if another new product later (e.g., another updated product) is received by the system 10 for product testing, the system 10 may then retrieve the electronic file with the latest tracked tester's actions for use by the product testing machine 1540 to perform machine-based product testing on the newest product.

In the above example, the product testing machine 1540 is described as repeating a selection of an object in the second product 1830 at a location in the second product 1830 that is the same as the location in the first product 1802 (as tracked by the tracker 1300). This is because the selection of the object in the first product 1802 by the tester 14 is tracked by the tracker 1300, and it is assumed that the same object will appear in the second product 1830 when tested by the product testing machine 1540. However, in some embodiments, the object selected in the first product 1802 may appear at a different location in the second product 1830. For example, when the party 16 updates the first product 1802 to create the second product 1830, the party 16 may move the object (e.g., a tab) in the first product 1802 to another location in the second product 1830. Accordingly, in some embodiments, when the tracker 1300 tracks a selection of an object when the tester 14 tests the product, the tracker 1300 may also capture an image of the object being selected. In the above example, the tracker 1300 may capture an image of tab 4 when the tester 14 selects tab 4. The captured image of the object may then be stored in the non-transitory medium 1520 in association with the data representing the tracked action (e.g., the tracked selection of the tab 4 in the example). In one implementation, the capturing of the image of a selected object may be performed by capturing a screenshot of the product when the tester 14 selects an object, and the coordinate of the object selection, which indicates the object being selected in the screenshot. Later on, when the product testing machine 1540 performs machine-testing of the second product 1830, instead of repeating the selection of the object at the same location as that in the first product 1802, the product testing machine 1540 searches an image of the second product 1830 to look for the same object that was previously selected by the tester 14 in the first product 1802. For example, the product testing machine 1540 may perform an image search to locate the tab 4 in the second product 1830, and if the tab 4 is found, then product testing machine 1540 may then select the tab 4, regardless of whether the tab 4 is at the same position with respect to the second product 1830 as that in the first product 1802. Therefore, in other embodiments, instead of re-playing a testing action based on position (e.g., X, Y coordinates) of a previous testing action by a tester 14, the product testing machine 1540 may re-play a previously tracked testing action based on appearance of an object and/or semantics.

It should be noted that the product being tested is not limited to the example and features described herein, and that the product being tested may have other features, and/or may be of different types. By means of non-limiting examples, the product may comprise a web page, a web site, a computer application, a mobile device application, or a processor application.

It should be noted that the system 10 is not limited to have the configuration shown in FIG. 12, and that the system 10 is not limited to having the features described herein. In some embodiments, the system 10 may not include one or more of the items described with reference to FIG. 12. Also, one or more of the items described with reference to FIG. 12 may be combined in some embodiments. For example in some embodiments, the retrieving module 1530 and the product testing machine 1540 may be integrated. In such cases, the retrieving module 1530 may be one or more inputs, or one or more input interfaces, of a processing unit, wherein the processing unit may implement, or may be a part of, the product testing machine 1540. In addition, in some embodiments, the product testing machine 1540 may be a processing unit, or a part of a processing unit. Such processing unit may also be used to implement the tracker 1300, the retrieving module 1530, the image capturer 1550, the dispatch module 1560, or any combination of the foregoing. Alternatively, such processing unit may be communicatively coupled to the tracker 1300, the retrieving module 1530, the image capturer 1550, the dispatch module 1560, or any combination of the foregoing. Furthermore, in some embodiments, the electronic product testing system 10 may include only the product testing machine 1540. In other embodiments, the electronic product testing system 10 may not include the user interface generator 1350, the product testing instruction database 1600, the test result retrieval module 1500, the testing monitoring module 1400, the analyzer 1502, or any combination of the foregoing. Also, in some embodiments, the electronic product testing system 10 may not include one or more items that are outside the dashed-box in FIG. 12. In still further embodiments, the non-transitory medium 1520 may be excluded from the system 10. In such cases, the system 10 is communicatively coupled to the non-transitory medium 1520 (e.g., via the Internet, a cable, or any of other types of network connection). Furthermore, in other embodiments, the product testing machine 1540 may be considered as a testing device. Such testing device may optionally include the image capturer 1550 and/or the dispatch module 1560. Also, such testing device may include a processing unit for providing one or more features described herein.

Figure 17:
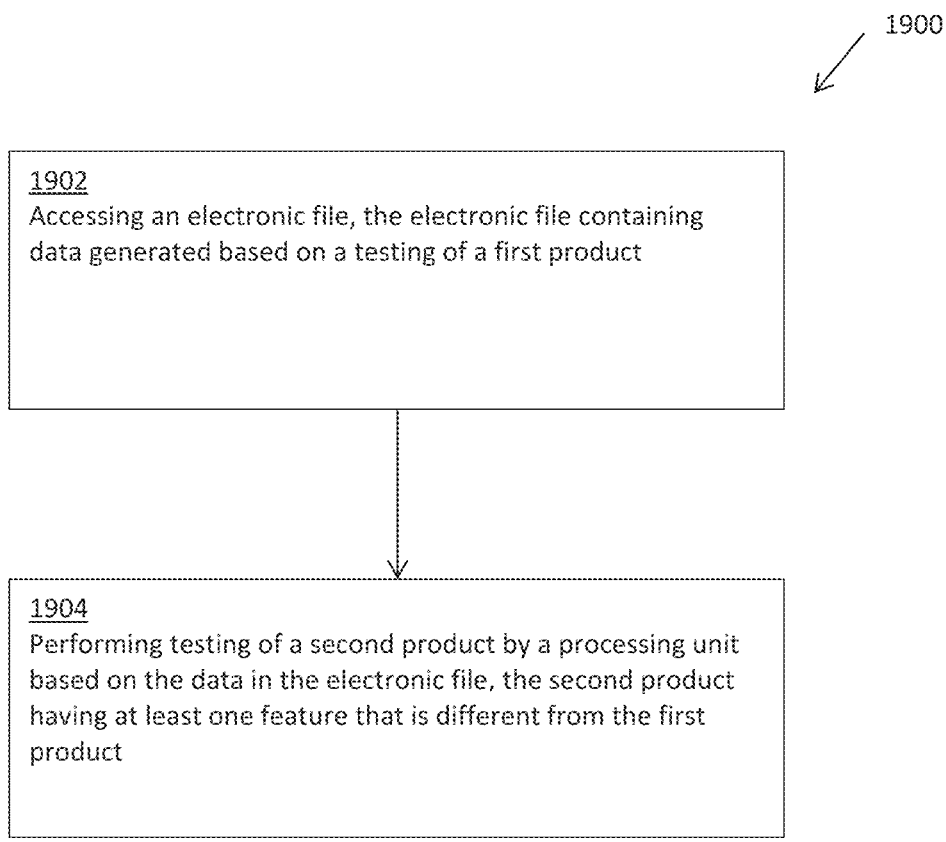
FIG. 17 illustrates a method for providing product testing.

FIG. 17 illustrates a method 1900 in accordance with some embodiments. The method 1900 is a processor-implemented method for product testing. The method 1900 may be performed by the system 10 of FIG. 12. As shown in the figure, the method 1900 includes accessing an electronic file, the electronic file containing data generated based on a testing of a first product (item 1902); and performing testing of a second product by a processing unit based on the data in the electronic file (item 1904). The second product may have at least one feature that is different from the first product. The first product may be the first product 1802 described in the previous example, and the second product may be the second product 1830 described in the previous example.

In some embodiments, with respect to the method 1900, the data in the electronic file comprises information regarding tracked actions of a tester, and respective time stamps of the tracked actions.

In some embodiments, with respect to the method 1900, the act of performing the testing of the second product comprises re-executing the tracked actions to test the second product based on the information in the electronic file regarding the tracked actions of the tester.

In some embodiments, with respect to the method 1900, the act of performing the testing of the second product comprises simulating actions of a tester.

In some embodiments, with respect to the method 1900, the electronic file comprises a script, and wherein the act of performing the testing of the second product comprises running the script for testing the second product.

In some embodiments, with respect to the method 1900, the data in the electronic file are based on tracked action(s) performed using a cursor and/or a keyboard.

In some embodiments, with respect to the method 1900, the data in the electronic file comprises: cursor positions; a text typed by a tester; a location of the text typed by the tester, a location of an object selection; or any combination of the foregoing.

In some embodiments, with respect to the method 1900, the electronic file is stored in a non-transitory medium in association with an identity of the first product.

In some embodiments, with respect to the method 1900, the non-transitory medium also stores one or more additional electronic files that are associated with the identity of the first product.

In some embodiments, with respect to the method 1900, the act of accessing the electronic file comprises selecting one of the electronic files in the non-transitory medium having a latest time stamp.

In some embodiments, the method 1900 may further include: obtaining a first image that is associated with the testing of the first product, and obtaining a second image that is associated with the testing of the second product.

In some embodiments, with respect to the method 1900, the first image is based on a completion of a first task performed during the testing of the first product, and wherein the second image is based on a completion of a second task performed during the testing of the second product.

In some embodiments, with respect to the method 1900, the first image comprises a first content of a first testing interface configured for testing the first product, the first content indicating a first result of a first task for testing the first product; and wherein the second image comprises a second content of a second testing interface configured for testing the second product, the second content indicating a second result of a second task for testing the second product.

In some embodiments, the method 1900 may further include: applying a mask to the first image to create a first masked image, applying the mask to the second image to create a second masked image, and comparing the first masked image with the second masked image.

In some embodiments, with respect to the method 1900, the mask is configured to block out one or more portions of the first image and the second image.

In some embodiments, with respect to the method 1900, the testing of the second product comprises testing a feature of the second product, and wherein the method further comprising determining whether the testing of the feature of the second product fails or not based on the comparison of the first masked image and the second masked image.

In some embodiments, the method 1900 may further include automatically sending out a request to test the second product if the testing of the feature of the second product based on the comparison of the first and second masked images fails.

In some embodiments, with respect to the method 1900, the processing unit is configured to test multiple features of the second product, the multiple features comprising at least a first feature and a second feature, wherein the act of performing testing of the second product comprises testing the first feature of the second product by running a first script that is based on a first tracked action of a tester, and testing the second feature of the second product by running a second script that is based on a second tracked action of the tester.

In some embodiments, the method 1900 may further include determining the second image by comparing a sequence of image frames with the first image, and selecting one of the image frames that matches the first image as the second image.

In some embodiments, the method 1900 may further include tracking an interaction of a tester with a web page, wherein the data in the electronic file is based on the tracked interaction.

In some embodiments, with respect to the method 1900, the act of tracking comprises tracking a movement of a cursor operated by the tester.

In some embodiments, with respect to the method 1900, the act of tracking comprises tracking a selection of a tab, a selection of a button, a selection of an icon, a selection of a text, or any combination of the foregoing.

In some embodiments, with respect to the method 1900, the first product comprises a web page, a web site, a computer application, a mobile device application, or a processor application.

In some embodiments, with respect to the method 1900, the act of performing the testing of the second product comprises virtually moving a cursor with respect to a testing interface without input from a cursor control.

In some embodiments, with respect to the method 1900, the act of performing the testing of the second product comprises virtually making a cursor selection in a testing interface without input from a cursor control.

In some embodiments, with respect to the method 1900, the act of performing the testing of the second product comprises virtually typing a text in a field of a testing interface without input from a keyboard.

In some embodiments, with respect to the method 1900, the testing of the first product is human-based, and the testing of the second product is machine-based.

In some embodiments, the method 1900 may be performed in response to a processing unit processing a set of instructions stored in a processor-readable medium. In particular, the processor-readable medium includes a set of instructions, wherein an execution of the instructions by a processing unit will cause a method for product testing to be performed, the method comprising: accessing an electronic file, the electronic file containing data generated based on a testing of a first product; and performing testing of a second product based on the data in the electronic file, the second product having at least one feature that is different from the first product.

Figure 18:
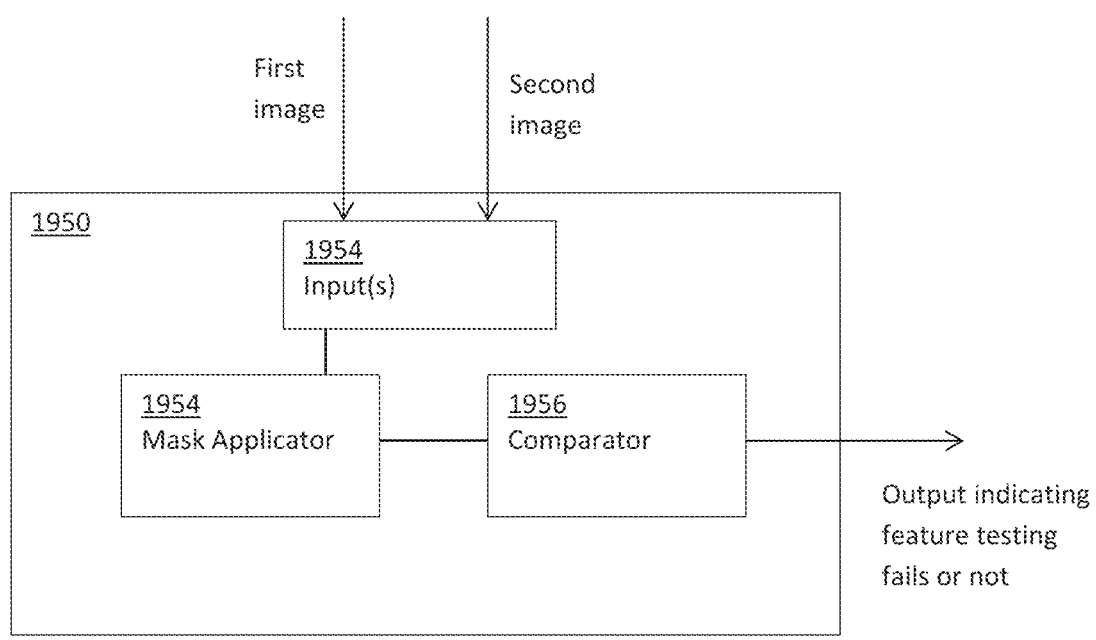
FIG. 18 illustrates a component of a product testing system.

As discussed, the product testing machine 1540 is configured to compare two masked images to determine whether they are the same or substantially similar, and if so, the product testing machine 1540 may then determine that the machine-based testing performed to test the feature of the new product passes. FIG. 18 illustrates an apparatus 1950, which is a component of an electronic product testing system, wherein the component is configured to provide the above features. The component 1950 may be a processing unit. Also, in some embodiments, the apparatus 1950 itself may be considered as a product testing device/system, or a component of a product testing device/system. In addition, in some embodiments, the apparatus 1950 may be implemented as a part of the product testing machine 1540, or as a module that is communicatively coupled to the product testing machine 1540. As shown in the figure, the apparatus 1950 includes one or more input(s) 1954 configured to obtain a first image that is associated with a testing of the first product, and to obtain a second image that is associated with a testing of the second product, wherein the testing of the second product comprises a testing of a feature of the second product. The apparatus 1950 also includes a mask applicator 1954 configured to apply a mask to the first image to create a first masked image, and to apply the mask to the second image to create a second masked image. The apparatus 1950 also includes a comparator 1956 configured to compare the first masked image with the second masked image to determine whether the testing of the feature of the second product fails or not. In some embodiments, the first image may be the image 1850 of FIG. 15, and the second image may be the image 1852 of FIG. 15. Also, the mask may be the mask 1860 of FIG. 15.

The mask is configured to block out one or more portions of the first image and the second image.

In some embodiments, the first image is based on a completion of a first task performed during the testing of the first product, and wherein the second image is based on a completion of a second task performed during the testing of the second product.

In some embodiments, the first image comprises a first content of a first testing interface configured for testing the first product, the first content indicating a first result of a first task for testing the first product; and wherein the second image comprises a second content of a second testing interface configured for testing the second product, the second content indicating a second result of a second task for testing the second product.

In some embodiments, the apparatus 1950 may further include an image capturer configured to determine the second image by comparing a sequence of image frames with the first image, and selecting one of the image frames that matches the first image as the second image.

Figure 19:
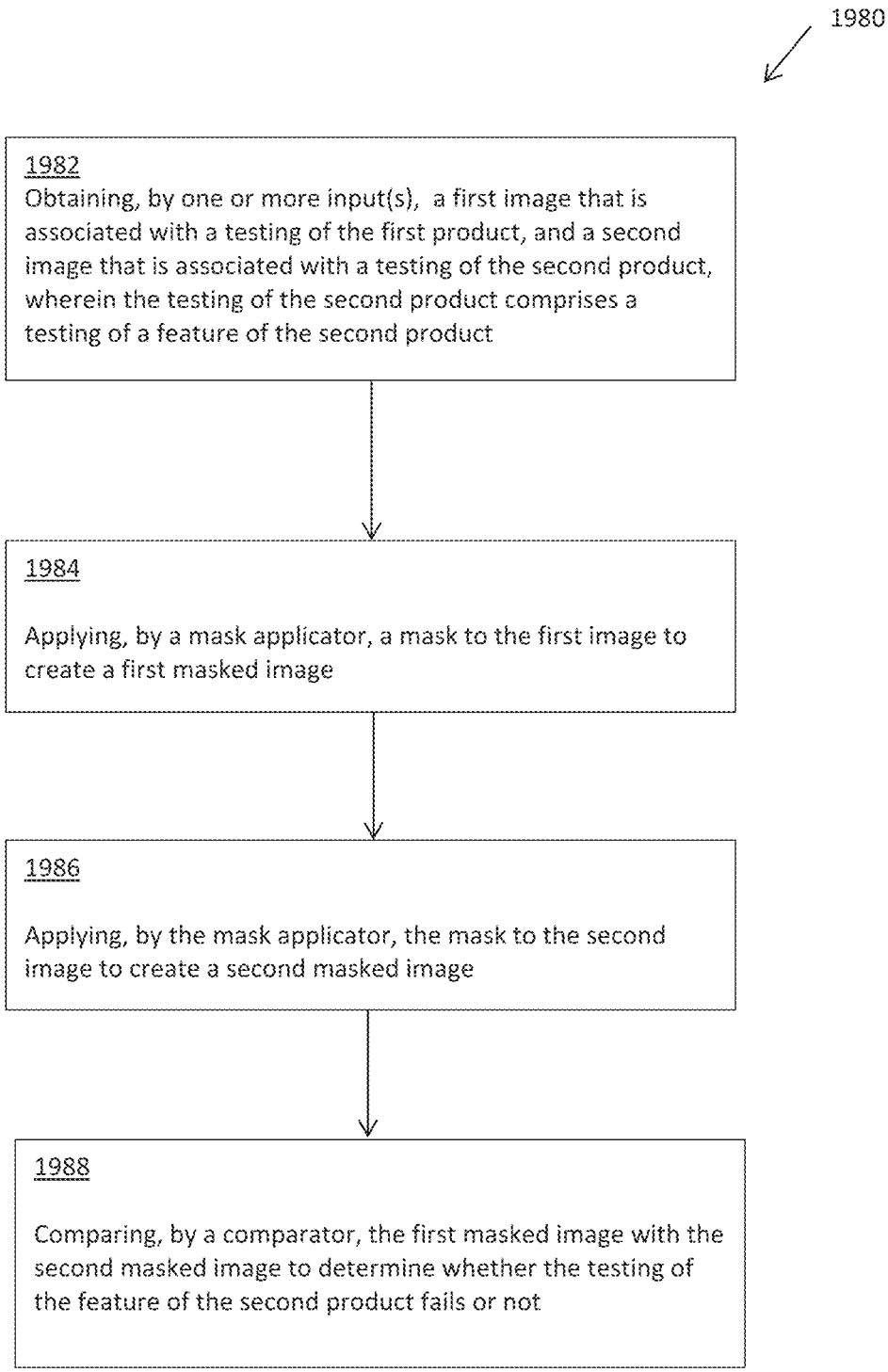
FIG. 19 illustrates a method for use in product testing.

FIG. 19 illustrates a method 1980 in accordance with some embodiments. The method 1980 is a processor-implemented method for product testing. The method 1980 may be performed by the system 10 of FIG. 12. In one implementation, the method 1980 may be performed by the apparatus 1950 of FIG. 18. As shown in the figure, the method 1980 includes: obtaining, by one or more input(s), a first image that is associated with a testing of the first product, and a second image that is associated with a testing of the second product, wherein the testing of the second product comprises a testing of a feature of the second product (item 1982). The method 1980 also includes: applying, by a mask applicator, a mask to the first image to create a first masked image (item 1984). The method 1980 also includes: applying, by the mask applicator, the mask to the second image to create a second masked image (item 1986). The method 1980 further includes: comparing, by a comparator, the first masked image with the second masked image to determine whether the testing of the feature of the second product fails or not (item 1988). The first product may be the first product 1802 described in the previous example, and the second product may be the second product 1830 described in the previous example.

In some embodiments, with respect to the method 1980, the first image is based on a completion of a first task performed during the testing of the first product, and wherein the second image is based on a completion of a second task performed during the testing of the second product.

In some embodiments, with respect to the method 1980, the first image comprises a first content of the first product, the first content indicating a first result of a first task for testing the first product; and wherein the second image comprises a second content of the second product, the second content indicating a second result of a second task for testing the second product.

In some embodiments, with respect to the method 1980, the mask is configured to block out one or more portions of the first image and the second image.

In some embodiments, the method 1980 further includes determining, by an image capturer, the second image by comparing a sequence of image frames with the first image, and selecting one of the image frames that matches the first image as the second image.

In some embodiments, the method 1980 may be performed in response to a processing unit processing a set of instructions stored in a processor-readable medium. In particular, the processor-readable medium includes a set of instructions, wherein an execution of the instructions by a processing unit will cause a method for product testing to be performed, the method comprising: obtaining, by one or more input(s), a first image that is associated with a testing of the first product, and a second image that is associated with a testing of the second product, wherein the testing of the second product comprises a testing of a feature of the second product; applying, by a mask applicator, a mask to the first image to create a first masked image; applying, by the mask applicator, the mask to the second image to create a second masked image; and comparing, by a comparator, the first masked image with the second masked image to determine whether the testing of the feature of the second product fails or not.

Mask Generator

Figure 20:
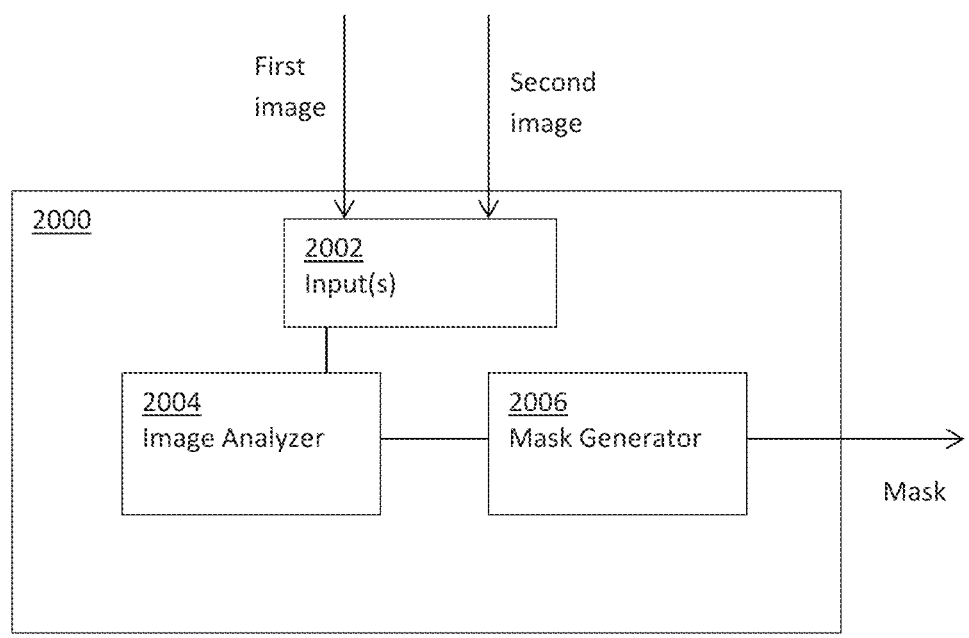
FIG. 20 illustrates a component of a product testing system.

As discussed, the product testing machine 1540 is configured to compare two masked images to determine whether they are the same or substantially similar, and if so, the product testing machine 1540 may then determine that the machine-based testing performed to test the feature of the new product passes. In some embodiments, the system 10 may further include a component configured to generate the mask. FIG. 20 illustrates an apparatus 2000, which is a component of an electronic product testing system, wherein the component is configured to create a mask for masking one or more images of different products obtained during testing of the products. The component 2000 may be a processing unit. Also, in some embodiments, the apparatus 2000 itself may be considered as a component of a product testing device. In addition, in some embodiments, the apparatus 2000 may be implemented as a part of the product testing machine 1540, or as a module that is communicatively coupled to the product testing machine 1540. As shown in the figure, the apparatus 2000 includes: one or more input(s) 2002 configured to receive a first image of a product captured during a first testing of the product, and a second image of the product captured during a second testing of the product. The apparatus 2000 also includes an image analyzer 2004 configured to determine a first part of the product that is different in the first image and the second image. The apparatus 2000 also includes a mask generator 2006 configured to create a mask for covering an image of the first part of the product.

Optionally, the first testing of the product is associated with a first tester, and the second testing of the product is associated with a second tester.

Optionally, the image analyzer 2004 is configured to perform an image subtraction based on the first image and the second image to obtain a subtracted image.

Optionally, the image analyzer 2004 is configured to analyze a distribution of non-zero pixel values in the subtracted image.

Optionally, the mask generator 2006 is configured to create the mask based on a result of the analysis of the distribution of the non-zero pixel values in the subtracted image.

Optionally, the image analyzer 2004 is configured to determine a second part of the product that is different in the first image and the second image, and wherein the mask generator 2006 is configured to create the mask for also covering the image of the second part of the product.

Optionally, the apparatus 2000 further includes a non-transitory medium configured to store the mask in association with an identity of the product.

Figure 21:
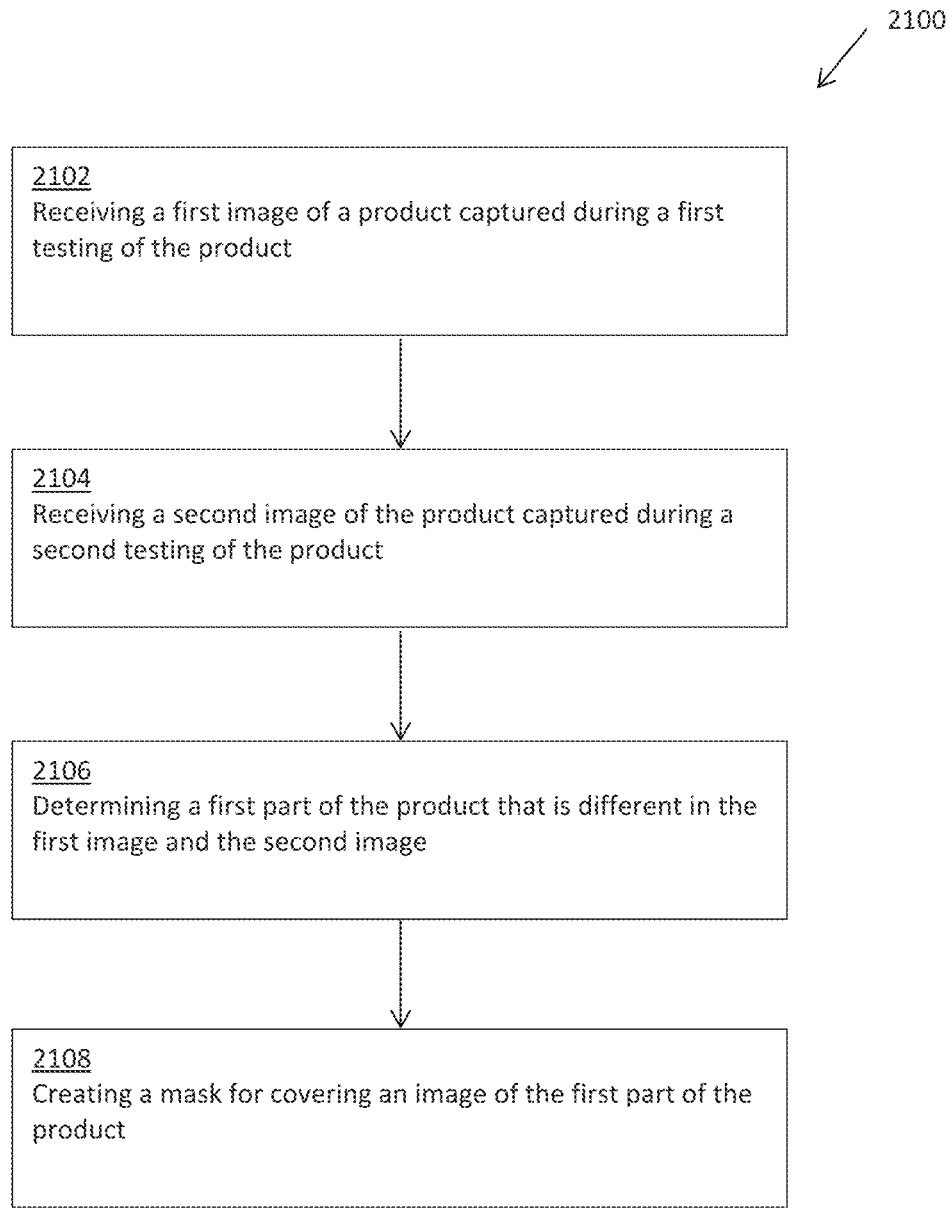
FIG. 21 illustrates a method for use in product testing.

FIG. 21 illustrates a method 2100 in accordance with some embodiments. The method 2100 is a processor-implemented method for product testing. The method 2100 may be performed by the system 10 of FIG. 12. In one implementation, the method 2100 may be performed by the apparatus 2000 of FIG. 20. As shown in the figure, the method 2100 includes: receiving a first image of a product captured during a first testing of the product (item 2102); receiving a second image of the product captured during a second testing of the product (item 2104); determining a first part of the product that is different in the first image and the second image (item 2106); and creating a mask for covering an image of the first part of the product (item 2108).

In some embodiments, with respect to the method 2100, the first testing of the product is associated with a first tester, and the second testing of the product is associated with a second tester.

In some embodiments, with respect to the method 2100, the act of determining the first part of the product that is different in the first image and the second image comprises performing an image subtraction based on the first image and the second image to obtain a subtracted image.

In some embodiments, with respect to the method 2100, the act of determining the first part of the product that is different in the first image and the second image also comprises analyzing a distribution of non-zero pixel values in the subtracted image.

In some embodiments, with respect to the method 2100, the mask is created based on a result of the analysis of the distribution of the non-zero pixel values in the subtracted image.

In some embodiments, the method 2100 may further include determining a second part of the product that is different in the first image and the second image, and wherein the mask is created for also covering the image of the second part of the product.

In some embodiments, the method 2100 may further include storing the mask in a non-transitory medium in association with an identity of the product.

In some embodiments, the method 2100 may be performed in response to a processing unit processing a set of instructions stored in a processor-readable medium. In particular, the processor-readable medium includes a set of instructions, wherein an execution of the instructions by a processing unit will cause a method for to be performed, the method comprising:

receiving a first image of a product captured during a first testing of the product;

receiving a second image of the product captured during a second testing of the product; determining a first part of the product that is different in the first image and the second image; and creating a mask for covering an image of the first part of the product.

Script Generator

Figure 22:
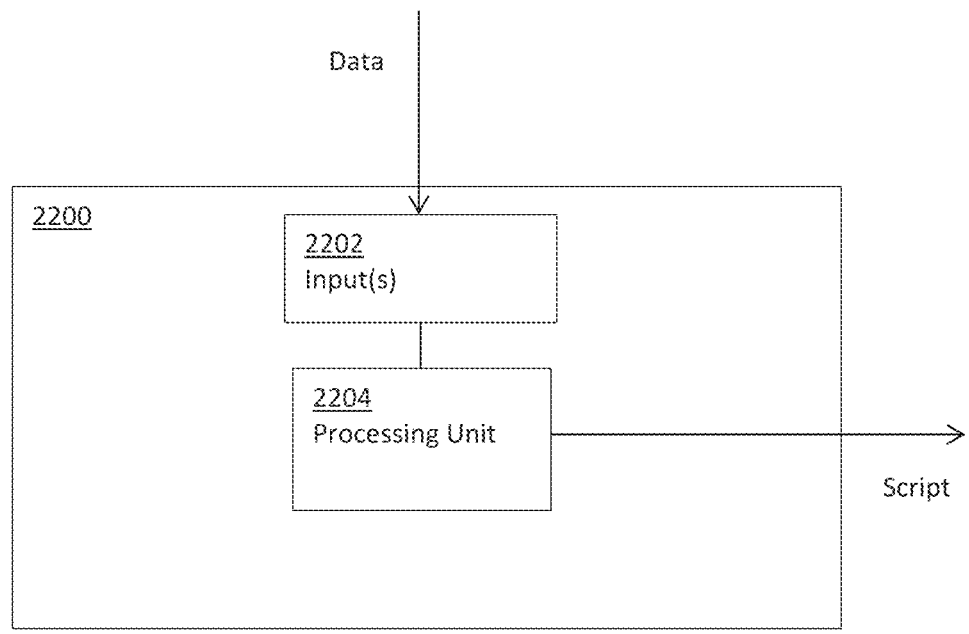
FIG. 22 illustrates a component of a product testing system.

As discussed, in some embodiments, the product testing machine 1540 is configured perform machine-based product testing based on a script, wherein the script is based on a previous testing performed by a tester. In some embodiments, the system 10 may further include a component configured to generate the script. FIG. 22 illustrates an apparatus 2200, which is a component of an electronic product testing system, wherein the component is configured to create a script for execution by a product testing device. The component 2200 may be a processing unit. Also, in some embodiments, the apparatus 2200 itself may be considered as a component of a product testing device. In addition, in some embodiments, the apparatus 2200 may be implemented as a part of the product testing machine 1540, or as a module that is communicatively coupled to the product testing machine 1540. As shown in the figure, the apparatus 2200 includes: an input 2202 configured to receive first data regarding a first tracked action performed while testing a first product; and a processing unit 2204 configured to create a script based on the first data, wherein the script is electronically executable by a product testing machine to perform machine-testing of a second product, the second product having at least one feature that is different from the first product.

Optionally, the apparatus is a part of the product testing machine.

Optionally, the input 2202 is also configured to receive second data regarding a second tracked action performed while testing the first product, and wherein the processing unit 2204 is configured to create the script based also on the second data.

Optionally, the first tracked action was for testing a first feature of the first product, and the second tracked action was for testing a second feature of the first product.

Optionally, the first tracked action was for testing a feature of the first product by a first tester, and the second tracked action was for testing the feature of the first product by a second tester.

Optionally, the first data indicates a first period between the first tracked action and another tracked action performed by the first tester while testing the feature of the first product; wherein the second data indicates a second period between the second tracked action and another tracked action performed by the second tester while testing the feature of the first product; and wherein the processing unit 2204 is configured to select a shorter one of the first period and the second period for inclusion in the script.

Optionally, the first data is stored in a first file, the second data is stored in a second file, and wherein the processing unit is configured to create the script by combining the first data and the second data.

Optionally, the apparatus 2200 further includes a non-transitory medium configured to store the script for access by the product testing machine.

Optionally, the first tracked action comprises a tracked cursor movement, a tracked object selection, a typing of a text, an inputting of a key, or an outputting of a voice.

Figure 23:
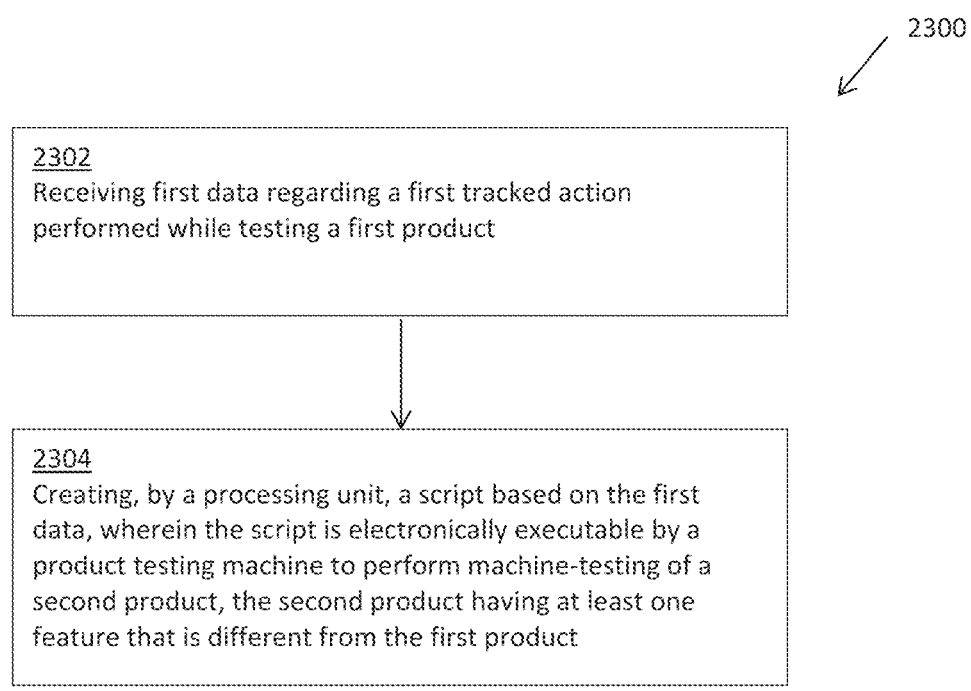
FIG. 23 illustrates a method for use in product testing.

FIG. 23 illustrates a method 2300 in accordance with some embodiments. The method 2300 is a processor-implemented method for product testing. In particular, the method 2300 is for creating a script for execution by a product testing machine to perform machine-based product testing. The method 2300 may be performed by the system 10 of FIG. 12. In one implementation, the method 2300 may be performed by the apparatus 2200 of FIG. 22. As shown in the figure, the method 2300 includes: receiving first data regarding a first tracked action performed while testing a first product (item 2302); and creating, by a processing unit, a script based on the first data (item 2304). The script is electronically executable by a product testing machine (e.g., product testing machine 1540) to perform machine-testing of a second product, the second product having at least one feature that is different from the first product.

In some embodiments, with respect to the method 2300, the processing unit is a part of the product testing machine.

In some embodiments, the method 2300 may further include receiving second data regarding a second tracked action performed while testing the first product, and wherein the script is created based also on the second data.

In some embodiments, with respect to the method 2300, the first tracked action was for testing a first feature of the first product, and the second tracked action was for testing a second feature of the first product.

In some embodiments, with respect to the method 2300, the first tracked action was for testing a feature of the first product by a first tester, and the second tracked action was for testing the feature of the first product by a second tester.

In some embodiments, with respect to the method 2300, the first data indicates a first period between the first tracked action and another tracked action performed by the first tester while testing the feature of the first product; wherein the second data indicates a second period between the second tracked action and another tracked action performed by the second tester while testing the feature of the first product; and wherein the method further comprises selecting a shorter one of the first period and the second period for inclusion in the script.

In some embodiments, with respect to the method 2300, the first data is stored in a first file, the second data is stored in a second file, and wherein the script is created by combining the first data and the second data.

In some embodiments, the method 2300 may further include storing the script in a non-transitory medium for access by the product testing machine.

In some embodiments, with respect to the method 2300, the first tracked action comprises a tracked cursor movement, a tracked object selection, a typing of a text, an inputting of a key, or an outputting of a voice.

In some embodiments, the method 2300 may be performed in response to a processing unit processing a set of instructions stored in a processor-readable medium. In particular, the processor-readable medium includes a set of instructions, wherein an execution of the instructions by a processing unit will cause a method for to be performed, the method comprising: receiving first data regarding a first tracked action performed while testing a first product; and creating, by the processing unit, a script based on the first data, wherein the script is electronically executable by a product testing machine to perform machine-testing of a second product, the second product having at least one feature that is different from the first product.

System with Product Testing Instruction Generator and Automated Testing Feature

In the above embodiments of FIG. 12, the system 10 is configured to track actions of tester(s) 14 performed while testing the product, and to utilize the tracked actions to generate data for an electronic file. The system 10 can then later access the electronic file, and use the data in the electronic file to perform machine-based testing of the product, or later versions of the product. In other embodiments, the data in the electronic file may be generated without tracking actions of tester(s) 14. Instead, the system 10 may include a product testing instruction generator configured to provide a user interface for allowing a user to create product testing instruction as the data for the electronic file. The system 10 may include a product testing device configured to perform automated product testing (e.g., machine-based product testing) based on the product testing instruction provided by the testing instruction generator.

Figure 24:
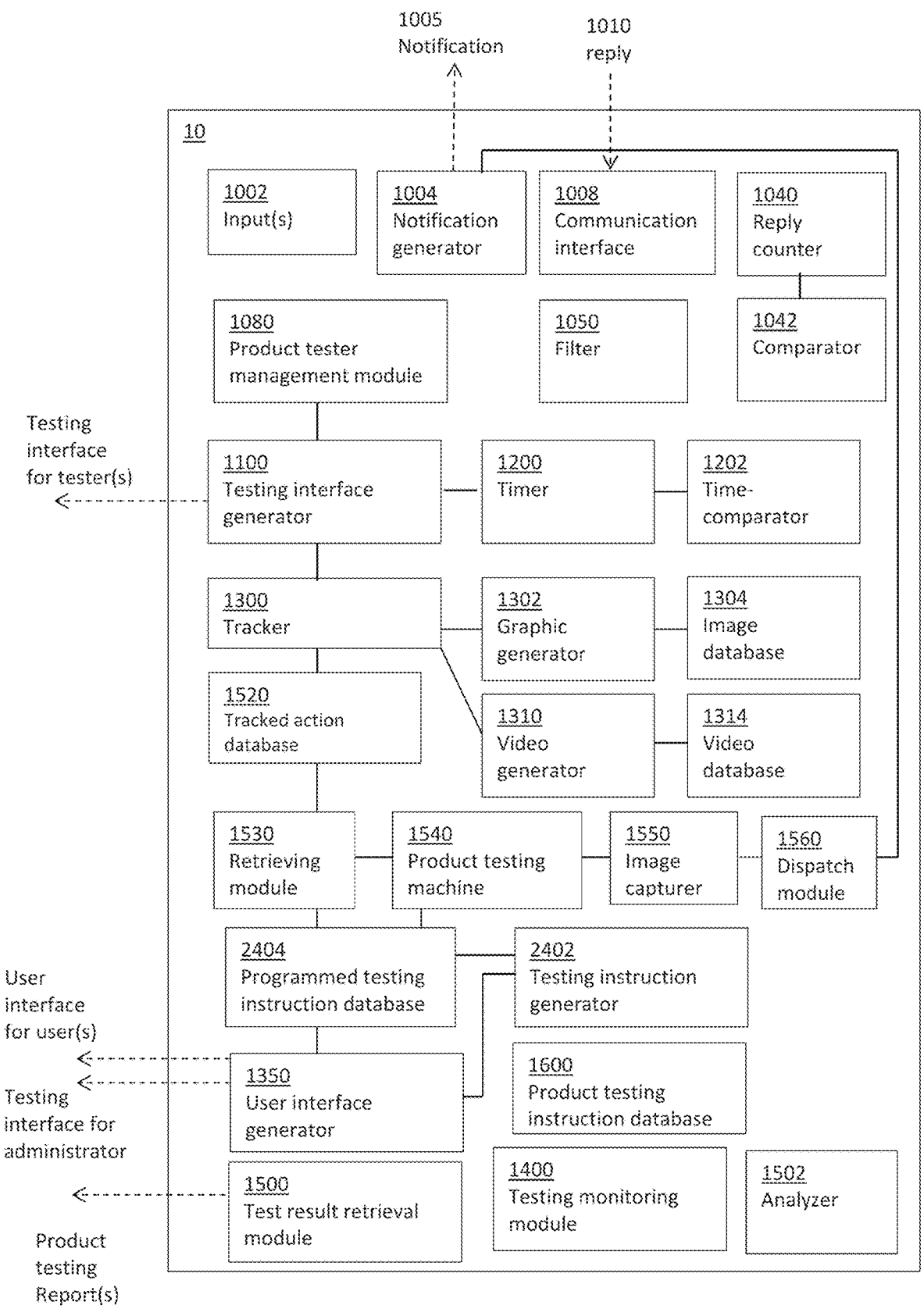
FIG. 24 illustrates a system for providing product testing.

FIG. 24 illustrates a system 10 for providing product testing, wherein the system 10 includes features for allowing automated testing of products. The system 10 is the same as the system 10 of FIG. 12, except that the system 10 also includes a testing instruction generator 2402. The testing instruction generator 2402 is configured to provide a user interface (e.g., via the user interface generator 1350) for allowing a user to provide input in order to generate product testing instruction in programmed format. Although the user interface generator 1350 is shown as a separate component from the testing instruction generator 2402, in other embodiments, the user interface generator 1350, or at least a part of which, may be implemented as a component of the testing instruction generator 2402. After the product testing instruction is generated using the testing instruction generator 2402, it is stored in an electronic file in the programmed testing instruction database 2404. When testing a product, the retrieving module 1530 retrieves the electronic file from the programmed testing instruction database 2404, and the product testing device 1540 then performs product testing based on the testing instruction in the electronic file. In some embodiments, the testing instruction generator 2402 and the product testing device 1540 are implemented as parts of an electronic product testing system.

In some embodiments, the product testing device 1540 may include a processing unit configured to perform testing of a product by simulating human actions based on the product testing instruction in the electronic file stored in the programmed testing instruction database 2404. For examples, the processing unit may be configured to move a cursor without input from a cursor control, make a selection of an object without input from a cursor control, type a text in a field without input from a keyboard, etc., or any combination of the foregoing.

Also, in some embodiments, the processing unit of the product testing device 1540 may include an interpreter configured to interpret the product testing instruction in the electronic file. In one implementation, the interpreter is configured to identify pre-defined words (e.g., commands) such as action identifiers and object identifiers, and the processing unit of the product testing device 1540 then executes a corresponding function or routine to perform a task to test the product based on the interpreted words. The processing unit of the product testing device 1540 may include a selector that is configured to select the function or routine based on a map (e.g., a table) that maps or associates pre-defined words with respective functions or routines.

In other embodiments, the system 10 may include a script generator configured to generate a script based on the product testing instruction in the electronic file. In such cases, the processing unit is configured to run the script for testing the product.

In some embodiments, the processing unit of the product testing device 1540 is configured to test multiple features of the product based on the product testing instruction in the electronic file. In such cases, the electronic file may contain product testing instruction configured to cause the product testing device 1540 to perform multiple tasks for testing the multiple features. In other embodiments, the processing unit of the product testing device 1540 may be configured to test different features of the product based on different product testing instruction in different respective electronic files. For example, the processing unit of the product testing device 1540 may be configured to test a first feature of the product based on the product testing instruction in a first electronic file, and to test a second feature of the product based on product testing instruction in a second electronic file.

In some embodiments, the user interface provided by the testing instruction generator 2402 comprises a graphical user interface. The graphical user interface may provide a first set of items and a second set of items for user-selection, wherein the first set of items comprises a plurality of action identifiers, and the second set of items comprises a plurality of object identifiers. An action identifier may identify an action to be performed by the product testing device 1540, and an object identifier may identify an object on which the action is to be performed by the product testing device 1540. By means of non-limiting examples, an action identifier may identify a click action, a fill action, a type action, a press key action, a hover action, a dropdown select action, a checkbox check action, a checkbox uncheck action, a refresh action, a navigate action, a new tab action, a close tab action, a scroll cation, a drag and drop action, or a click and hold action. Also, by means of non-limiting examples, an object identifier may identify a button, a field, a dropdown menu, a dropdown option, a link, an icon, a checkbox, a header, a window, a text, a modal, or an user interface element.

In some embodiments, the product testing instruction in the electronic file has a data structure that associates an action identifier with a corresponding object identifier: The action identifier identifies an action to be performed by the testing device, and the object identifier identifies an object on which the action is to be performed by the testing device.

Also, in some embodiments, the database 2404 may be configured to store the electronic file (with the product testing instruction) in association with an identity of the product. The database 2404 may be one or more non-transitory mediums.

In some embodiments, the product testing device 1540 may include a checker configured to check if an element is visible after the processing unit of the product testing device 1540 performs a testing action. In the embodiments in which the product is a website or has a user interface, the element may be any user interface element, such as an icon, an button, a tab, a link, a graphic, etc. Also, in some embodiments, the checker of the product testing device 1540 may be configured to check if an element is not visible after the processing unit of the product testing device 1540 performs a testing action. The checker of the product testing device 1540 may also be configured to check if a specified page has loaded after the processing unit performs a testing action.

In some cases, the processing unit of the product testing device 1540 may implement the checker. Also, in some embodiments, the processing unit of the product testing device 1540 may be configured to check whether an item exists or not in a user interface of the product by: obtaining a first image that is associated with the testing of the product, obtaining a second image, and comparing the first and second images to determine if there is a match or not. The first image is based on a completion of a first task performed during the testing of the product. For example, the first image may comprise a first content of the product, the first content indicating a first result of a first task for testing the product. The second image may be a reference image that was obtained previously (e.g., via screen capture).

Figure 25A:
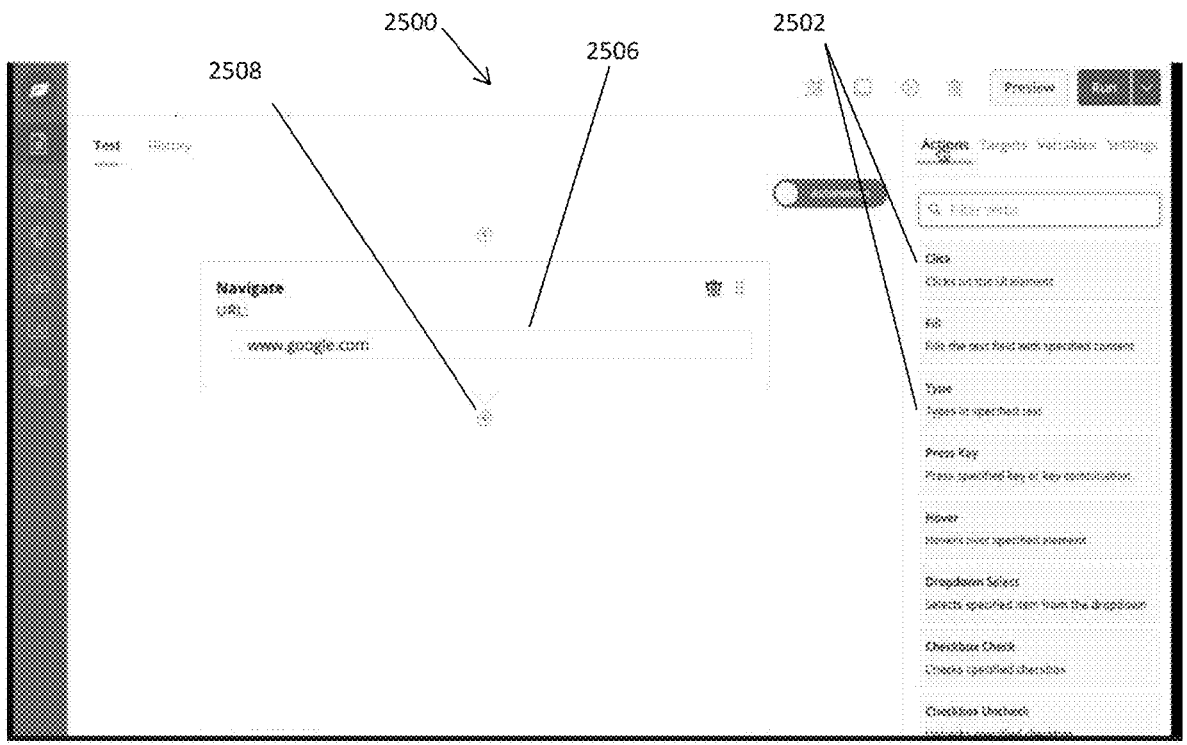
FIGS. 25A-25M illustrate an example of product testing instruction generation.

FIGS. 25A-25M illustrate an example of product testing instruction generation. FIG. 25A illustrates an example of a user interface 2500 provided by the testing instruction generator 2402. The user interface 2500 provides a list of items 2502 that are action identifiers for user to select. When one of the action identifiers is selected, a corresponding field appears that allows the user to enter an object identifier corresponding with the selected action identifier. In the illustrated example, the user has selected "navigate" as the action identifier. The user interface 2500 accordingly displays a field 2506 that allows the user to input an object identifier identifying the URL to navigate to. In the illustrated example, the user enters "www.google.com" as the URL to navigate to. The selection of the "Navigate" action identifiers, and the input of "www.google.com" in field 2506, has the result of prescribing the product testing device to navigate to URL: "www.google.com". As shown in the figure, the user interface 2500 further includes a task addition button 2508. If the user selects the button 2508, the user interface 2500 allows an additional task to be added.

Figure 25B:
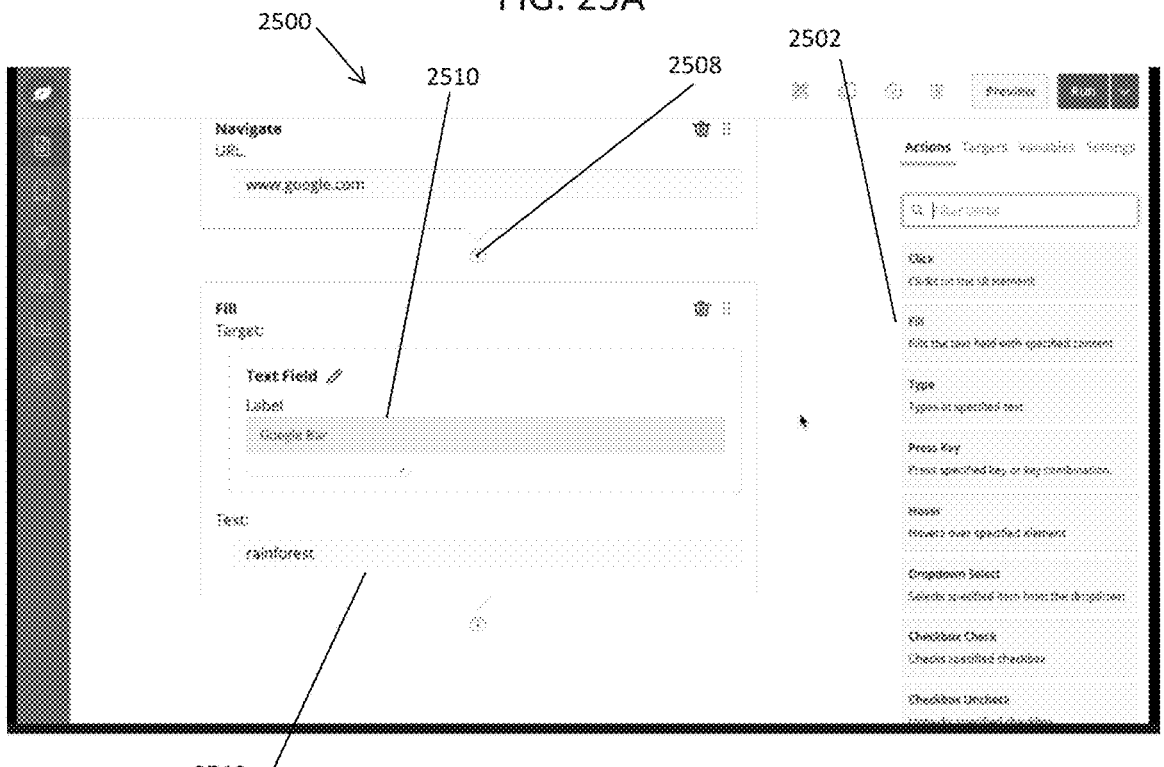

As shown in FIG. 25B, the user has clicked on the task addition button 2508 to indicate that the user wants to add an additional task. The user has also selected "Fill" from the list of action identifiers 2502. The user interface 2500 then displays a corresponding field 2510 that allows the user to enter a label of the text field in which to perform the fill action. In the illustrated example, the user enters "Google bar" as the text field label. This indicates to the system 10 that the fill action is to be performed within the Google bar. The user interface 2500 also provides a text field 2512 for allowing a user to enter the text that is to be used to fill in the "Google bar" label. In the illustrated example, the user has entered "rainforest" in the text field 2512. The selection of the "Fill" action identifiers, and the input of "Google Bar" in field 2510 and "rainforest" in field 2512, has the result of prescribing the product testing device to perform a fill action by typing "rainforest" in the Google Bar text field.

Figure 25C:
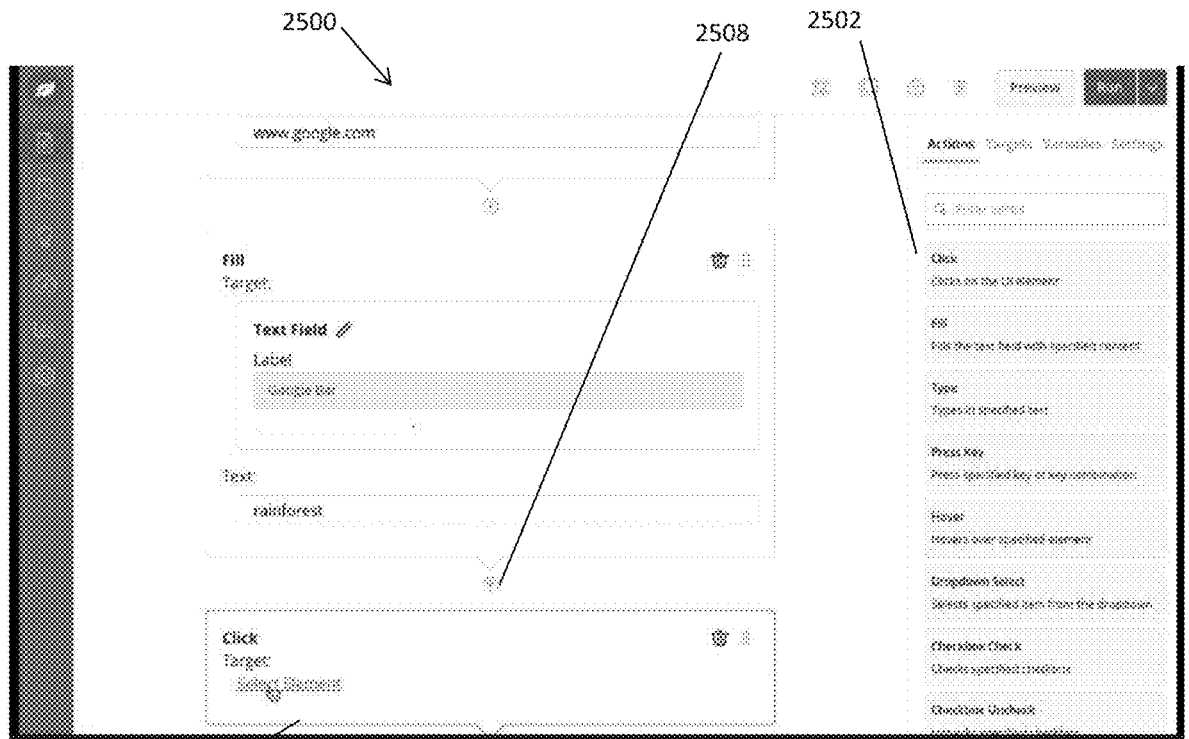
Figure 25D:
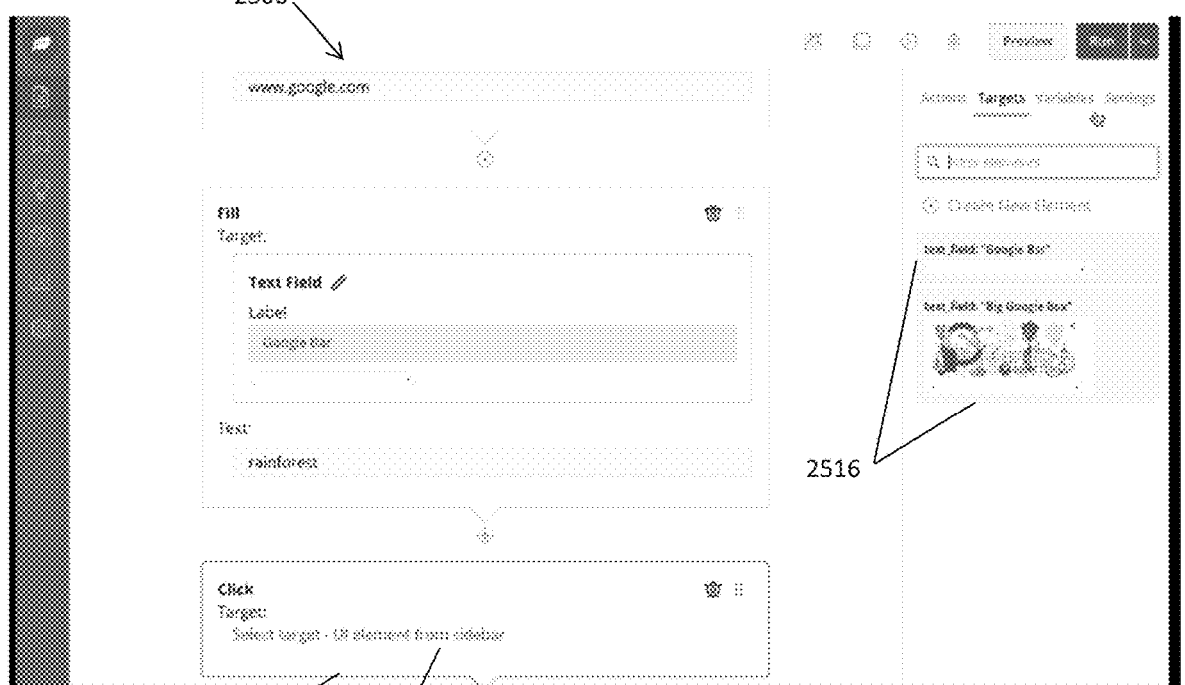

As shown in FIG. 25C, the user next clicks on the task addition button 2508 to create a new task, and selects the action identifier 2502 "Click" as the action for the new task. The user interface 2500 then provides a field 2514 for allowing the user to enter information regarding the "click" action. In the illustrated example, the field 2514 includes an option for allowing the user to select an existing element on which the "click" action is to be performed by the product testing device. If the user clicks on the "select element" option, the user interface 2500 then displays a list of existing elements 2516 (FIG. 25D), and displays a message 2518 instructing the user to select an element from the list.

The elements 2516 are objects created previously by user(s). In the illustrated example, the user wants the product testing device to click on a "Google search button" after entering "rainforest" in the Google Bar. However, such "Google search button" has not yet been created. Accordingly, the user will need to use the user interface 2500 to create such "Google search button" so that the product testing device can identify such button when performing automated product testing on the product.

Figure 25E:
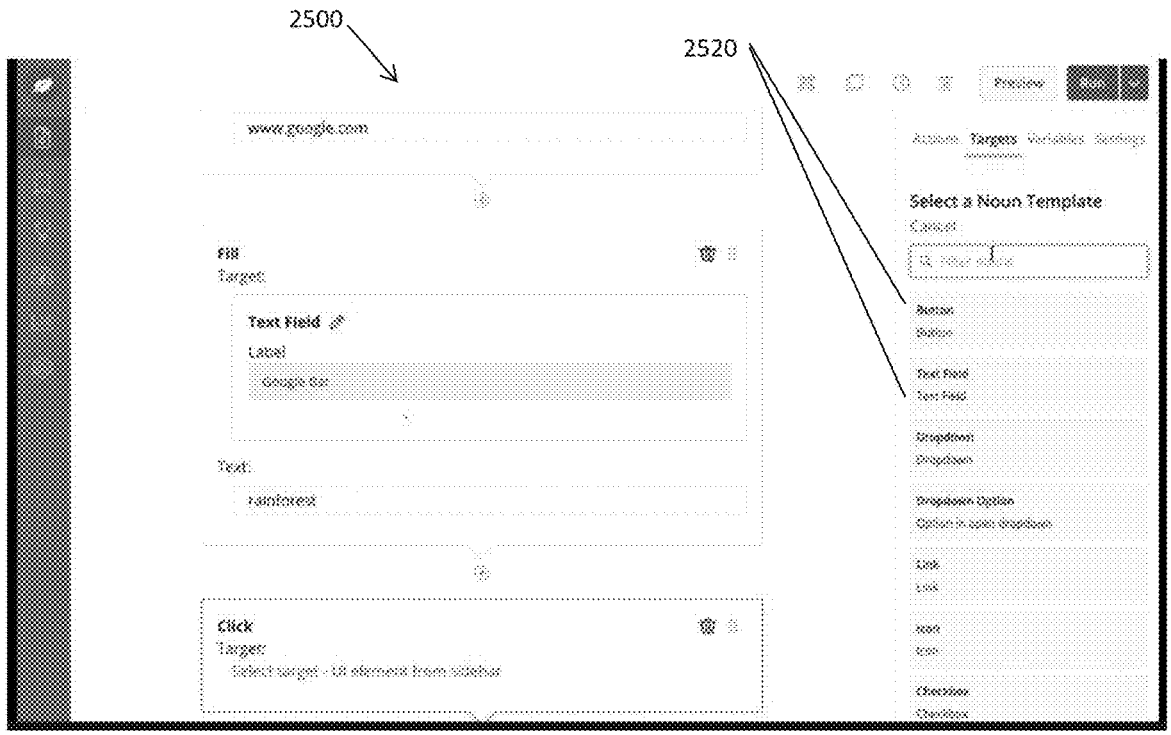
Figure 25F:
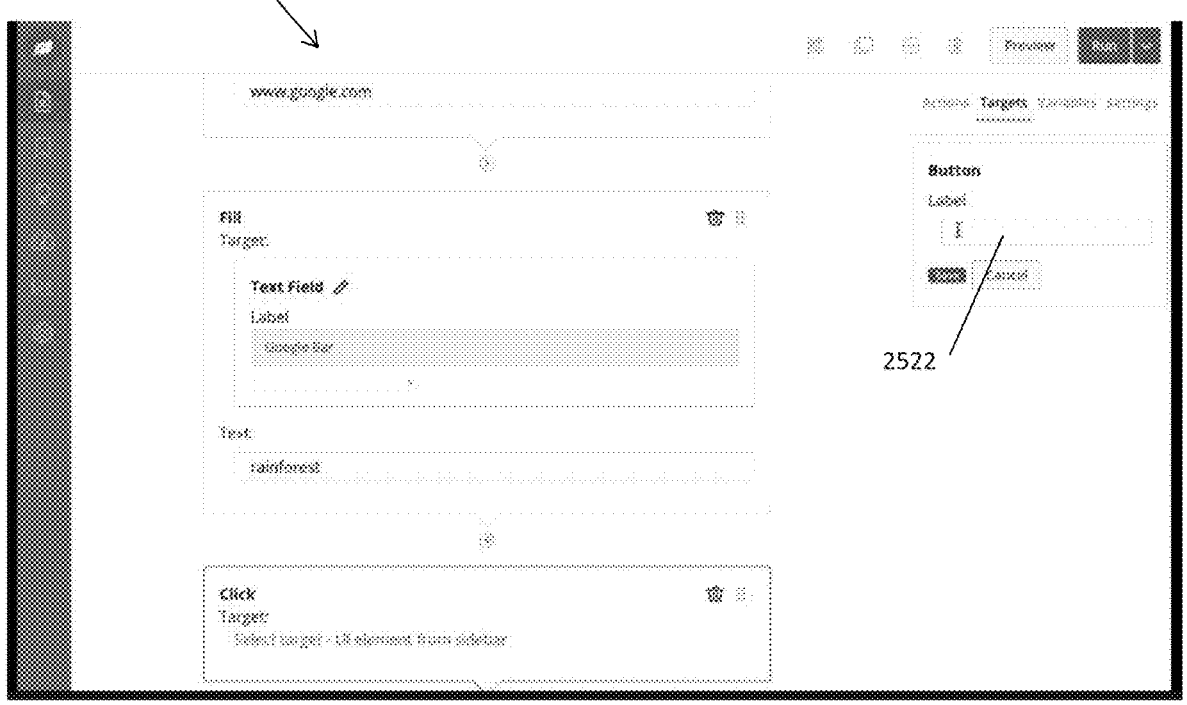
Figure 25G:
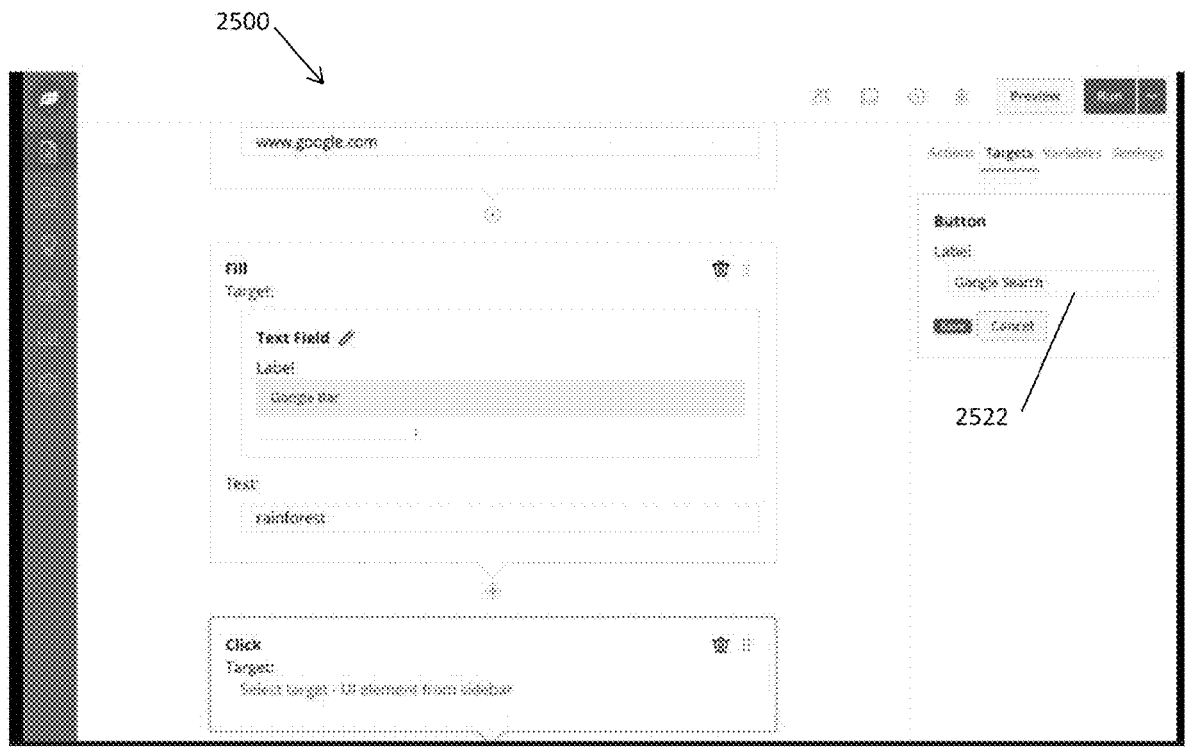
Figure 25H:
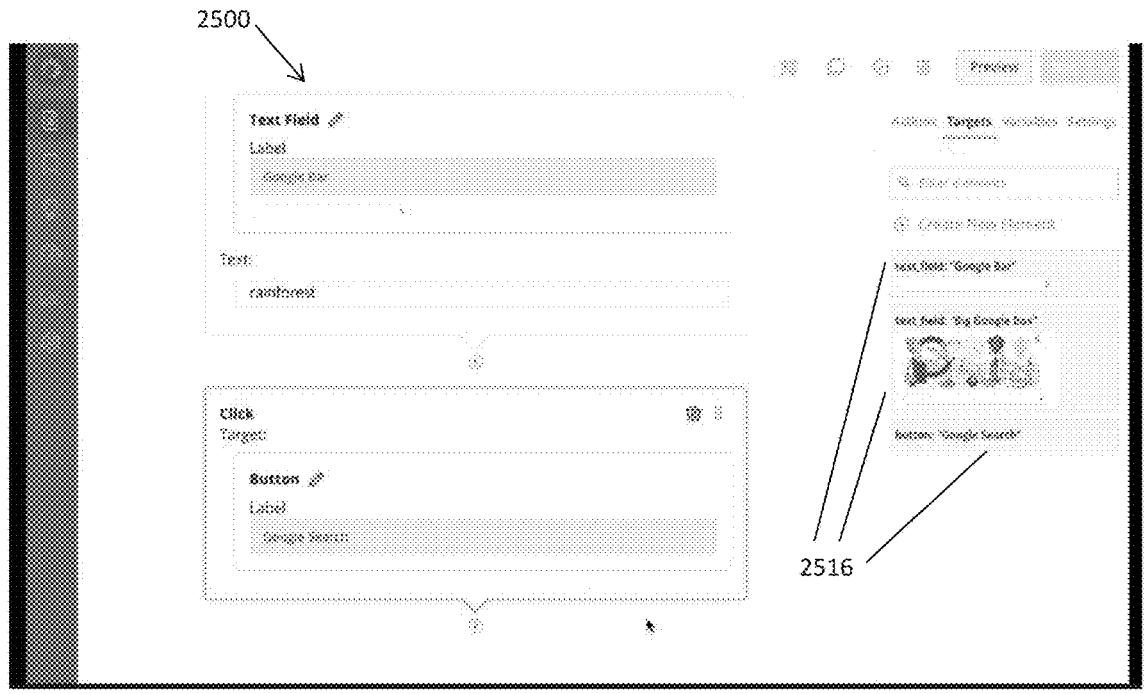
Figure 25I:
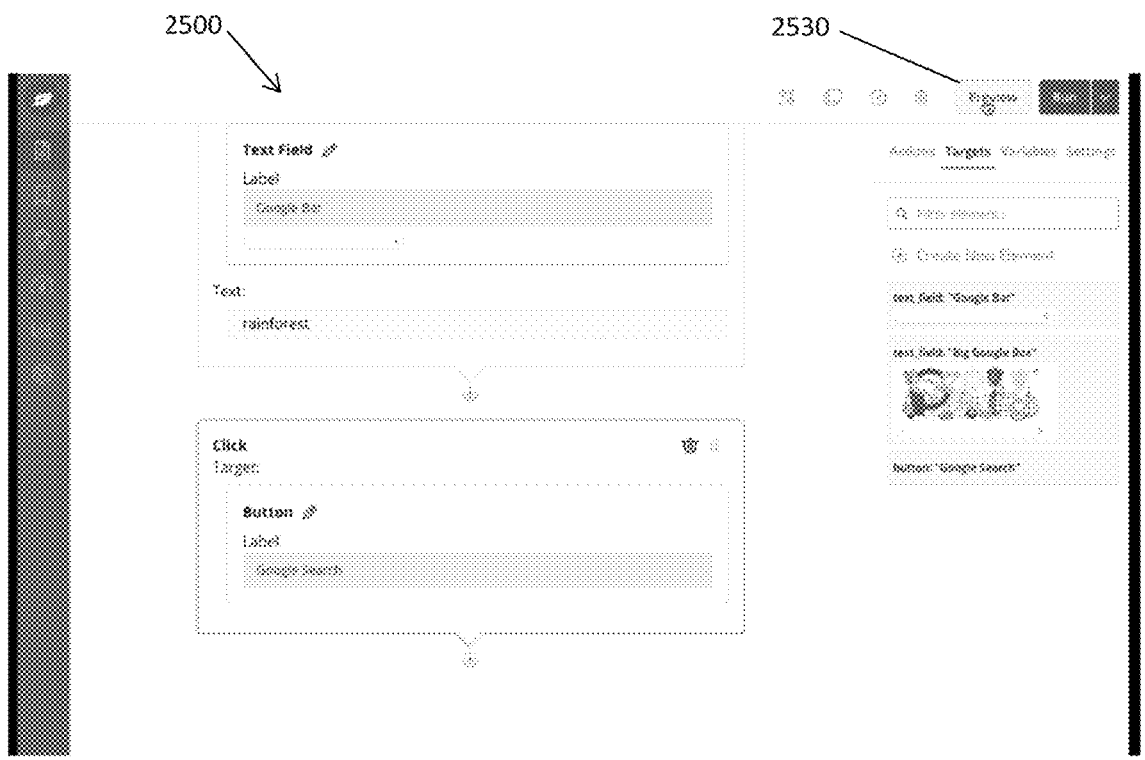
Figure 25J:
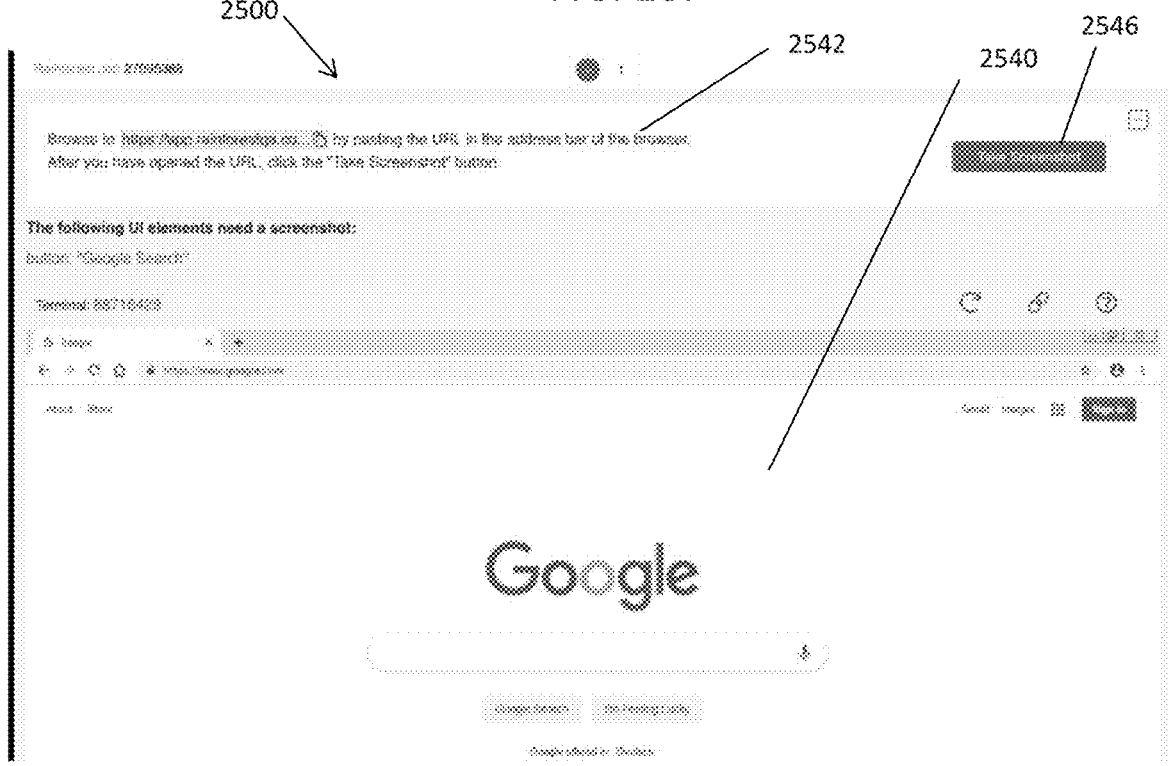
Figure 25K:
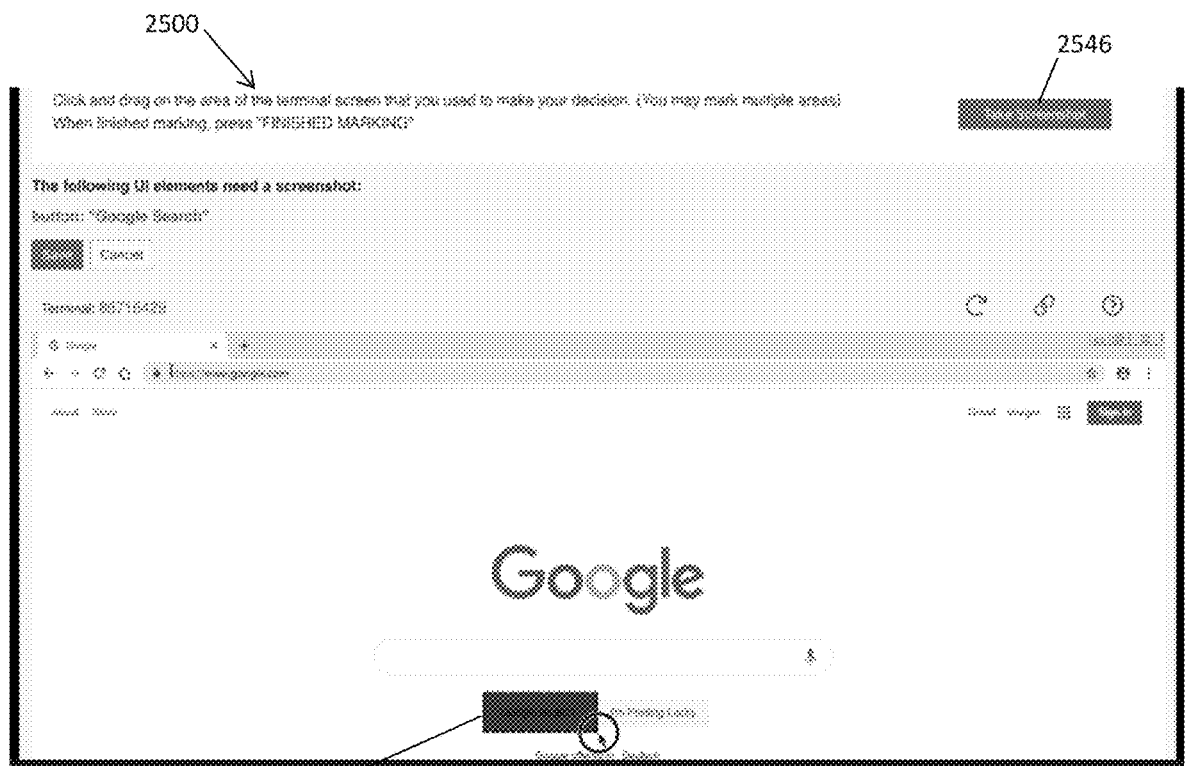
Figure 25L:
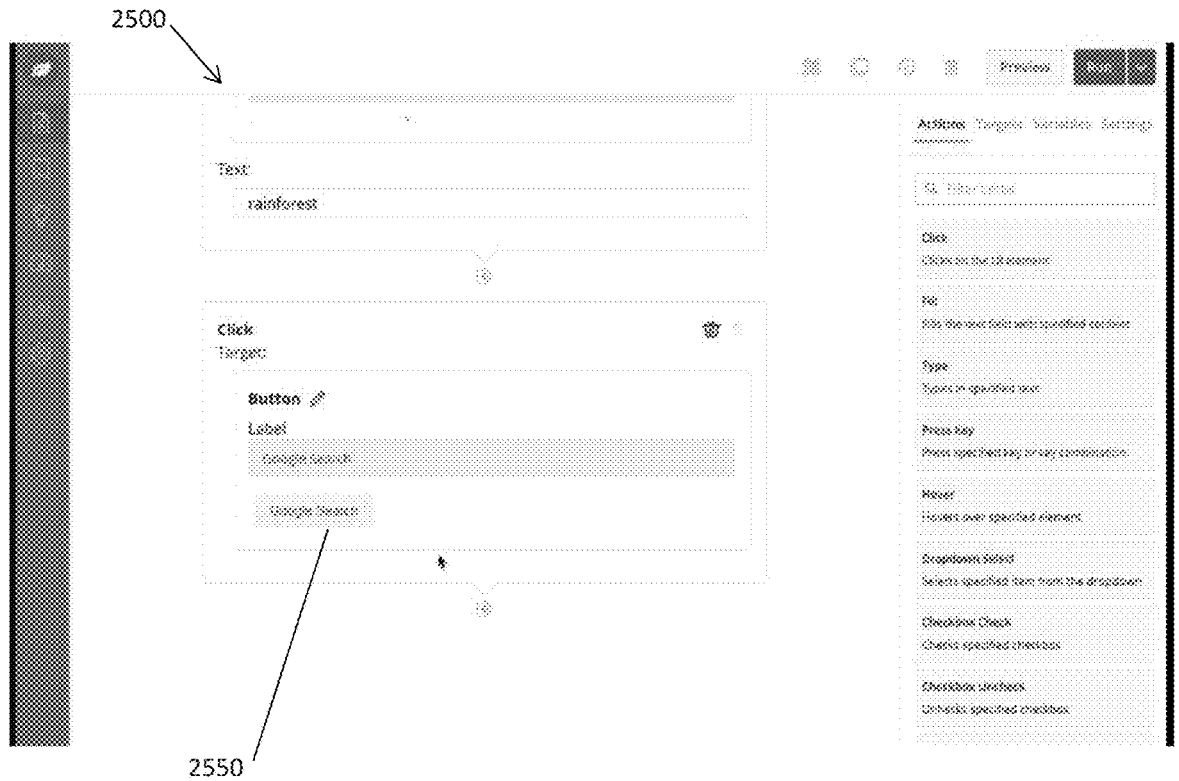

FIGS. 25E-25L illustrates how the user interface 2500 can be utilized to create the object "Google search button". As shown in FIG. 25E, to create the object "Google search button", the user first selects a noun template from a plurality of available none templates 2520. In the illustrated example, the user selects a "Button" template to indicate that the object to be created is a button (FIG. 25F). The user interface 2500 then displays a field 2522 for allowing a user to enter a name for the button to be created. As shown in FIG. 25G, the user enters the name "Google Search" in field 2522 as the name of the button to be created. After the name of the button has been entered, the name of the object appears in the list of existing elements 2516 (FIG. 25H). Next, the user needs to input an image of the Google Search button for association with the created object name "Google Search", so that the product testing device will know what the Google Search button looks like. For such purpose, the user, can select the "Preview" button 2530 at the user interface 2500 (FIG. 25I). When the "Preview" button 2530 is selected, the system 10 then executes the product testing instruction entered so far in the user interface 2500, and will identify any missing element. In the illustrated example, when the user click on the "Preview" button 2530, the system 10 first navigates to the URL "www.google.com", and then finds the Google Bar to enter "rainforest", based on the first two tasks entered in the user interface 2500. The system 10 then attempts to click on a button that is labeled "Google Search". However, because there is no image of the "Google Search" button, the system 10 is unable to identify such button in the "preview" run. The user interface 2500 accordingly displays an image 2540 of the last page where the "preview" run fails, along with a message 2542 instructing the user to take a screen shot of the missing element, which is the "Google Search" button (FIG. 25J). The user then selects the "take screenshot" button 2546, which allows the user to perform a screen capture of the Google search button by highlighting the area 2548 in the screen containing such button (FIG. 25K). After the image of the Google Search button has been captured, the system 10 then associates it with the created name "Google Search". As shown in FIG. 25L, the captured image 2550 of the Google Search button now appears as the object on which the "click" action is to be performed. This way, when the product testing device executes the testing instruction, it will search for the image 2550 of the Google Search button, and click on the button with such image.

In the above example, the user interface 2500 is used to generate product testing instruction, wherein each instruction is designed to instruct the product testing device to perform a task that is normally performed by human.

Figure 25M:
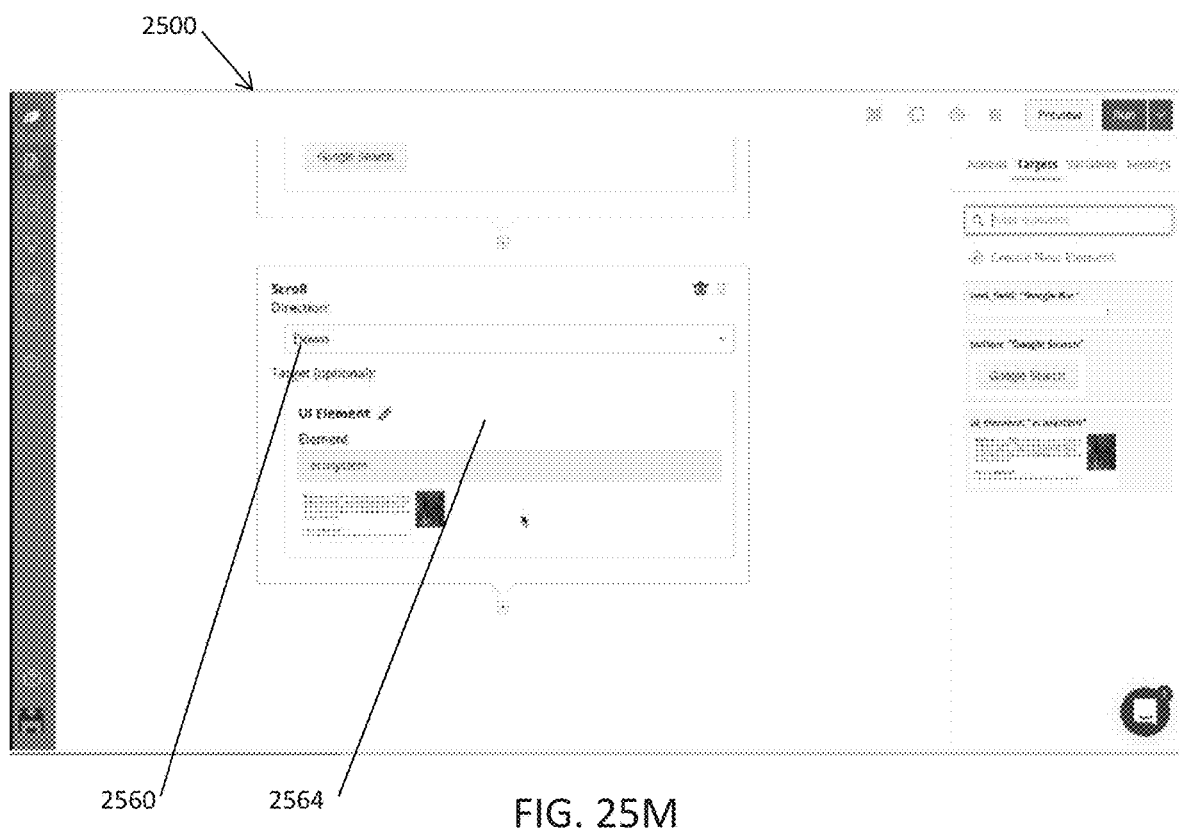

For example, the "navigate" task, "fill" task, and "click" task are normally performed by human when operating a computing terminal to interact with a website. Accordingly, the product testing device is simulating human actions based on the product testing instruction. In other embodiments, the user interface 2500 may generate other types of product testing instruction. For example, in other embodiments, the user interface 2500 may allow the user to assign "Checking" task to thereby create product testing instruction for instructing the product testing device to check certain item. Following the above example, the user may select "Scroll" action identifier in the user interface 2500, which will cause a directional control 2560 to appear (FIG. 25M). The "scroll" action is for instructing the product testing device to view towards a certain direction (e.g., up or down) in a displayed page. Accordingly, the user can select either "Up" or "Down" using the directional control 2560. As shown in the figure, the user interface 2500 also provides a field 2564 that allows the user to input certain object (or target). The object may be any element, such as an icon, a tab, a text, an image, a graphic, etc., that may be displayed in a page. In the illustrated example, the user already used the user interface 2500 to screen-capture an image from a screen, and labeled it "ecosystem". In the field 2564, the user selected such element as the object. The selection of the "Scroll" action identifier, the selection of the "down" direction, and the input of the "ecosystem" image together will result in the product testing device scrolling downward to look for an "ecosystem" image. The product testing device may perform image analysis, such as image comparison to determine if the "ecosystem" image exists or not in a page. In one implementation, the product testing device 1540 may determine that a certain object exists if there is a 100% pixel (or higher than 80%) match between the image of the product and the image of the object provided in the product testing instruction.

The product testing device 1540 is not limited to checking whether an object (e.g., a user interface element of a product) exists. In other embodiments, the product testing device 1540 may be configured to provide other types of checks. For example, in other embodiments, the product testing device 1540 may be configured to determine if an object (e.g., a user interface element of a product) disappears or not. In one implementation, if the product testing device 1540 cannot find a 100% pixel match between an image of the product and the image of the object provided in the product testing instruction, then the product testing device 1540 may determine that the object has disappeared.

As another example, the product testing device 1540 may check to see if a specified page has loaded or not. In one implementation, the product testing device 1540 may pause the execution of testing instruction, and may wait for a page to load. Once a page has been loaded, the product testing device 1540 may then compare the loaded page with an object (e.g., an image of the page, or an image of a part of the page) input in the testing instruction. If there is a match, then the product testing device 1540 may determine that the page has loaded. In some embodiments, the technique described with reference to FIG. 15 may be utilized by the product testing device 1540 to determine whether an element exists in a page or not, and/or to determine whether a page has been loaded. In some cases, if a page has a changing element (e.g., a movie, an animated GIF, etc.), or if a page does not fully load, the product testing device 1540 may wait for a prescribed duration (e.g., 30 seconds). After the prescribed duration has lapsed, the product testing device 1540 will then continue executing the product testing instruction and moves to the next product testing task. Furthermore, in some embodiments, the technique described with reference to FIG. 16 may be utilized by the product testing device 1540 to determine whether an element exists or not in a page with changing element.

In another example, the product testing device 1540 may be configured to check to see if a certain text exists in a page. In one implementation, the product testing device 1540 may perform a word search in a page to look for a certain text. The text may be a word, a symbol, a number, etc. Also, in some embodiments, the product testing device 1540 may be configured to check to see if a certain number in a page is equal to a value, less than a value, or more than a value. In other embodiments, the product testing device 1540 may be configured to check to see if a list in a page is sorted alphabetically or numerically.

It should be noted that the actions performed by the product testing device based on the user's action identifiers inputted via the user interface 2500 are not limited to the examples described. In other embodiments, the user interface 2500 of the testing instruction generator 2402 may provide other action identifiers for selection by the user to cause the product testing device to perform other actions. FIGS. 26A-26B illustrate other examples of action identifiers that may be provided by the user interface 2500 for selection or input by the user. In particular, the leftmost column of the table in FIGS. 26A-26B shows examples of a first list of items, which are action identifiers. The examples of the action identifiers are for a click action, a fill action, a type action, a press key action, a hover action, a dropdown select action, a checkbox check action, a checkbox uncheck action, a refresh action, a navigate action, a new tab action, a close tab action, a scroll cation, a drag and drop action, and a click and hold action. The middle column of the table in FIGS. 26A-26B describes the actions performed by the product testing device for the respective action identifiers. The rightmost column of the table provides some information regarding the use of the respective action identifiers. For example, for the "click" action identifier, it is indicated that use of such action identifier would require an identification of a user interface element (e.g., button, icon, tab, etc.), so that when the product testing device processes such command, the product testing device will know what element to click on. The user interface elements on which the actions are to be performed by the product testing device is not limited to the above examples. FIG. 26C illustrates examples of object identifiers that may be provided by the user interface 2500 for selection or input by the user. In particular, the leftmost column of the table in FIG. 26C shows examples of a second list of items, which are object identifiers for identifying objects such as user interface elements. The examples of the object identifiers are for a button, a field, a dropdown menu, a dropdown option, a link, an icon, a checkbox, a header, a window, a text, a modal, and other user interface element.

Figure 27A:
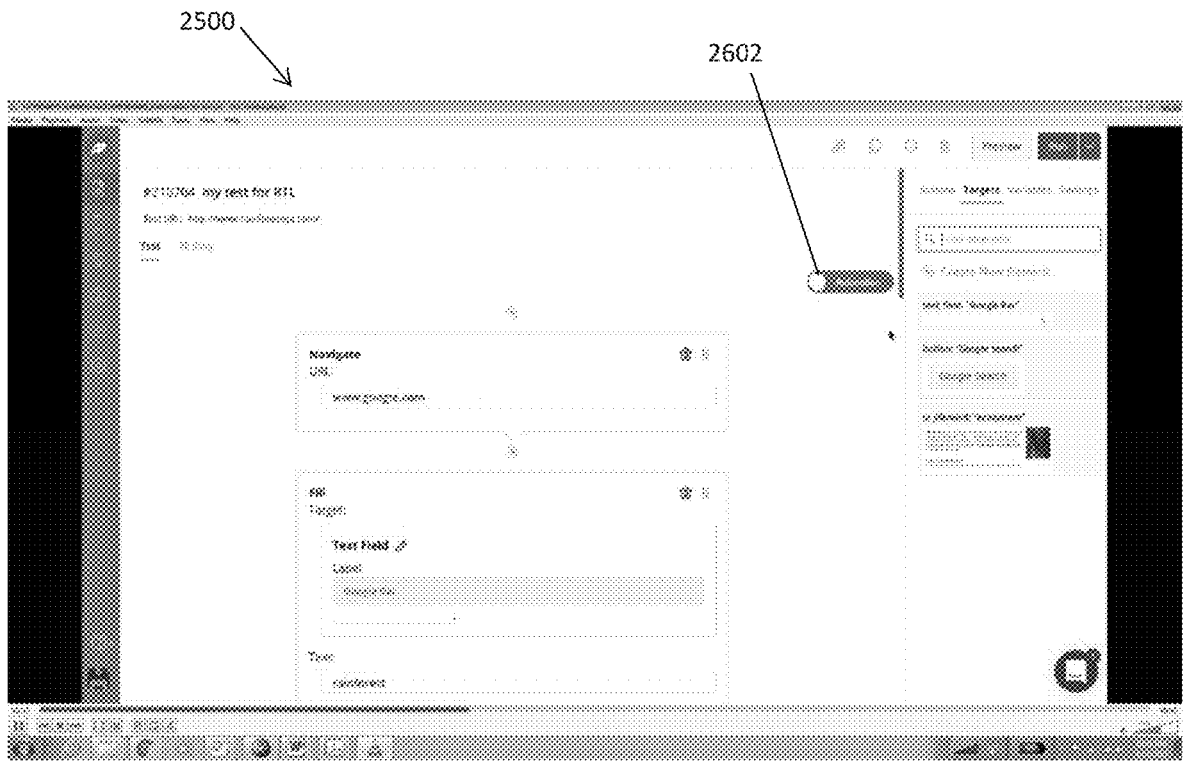
FIGS. 27A-27B illustrates an example of a user interface allowing a user to switch between viewing product testing instruction in plain language and viewing product testing instruction in programming format.
Figure 27B:
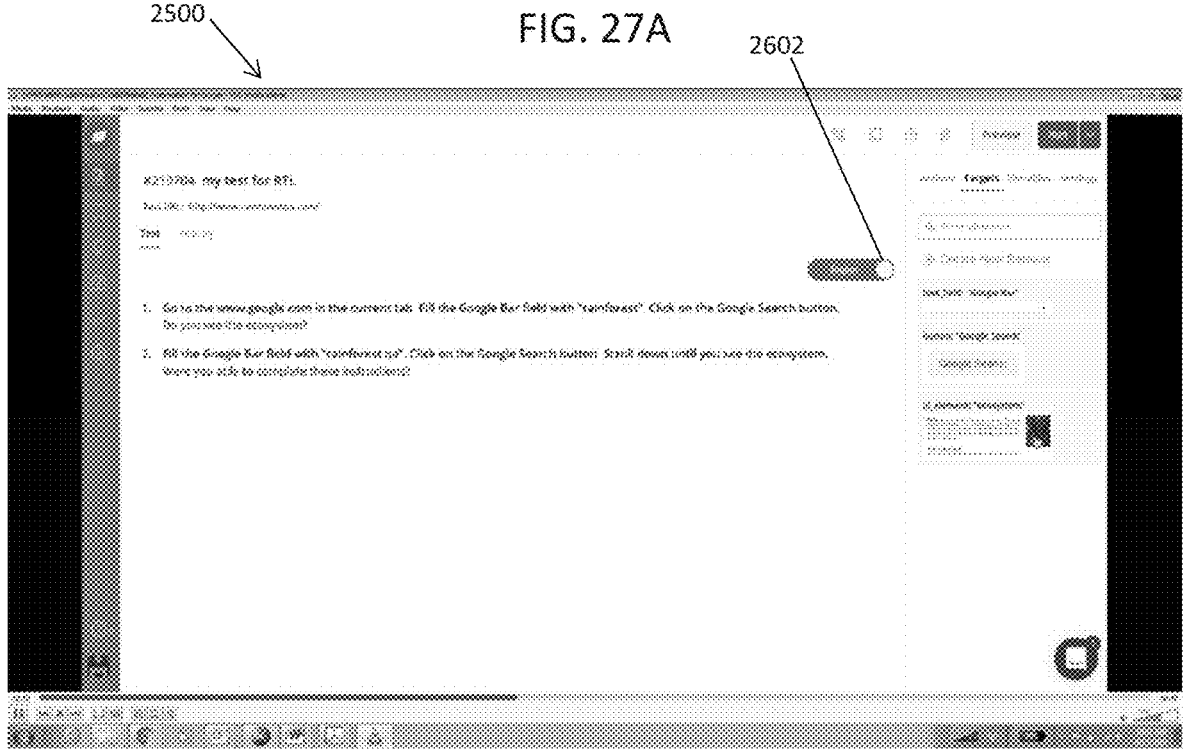

In some embodiments, the product testing instruction inputted by the user using the user interface 2500 may be selectively displayed in at least two different formats. For example, in some embodiments, the testing instruction generator 2402 may comprise a control for allowing a user to select between viewing the product testing instruction in plain language or viewing the product testing instruction in a programming format. FIGS. 27A-27B illustrate the user interface 2500 allowing a user to switch between viewing product testing instruction in plain language and viewing product testing instruction in programming format. The user interface 2500 includes a control 2602 that can be selectively manipulated by the user to prescribe viewing the product testing instruction in plain language or in programming format. In the illustrated example, the control 2602 is a button. When the button is selected (e.g., by placing the pointer over the button and clicking a mouse button or touchpad), the user interface 2500 switches the display format of the product testing instruction. As shown in FIG. 27A, the user interface 2500 is displaying the product testing instruction in programming format. When the control 2602 is manipulated by the user, the user interface 2500 then displays the product testing instruction in plain language like that shown in FIG. 27B. If the user manipulates the control 2602 again, then the user interface 2500 switches the displaying of the product testing instruction back to programming format like that shown in FIG. 27A. In some embodiments, the system 10 includes a translator configured to translate the product testing instruction in programming format to product testing instruction in plain language. In the illustrated example, the plain language is English. In other embodiments, the plain language may be Chinese, Japanese, Korean, Spanish, Italian, French, German, etc. In one implementation, the translator is configured to identify action identifiers and object identifiers, and create one or more sentences in plain language based on the action identifiers and object identifiers. For example, if the translator identifies the action identifier "navigate", and the object identifier "www.google.com", the translator may then create the sentence "Go to the www.google.com in the current tab." Also, in some embodiments, rules may be set up to associate action identifiers with respective sentence segments. In such cases, whenever an action identifier is identified, the translator then uses the corresponding rule to determine the sentence segment that corresponds with the action identifier.

For example, a rule may associate the action identifier "navigate" with the sentence segment "Go to the in the current tab". Also, each action identifier may have a corresponding object identifier. In the above example, the action identifier "navigate" has a corresponding object identifier "www.google.com", which is the target object on which the action is directed to. Accordingly, the translator may be configured to identify such correspondence, and assemble the sentence based on such correspondence. Following the above example, since the translator identifies the action identifier "navigate", the translator also identifies the object identifier "www.google.com" that corresponds with such action identifier, and assembles the sentence using the object identifier. In particular, the translator places the object identifier "www.google.com" in the above sentence segment "Go to the in the current tab" to form the complete sentence "Go to the www.google.com in the current tab."

In some embodiments, the product testing instruction in plain language may be provided to one or more human tester(s) 14 for instructing the human tester(s) 14 to perform product testing on the product. Alternatively or additionally, the product testing instruction in programming format may be interpreted and executed by the processing unit of the product testing device to perform testing of the product.

It should be noted that the user interface 2500 provided by the test instruction generator 2402 is not limited to the above example, and that the user interface 2500 may have other configurations in other embodiments. For example, in other embodiments, instead of providing the list of action identifiers, and the list of object identifiers as selectable objects, the user interface 2500 may provide a region for allowing the user to write commands using the action identifiers and the object identifiers (e.g., by typing them). Also, in some embodiments, the user may write the product testing instruction in plain language (like that shown in FIG. 27B), and the system 10 may include an interpreter configured to interpret the plain language, and to convert the plain language to programming language, and vice versa.

After the product testing instruction has been created using the user interface 2500, the product testing instruction is then saved in an electronic file in the programmed testing instruction database 2404. In some embodiments, each electronic file includes product testing instruction for testing a feature of the product. In other embodiments, each electronic file may include product testing instruction for testing multiple features of the product. The testing instruction stored in the database 2404 is a programmed testing instruction in the sense that it is created using pre-defined words (e.g., commands) such as action identifiers and object identifiers described herein. These pre-defined words collectively form a new programming language that is unique and specific for product testing.

In the illustrated embodiments, the electronic file in the database 2404 may be retrieved by the product testing device 1540, which executes the programmed testing instruction in the electronic file to perform product testing of a product. In the illustrated embodiments, the product testing device 1540 is configured to understand and interpret the programmed testing instruction in the electronic file. In particular, the product testing device 1540 includes a processing unit that is configured (e.g., designed, built, and/or programmed) to identify pre-determined words, such as action identifiers and object identifiers, which are unique and specific for product testing. As illustrated in the above example, because the programmed testing instruction is structured in a way that follows a flow sequence of human actions when interacting with the product, when the product testing device 1540 performs automated product testing on the product based on the programmed testing instruction, the product testing device 1540 simulates the flow sequence of human actions to interact with the product.

Figure 28A:
FIG. 28A-28B illustrates a system for providing product testing.
Figure 28B:
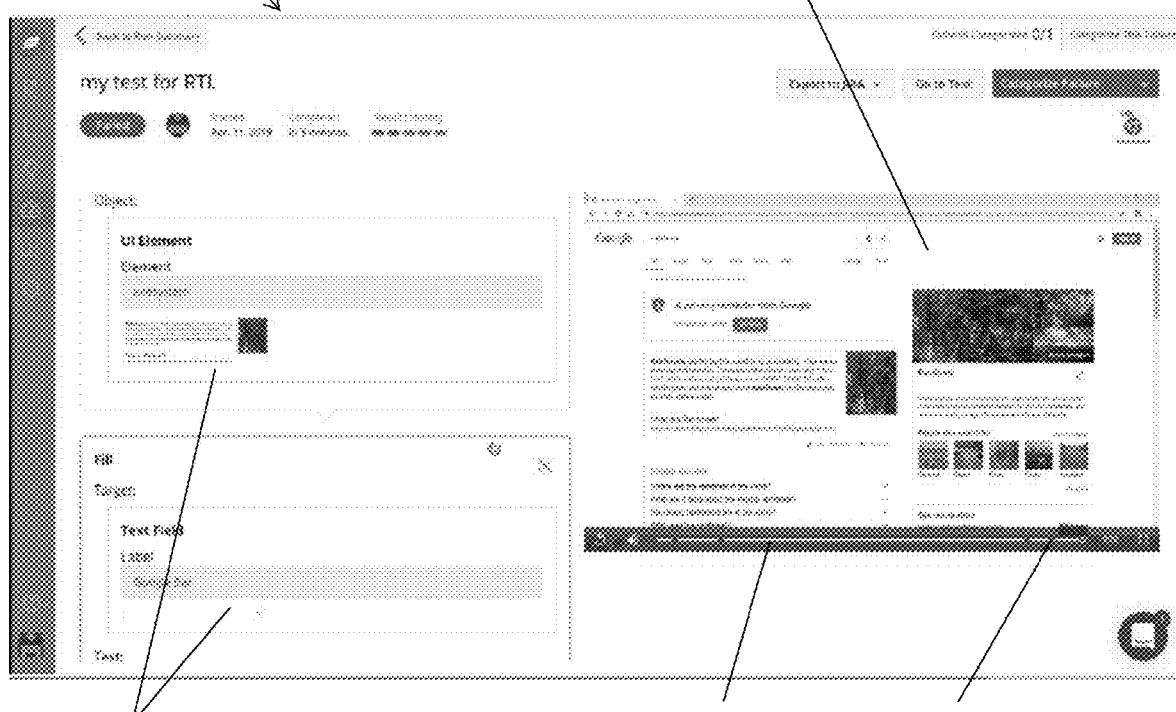

FIGS. 28A-28B illustrate examples of output 2800 provided by the electronic product testing system 10 based on the product testing performed by the product testing device 1540. As shown in FIG. 28A, the output 2800 of the electronic product testing system 10 may include a list of all the product testing that have been performed for the product. For each product testing performed, the output 2800 may include a result identifier 2802 indicating whether the test passed or failed. The result identifier 2802 may be color coded (e.g., with red indicating failed test, and green indicating passed test, etc.). A user may click on any of the test results shown in FIG. 28A, and the system 10 will display additional information regarding the selected test result, like those shown in FIG. 28B. In the illustrated example, the user has selected one of the test results for a particular test. Accordingly, the output 2800 provided by the electronic product testing system 10 includes a video 2810 for the selected test (FIG. 28B). The video 2810 displays a sequence of images indicating the interaction between the product testing device 1540 and the product being tested as the product testing device 1540 performs various tasks prescribed by the programmed product testing instruction on the product. For example, if a task requires the product testing device 1540 to navigate to www.google.com, the video 2810 will show the product testing device 1540 opening a browser, typing in "www.google.com" in the URL field, and navigating to the website. Similarly, if a task requires the product testing device 1540 to search for "rainforest" in a Google search bar, the video 2810 will show the product testing device 1540 typing in "rainforest" in the Google search bar, operating a pointer to move to the Google search button, and clicking the Google search button. The features in the video 2810 will correspond with the sequence of tasks assigned by the product testing instruction. The video 2810 may include a time bar 2812 with markings 2814 indicating where certain events occurred. By means of non-limiting examples, an event indicated by the marking 2814 may be a failure of a task, a beginning of a task, or an ending of a task. As shown in the figure, the output 2800 also includes the product testing instruction 2816 in programming format, showing the action and object involved in the particular task.

In some embodiments, the system 10 may include a tracker (which may be implemented as the tracker 1300) configured to track an interaction of the product testing device 1540 with the product. By means of non-limiting examples, the tracker may be configured to track a movement of a cursor operated by the product testing device 1540, track a selection of a user interface element (e.g., a tab, a selection of a button, a selection of an icon, a selection of a text, or any combination of the foregoing) by the product testing device 1540, track a text input by the product testing device 1540, etc. The tracked interaction of the product testing device 1540 with the product may be stored in a non-transitory medium in a data structure or format that allows the tracked interaction to be played back in a video like the video 2810 shown in FIG. 28B.

Figure 29:
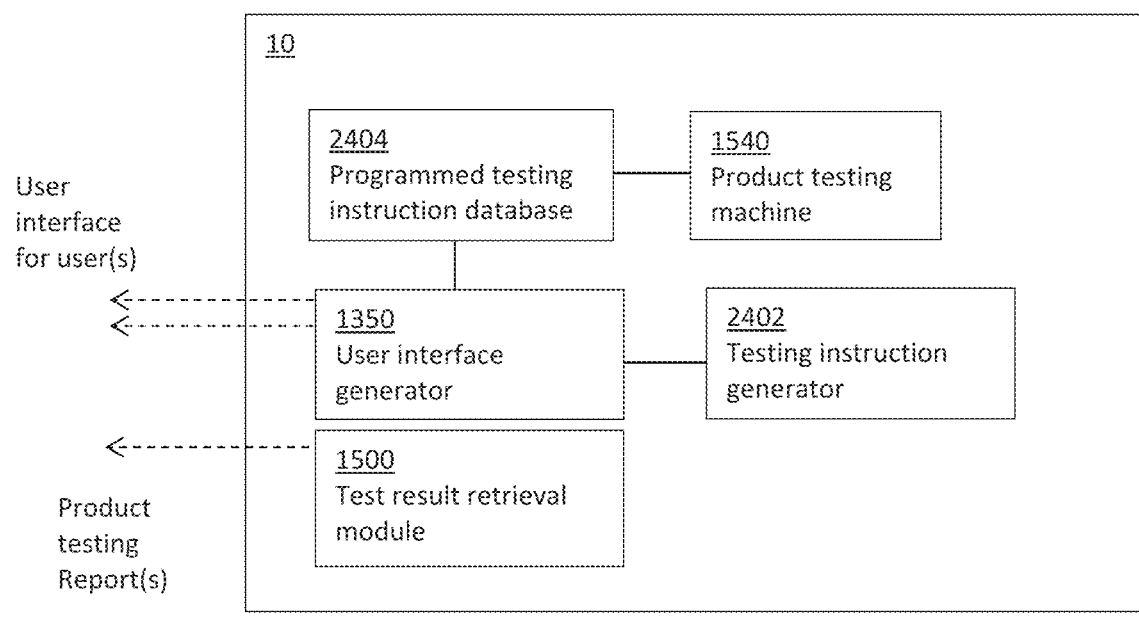
FIG. 29 illustrate examples of output provided by electronic product testing system.

In the above embodiments, the testing instruction generator 2402 is described as a part of the system 10 that also provides product testing performed by human tester(s) 14. In other embodiments, the testing instruction generator 2402 and/or the programmed testing instruction database 2404 may be a part of a product testing system 10 that does not provide any product testing performed by human tester(s) 14. An example of such system 10 is shown in FIG. 29. The system 10 includes the testing instruction generator 2402, and the programmed testing instruction database 2404. The system 10 also includes the product testing machine (device) 1540, the user interface generator 1350, and the test result retrieval module 1500. In some cases, the user interface generator 1350 may be considered as a part of the testing instruction generator 2404. During use, the user interface generator 1350 provides a user interface (e.g., the user interface 2500 described previously) for allowing user(s) to create testing instruction. The testing instruction is structured because it is created based on action identifiers and object identifiers that are provided by the testing instruction generator 2402 and/or that are understandable by the testing instruction generator 2402 and the product testing device 1540 based on predefined rules regarding how the action identifiers and object identifiers are to be interpreted and treated. The testing instruction is stored in an electronic file in the programmed testing instruction database 2404. The product testing device 1540 is configured to execute the electronic file to perform product testing of a product. The test result retrieval module 1500 is configured to retrieve testing results for presentation to user.

As illustrated in the above embodiments and examples, the testing instruction generator 2402 and the product testing device 1540 are advantageous because they allow automated product testing to be implemented intuitively and conveniently. The unique product testing programming language described herein allows different users to efficiently create product testing instructions, thereby saving significant time and resources. The product testing programming language described herein also obviates the need for user to write script or to write complex coding language. Furthermore, the unique product testing programming language provided by the testing instruction generator allows different users to individually and separately create product testing instructions based on a common set of rules so that the product testing device 1540 will understand the product testing instruction no matter who creates the product testing instruction. After product testing instruction has been created using the testing instruction generator 2402, the product testing instruction may be executed one or more times to test a product without using human tester. The product testing instruction may also be executed repeatedly to test different versions of a product. Accordingly, the testing instruction generator 2402 and the product testing device 1540 produce a real and concrete utility that makes a difference in the physical world.

Figure 30:
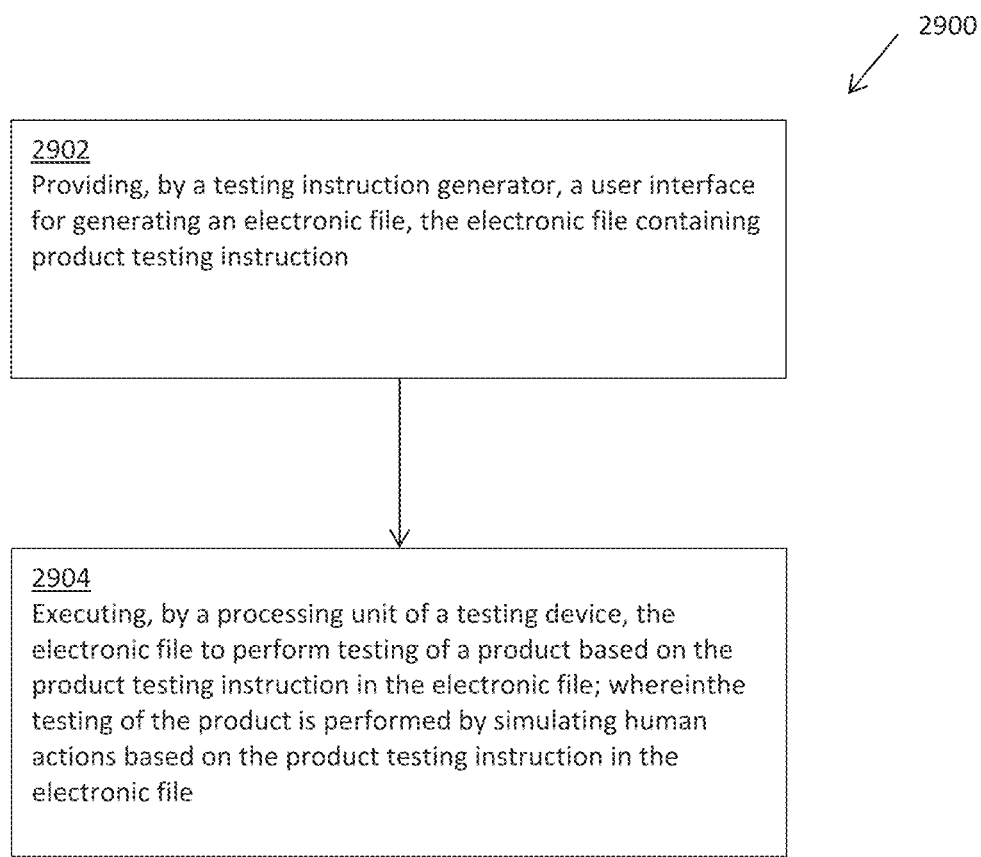
FIG. 30 illustrates a method for use in product testing.

FIG. 30 illustrates a method 2900 performed by an electronic product testing system. The method 2900 includes: providing, by a testing instruction generator, a user interface for generating an electronic file, the electronic file containing product testing instruction (item 2902); and executing, by a processing unit of a product testing device, the electronic file to perform testing of a product based on the product testing instruction in the electronic file (item 2904). In the illustrated embodiments, the testing of the product is performed by simulating human actions based on the product testing instruction in the electronic file.

Optionally, in the method 2900, the testing of the product comprises moving a cursor by the processing unit without input from a cursor control.

Optionally, in the method 2900, the testing of the product comprises making a selection of an object by the processing unit without input from a cursor control.

Optionally, in the method 2900, the testing of the product comprises typing a text in a field by the processing unit without input from a keyboard.

Optionally, the method 2900 further includes interpreting the product testing instruction in the electronic file.

Optionally, the method 2900 further includes generating a script by a script generator based on the product testing instruction in the electronic file.

Optionally, in the method 2900, the testing of the product comprises running the script, by the processing unit, to test the product.

Optionally, in the method 2900, the user interface comprises a graphical user interface, and the method also includes providing a first set of items and a second set of items for user-selection, wherein the first set of items comprises a plurality of action identifiers, and the second set of items comprises a plurality of objects.

Optionally, in the method 2900, one of the action identifiers identifies an action to be performed by the product testing device, and one of the object identifiers identifies an object on which the action is to be performed by the product testing device.

Optionally, in the method 2900, one of the action identifiers identifies a click action, a fill action, a type action, a press key action, a hover action, a dropdown select action, a checkbox check action, a checkbox uncheck action, a refresh action, a navigate action, a new tab action, a close tab action, a scroll cation, a drag and drop action, or a click and hold action.

Optionally, in the method 2900, one of the object identifiers identifies a button, a field, a dropdown menu, a dropdown option, a link, an icon, a checkbox, a header, a window, a text, a modal, or an user interface element.

Optionally, in the method 2900, the product testing instruction in the electronic file has a data structure that associates an action identifier with a corresponding object identifier:

Optionally, in the method 2900, the action identifier identifies an action to be performed by the product testing device, and the object identifier identifies an object on which the action is to be performed by the product testing device.

Optionally, in the method 2900, the action identifier identifies a click action, a fill action, a type action, a press key action, a hover action, a dropdown select action, a checkbox check action, a checkbox uncheck action, a refresh action, a navigate action, a new tab action, a close tab action, a scroll cation, a drag and drop action, or a click and hold action.

Optionally, in the method 2900, the object identifier identifies a button, a field, a dropdown menu, a dropdown option, a link, an icon, a checkbox, a header, a window, a text, a modal, or an user interface element.

Optionally, the method 2900 further includes storing the electronic file in a non-transitory medium in association with an identity of the product.

Optionally, the method 2900 further includes checking, by the product testing device, if an element is visible after the processing unit performs a testing action.

Optionally, the method 2900 further includes checking, by the product testing device, if an element is not visible after the processing unit performs a testing action.

Optionally, the method 2900 further includes checking, by the product testing device, if a specified page has loaded after the processing unit performs a testing action.

Optionally, in the method 2900, the testing of the product comprises testing multiple features of the product based on the product testing instruction in the electronic file.

Optionally, in the method 2900, the testing of the product comprises testing a first feature of the product based on the product testing instruction in the electronic file.

Optionally, the method 2900 further includes testing a second feature of the product based on product testing instruction in another electronic file.

Optionally, in the method 2900, the testing instruction generator comprises a control for allowing a user to select between viewing the product testing instruction in plain language or viewing the product testing instruction in a programming format.

Optionally, the method 2900 further comprises: obtaining a first image that is associated with the testing of the product, and obtaining a second image.

Optionally, in the method 2900, the first image is based on a completion of a first task performed during the testing of the product.

Optionally, in the method 2900, the first image comprises a first content of the product, the first content indicating a first result of a first task for testing the product.

Optionally, the method 2900 further comprises: applying a mask to the first image to create a first masked image; applying the mask to the second image to create a second masked image; and comparing the first masked image with the second masked image.

Optionally, in the method 2900, the mask is configured to block out one or more portions of the first image.

Optionally, the method 2900 further includes determining, by an evaluator, whether the testing fails or not based on the comparison of the first masked image and the second masked image.

Optionally, the method 2900 further includes determining the second image, by an image capturer, by comparing a sequence of image frames with the first image, and selecting one of the image frames that matches the first image as the second image.

Optionally, the method 2900 further includes tracking, by a tracker, an interaction of the product testing device with the product.

Optionally, the method 2900 further includes tracking, by a tracker, a movement of a cursor operated by the product testing device.

Optionally, the method 2900 further includes tracking, by a tracker, a selection of a tab, a selection of a button, a selection of an icon, a selection of a text, or any combination of the foregoing, by the product testing device.

Optionally, the method 2900 further includes tracking, by a tracker, a text input by the product testing device.

Optionally, in the method 2900, the product comprises a web page, a web site, a computer application, a mobile device application, or a processor application.

Optionally, in the method 2900, the testing of the product comprises a machine-based testing of the product.

In some embodiments, the method 2900 may be performed in response to a processing unit processing a set of instructions stored in a processor-readable medium. In particular, the processor-readable medium includes a set of instructions, wherein an execution of the instructions by a processing unit will cause a method to be performed, the method comprising:
  providing, by a testing instruction generator, a user interface for generating an electronic file, the electronic file containing product testing instruction; and
  executing, by a processing unit of a product testing device, the electronic file to perform testing of a product based on the product testing instruction in the electronic file; wherein the testing of the product is performed by simulating human actions based on the product testing instruction in the electronic file.

Specialized Processing System

Figure 31:
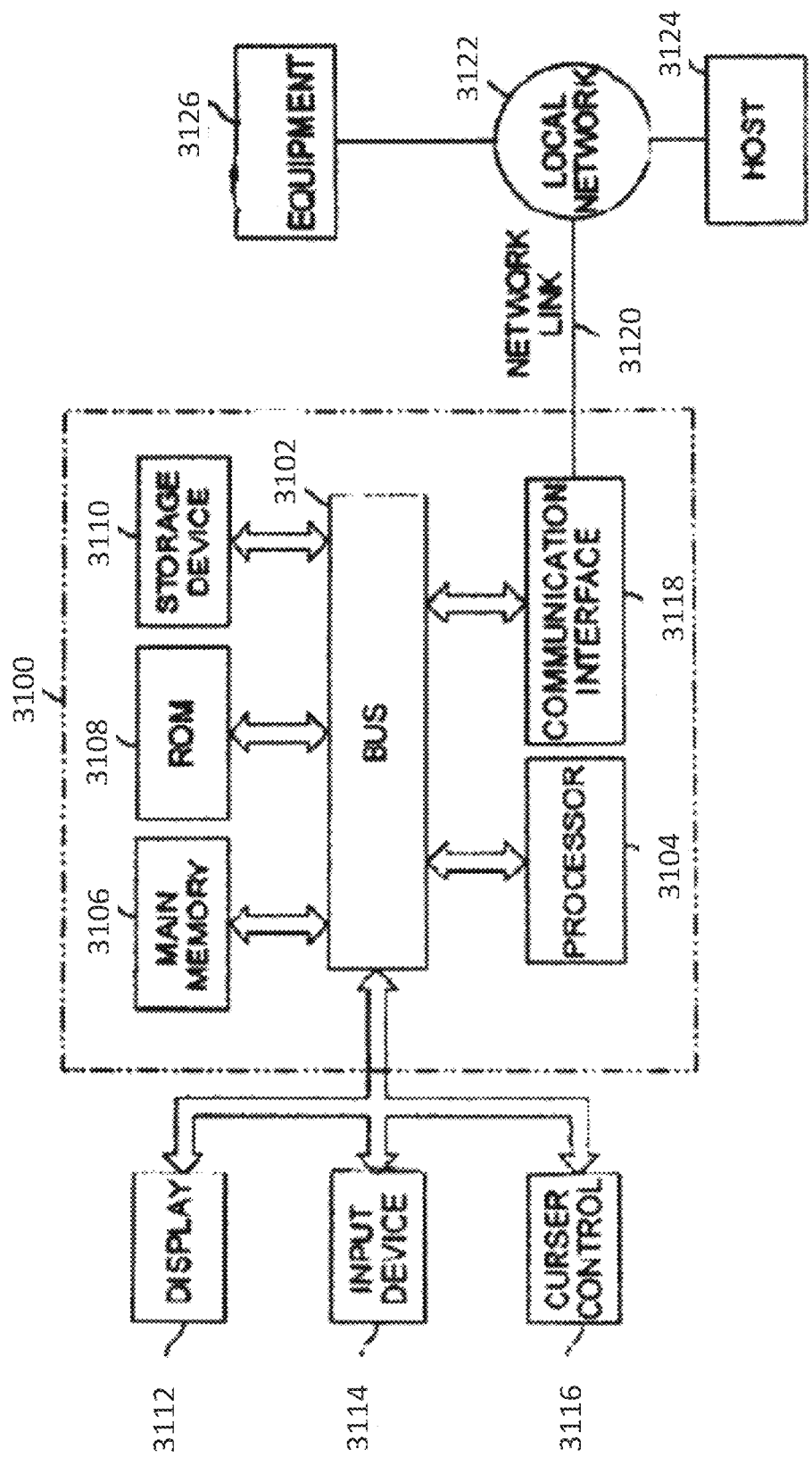
FIG. 31 is a block diagram of a specialized processing system.

FIG. 31 is a block diagram illustrating an embodiment of a specialized processing system 3100 that can be used to implement various embodiments or features described herein. For example, the processing system 3100 may be used to implement the system 10 of FIG. 1A and FIG. 1B, the system 10 of FIG. 11 and FIG. 12, the system 10 of FIG. 24, the system 10 of FIG. 29, or any component thereof. As another example, the processing system 3100 may be an example of a device being used by a product tester. Also, in some embodiments, the processing system 3100 may be used to implement the tracker 1300, the retrieving module 1530, the product testing machine 1540, the image capturer 1550, the dispatch module 1560, a component of any of the foregoing, or any combination of the foregoing. Furthermore, in some embodiments, the processing system 3100 may be considered a processing unit that is a part of the tracker 1300, a part of the retrieving module 1530, a part of the product testing machine 1540, a part of the image capturer 1550, a part of the dispatch module 1560, or any combination of the foregoing. In addition, in some embodiments, the processing system 3100 may be configured to implement the apparatus 1950, the apparatus 2000, the apparatus 2200, or any combination of the foregoing. In other embodiments, the processing system 3100 may be configured to implement the testing instruction generator 2402 and/or the product testing device 1540.

Processing system 3100 includes a bus 3102 or other communication mechanism for communicating information, and a processor 3104 coupled with the bus 3102 for processing information. The processor system 3100 also includes a main memory 3106, such as a random access memory (RAM) or other dynamic storage device, coupled to the bus 3102 for storing information and instructions to be executed by the processor 3104. The main memory 3106 also may be used for storing temporary variables or other intermediate information during execution of instructions to be executed by the processor 3104. The processor system 3100 further includes a read only memory (ROM) 3108 or other static storage device coupled to the bus 3102 for storing static information and instructions for the processor 3104. A data storage device 3110, such as a magnetic disk or optical disk, is provided and coupled to the bus 3102 for storing information and instructions.

The processor system 3100 may be coupled via the bus 3102 to a display 3112, such as a flat panel or a cathode ray tube (CRT), for displaying information to a user. An input device 3114, including alphanumeric and other keys, is coupled to the bus 3102 for communicating information and command selections to processor 3104. Another type of user input device is cursor control 3116, such as a mouse, a trackball, or cursor direction keys for communicating direction information and command selections to processor 3104 and for controlling cursor movement on display 3112. This input device typically has two degrees of freedom in two axes, a first axis (e.g., x) and a second axis (e.g., y), that allows the device to specify positions in a plane.

In some embodiments, the processor system 3100 can be used to perform various functions described herein. According to some embodiments, such use is provided by processor system 3100 in response to processor 3104 executing one or more sequences of one or more instructions contained in the main memory 3106. Those skilled in the art will know how to prepare such instructions based on the functions and methods described herein. Such instructions may be read into the main memory 3106 from another processor-readable medium, such as storage device 3110. Execution of the sequences of instructions contained in the main memory 3106 causes the processor 3104 to perform the process steps described herein. One or more processors in a multi-processing arrangement may also be employed to execute the sequences of instructions contained in the main memory 3106. In alternative embodiments, hard-wired circuitry may be used in place of or in combination with software instructions to implement the various embodiments described herein. Thus, embodiments are not limited to any specific combination of hardware circuitry and software.

The term "processor-readable medium" as used herein refers to any medium that participates in providing instructions to the processor 3104 for execution. Such a medium may take many forms, including but not limited to, non-volatile media, volatile media, and transmission media. Non-volatile media includes, for example, optical or magnetic disks, such as the storage device 3110. A non-volatile medium may be considered an example of non-transitory medium. Volatile media includes dynamic memory, such as the main memory 3106. A volatile medium may be considered an example of non-transitory medium. Transmission media includes coaxial cables, copper wire and fiber optics, including the wires that comprise the bus 3102. Transmission media can also take the form of acoustic or light waves, such as those generated during radio wave and infrared data communications.

Common forms of processor-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a processor can read.

Various forms of processor-readable media may be involved in carrying one or more sequences of one or more instructions to the processor 3104 for execution. For example, the instructions may initially be carried on a magnetic disk of a remote computer. The remote computer can load the instructions into its dynamic memory and send the instructions over a telephone line using a modem. A modem local to the processing system 3100 can receive the data on the telephone line and use an infrared transmitter to convert the data to an infrared signal. An infrared detector coupled to the bus 3102 can receive the data carried in the infrared signal and place the data on the bus 3102. The bus 3102 carries the data to the main memory 3106, from which the processor 3104 retrieves and executes the instructions. The instructions received by the main memory 3106 may optionally be stored on the storage device 3110 either before or after execution by the processor 3104.

The processing system 3100 also includes a communication interface 3118 coupled to the bus 3102. The communication interface 3118 provides a two-way data communication coupling to a network link 3120 that is connected to a local network 3122. For example, the communication interface 3118 may be an integrated services digital network (ISDN) card or a modem to provide a data communication connection to a corresponding type of telephone line. As another example, the communication interface 3118 may be a local area network (LAN) card to provide a data communication connection to a compatible LAN. Wireless links may also be implemented. In any such implementation, the communication interface 3118 sends and receives electrical, electromagnetic or optical signals that carry data streams representing various types of information.

The network link 3120 typically provides data communication through one or more networks to other devices. For example, the network link 3120 may provide a connection through local network 3122 to a host computer 3124 or to equipment 3126 such as a radiation beam source or a switch operatively coupled to a radiation beam source. The data streams transported over the network link 3120 can comprise electrical, electromagnetic or optical signals. The signals through the various networks and the signals on the network link 3120 and through the communication interface 3118, which carry data to and from the processing system 3100, are exemplary forms of carrier waves transporting the information. The processing system 3100 can send messages and receive data, including program code, through the network(s), the network link 3120, and the communication interface 3118.

It should be noted that as used in this specification, the term "image" is not limited to an image that is displayed, and may also include image that is not displayed, such as image data stored in a non-transitory medium. Similarly, as used in this specification, the term "video" is not limited to a video that is displayed, and may also include video that is not displayed, such as video data stored in a non-transitory medium.

Also, as used in this specification, the terms "first", "second", "third", etc., do not necessarily refer to order of items. Rather, these terms may be used to distinguish different items from each other. For example, "first product tester" does not necessarily mean that the product tester is the first in order. Also, "second product tester" does not necessarily mean that the product tester is the second in order. Rather, these terms are used to identify two different product testers.

Furthermore, as used in this specification, the term "machine" (as in the term "product testing machine") may refer to a device, a component, a system, an application, software, a virtual machine, or any form of a processing unit or module, that is configured to perform one or more desired functions. In some embodiments, a machine may include at least some hardware. Similarly, as used in this specification, the term "device" may refer to a physical device, a component, a system, an application, software, a virtual machine, or any form of a processing unit or module, that is configured to perform one or more desired functions. In some embodiments, a device may include at least some hardware.

In addition, as used in this specification, the term "processing unit" may refer to hardware, software, or combination thereof. Also, the term "processing unit" may refer to one or more processors, one or more pieces of software or applications, one or more computing systems or component(s) thereof, one or more virtual machines or component(s) thereof, etc. In one implementation, a processing unit may include at least some hardware.

Although particular embodiments have been shown and described, it will be understood that they are not intended to limit the present inventions, and it will be obvious to those skilled in the art that various changes and modifications may be made without departing from the spirit and scope of the present inventions. The specification and drawings are, accordingly, to be regarded in an illustrative rather than restrictive sense. The present inventions are intended to cover alternatives, modifications, and equivalents, which may be included within the spirit and scope of the present inventions as defined by the claims.

What is claimed:

1. An electronic product testing system, comprising:
a testing instruction generator configured to provide a user interface for generating an electronic file, the electronic file containing product testing instruction; and
a product testing device having a processing unit configured to execute the electronic file to perform testing of a product based on the product testing instruction in the electronic file;
wherein the processing unit is configured to perform testing of the product by simulating human actions based on the product testing instruction in the electronic file;
wherein the user interface provided by the testing instruction generator is configured to allow a user to input an image for use by the processing unit as a reference image when the processing unit performs the testing of the product, wherein the image for use by the processing unit as the reference image comprises an image-capture of a part of a screen that is less than an entirety of the screen;
wherein the user interface provided by the testing instruction generator is configured to allow the user to capture the part of the screen to obtain the image by creating a boundary circumscribing the part of the screen, and wherein the the electronic product testing system is configured to store the captured part of the screen in association with the product testing instruction; and
wherein the user interface provided by the testing instruction generator is configured to provide a list of testing actions for selection by the user before the testing of the product is performed, obtain a selected one of the testing actions, and allow the user to capture the part of the screen to obtain the image after the selected one of the testing actions is obtained and before the testing of the product is performed.

2. The electronic product testing system of claim 1, wherein the processing unit is configured to move a cursor without input from a cursor control.

3. The electronic product testing system of claim 1, wherein the processing unit is configured to make a selection of an object without input from a cursor control.

4. The electronic product testing system of claim 1, wherein the product testing device is configured to locate a text field of the product based on at least a part of the product testing instruction, and automatically type a text in the text field without input from a keyboard.

5. The electronic product testing system of claim 4, wherein the product testing device is configured to automatically click a button after the text is automatically typed in the text field.

6. The electronic product testing system of claim 1, wherein the processing unit comprises an interpreter configured to interpret the product testing instruction in the electronic file.

7. The electronic product testing system of claim 1, further comprising a script generator configured to generate a script based on the product testing instruction in the electronic file.

8. The electronic product testing system of claim 7, wherein the processing unit is configured to run the script for testing the product.

9. The electronic product testing system of claim 1, wherein the user interface comprises a graphical user interface providing a first set of items and a second set of items for user-selection, wherein the first set of items comprises a plurality of action identifiers, and the second set of items comprises a plurality of objects.

10. The electronic product testing system of claim 9, wherein one of the action identifiers identifies an action to be performed by the product testing device, and one of the object identifiers identifies an object on which the action is to be performed by the product testing device.

11. The electronic product testing system of claim 9, wherein one of the action identifiers identifies a click action, a fill action, a type action, a press key action, a hover action, a dropdown select action, a checkbox check action, a checkbox uncheck action, a refresh action, a navigate action, a new tab action, a close tab action, a scroll cation, a drag and drop action, or a click and hold action.

12. The electronic product testing system of claim 9, wherein one of the object identifiers identifies a button, a field, a dropdown menu, a dropdown option, a link, an icon, a checkbox, a header, a window, a text, a modal, or an user interface element.

13. The electronic product testing system of claim 1, wherein the product testing instruction in the electronic file has a data structure that associates an action identifier with a corresponding object identifier.

14. The electronic product testing system of claim 13, wherein the action identifier identifies an action to be performed by the product testing device, and the object identifier identifies an object on which the action is to be performed by the product testing device.

15. The electronic product testing system of claim 13, wherein the action identifier identifies a click action, a fill action, a type action, a press key action, a hover action, a dropdown select action, a checkbox check action, a checkbox uncheck action, a refresh action, a navigate action, a new tab action, a close tab action, a scroll cation, a drag and drop action, or a click and hold action.

16. The electronic product testing system of claim 13, wherein the object identifier identifies a button, a field, a dropdown menu, a dropdown option, a link, an icon, a checkbox, a header, a window, a text, a modal, or an user interface element.

17. The electronic product testing system of claim 1, further comprising a non-transitory medium storing the electronic file in association with an identity of the product.

18. The electronic product testing system of claim 1, wherein the product testing device is configured to check if an element is visible after the processing unit performs a testing action.

19. The electronic product testing system of claim 1, wherein the product testing device is configured to check if an element is not visible after the processing unit performs a testing action.

20. The electronic product testing system of claim 1, wherein the product testing device is configured to check if a specified page has loaded after the processing unit performs a testing action.

21. The electronic product testing system of claim 1, wherein the processing unit is configured to test multiple features of the product based on the product testing instruction in the electronic file.

22. The electronic product testing system of claim 1, wherein the processing unit is configured to test a first feature of the product based on the product testing instruction in the electronic file.

23. The electronic product testing system of claim 22, wherein the processing unit is also configured to test a second feature of the product based on product testing instruction in another electronic file.

24. The electronic product testing system of claim 1, wherein the testing instruction generator comprises a control for allowing the user to select between viewing the product testing instruction in plain language or viewing the product testing instruction in a programming format.

25. The system of claim 1, wherein the processing unit is configured to:
obtain a first image that is associated with the testing of the product, wherein the first image is based on a completion of a first task performed during a product testing; and
determine whether at least a part of the first image matches the reference image.

26. The electronic product testing system of claim 25, wherein the product testing device is configured to determine the product as failing at least a part of the product testing if no part of the first image matches the reference image.

27. The electronic product testing system of claim 25, wherein the first image comprises a first content of the product, the first content indicating a first result of a first task for testing the product.

28. The electronic product testing system of claim 1, further comprising a tracker configured to track an interaction of the product testing device with the product.

29. The electronic product testing system of claim 28, wherein the tracker is configured to track a movement of a cursor operated by the testing device.

30. The electronic product testing system of claim 28, wherein the tracker is configured to track a selection of a tab, a selection of a button, a selection of an icon, a selection of a text, or any combination of the foregoing, by the testing device.

31. The electronic product testing system of claim 28, wherein the tracker is configured to track a text input by the testing device.

32. The electronic product testing system of claim 1, wherein the product comprises a web page, a web site, a computer application, a mobile device application, or a processor application.

33. The electronic product testing system of claim 1, wherein the processing unit is configured to perform machine-based testing of the product.

34. The electronic product testing system of claim 1, wherein the user interface provided by the testing instruction generator is configured to obtain the image-capture of the part of the screen as the image associated with the product.

35. The electronic product testing system of claim 1, wherein the user interface provided by the testing instruction generator is configured to obtain the image based on a user-defined area in a screen.

36. The electronic product testing system of claim 1, wherein the image is stored in association with a task to be performed by the product testing device.

37. An electronic system, comprising:
a testing instruction generator configured to provide a user interface for generating an electronic file, the electronic file containing product testing instruction;
wherein the electronic file is processable by a product testing device to perform testing of a product based on the product testing instruction in the electronic file;
wherein the user interface provided by the testing instruction generator is configured to allow a user to input an image for use by the product testing device as a reference image when the product testing device performs the testing of the product, wherein the image for use by the product testing device as the reference image comprises an image-capture of a part of a screen that is less than an entirety of the screen;
wherein the user interface provided by the testing instruction generator is configured to allow the user to capture the part of the screen to obtain the image by creating a boundary circumscribing the part of the screen, and wherein the electronic system is configured to store the captured part of the screen in association with the product testing instruction; and
wherein the user interface provided by the testing instruction generator is configured to provide a list of testing actions for selection by the user, obtain a selected one of the testing actions, and allow the user to capture the part of the screen to obtain the image after the selected one of the testing actions is obtained and before the testing of the product is performed.

38. The electronic system of claim 37, wherein the user interface comprises a graphical user interface providing a first set of items and a second set of items for user-selection, wherein the first set of items comprises a plurality of action identifiers, and the second set of items comprises a plurality of objects.

39. The electronic system of claim 38, wherein one of the action identifiers identifies an action to be performed by the product testing device, and one of the object identifiers identifies an object on which the action is to be performed by the product testing device.

40. The electronic system of claim 38, wherein one of the action identifiers identifies a click action, a fill action, a type action, a press key action, a hover action, a dropdown select action, a checkbox check action, a checkbox uncheck action, a refresh action, a navigate action, a new tab action, a close tab action, a scroll cation, a drag and drop action, or a click and hold action.

41. The electronic system of claim 38, wherein one of the object identifiers identifies a button, a field, a dropdown menu, a dropdown option, a link, an icon, a checkbox, a header, a window, a text, a modal, or an user interface element.

42. The electronic system of claim 37, wherein the product testing instruction in the electronic file has a data structure that associates an action identifier with a corresponding object identifier.

43. The electronic system of claim 42, wherein the action identifier identifies an action to be performed by the product testing device, and the object identifier identifies an object on which the action is to be performed by the product testing device.

44. The electronic system of claim 42, wherein the action identifier identifies a click action, a fill action, a type action, a press key action, a hover action, a dropdown select action, a checkbox check action, a checkbox uncheck action, a refresh action, a navigate action, a new tab action, a close tab action, a scroll cation, a drag and drop action, or a click and hold action.

45. The electronic system of claim 42, wherein the object identifier identifies a button, a field, a dropdown menu, a dropdown option, a link, an icon, a checkbox, a header, a window, a text, a modal, or an user interface element.

* * * * *